(12) United States Patent
Prasad et al.

(10) Patent No.: US 11,502,104 B2
(45) Date of Patent: **\*Nov. 15, 2022**

(54) ANTIFERROELECTRIC MEMORY DEVICES AND METHODS OF MAKING THE SAME

(71) Applicant: SANDISK TECHNOLOGIES LLC, Addison, TX (US)

(72) Inventors: Bhagwati Prasad, San Jose, CA (US); Rahul Sharangpani, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/081,122

(22) Filed: Oct. 27, 2020

(65) Prior Publication Data
US 2021/0074727 A1    Mar. 11, 2021

Related U.S. Application Data

(63) Continuation-in-part of application No. 16/743,436, filed on Jan. 15, 2020, now Pat. No. 11,024,648, which is a continuation-in-part of application No. 16/541,289, filed on Aug. 15, 2019, now Pat. No. 10,937,809.

(51) Int. Cl.
*H01L 27/11597* (2017.01)
*H01L 27/1159* (2017.01)
*H01L 27/11587* (2017.01)

(52) U.S. Cl.
CPC .... *H01L 27/11597* (2013.01); *H01L 27/1159* (2013.01); *H01L 27/11587* (2013.01)

(58) Field of Classification Search
CPC ......... H01L 27/11597; H01L 27/11587; H01L 27/1159
See application file for complete search history.

(56) References Cited

U.S. PATENT DOCUMENTS

| 5,915,167 | A | 6/1999 | Leedy |
| 9,362,487 | B2 | 6/2016 | Inumiya et al. |
| 9,792,991 | B1 * | 10/2017 | Toriyama ............... G11C 16/10 |
| 9,941,299 | B1 | 4/2018 | Chen et al. |
| 10,115,897 | B1 | 10/2018 | Sato |
| 10,121,965 | B1 | 11/2018 | Uno et al. |

(Continued)

FOREIGN PATENT DOCUMENTS

| JP | 07-106658 A | 4/1994 |
| KR | 10-2018-0059271 A | 6/2018 |

OTHER PUBLICATIONS

Boscke, T.S. et al., "Ferroelectricity in Hafnium Oxide Thin Films," Appl. Phys. Lett., vol. 99, pp. 102903-1 to 102903-3; https://doi.org/10.1083/1.3634052, (2011).

(Continued)

*Primary Examiner* — Marc Anthony Armand
(74) *Attorney, Agent, or Firm* — The Marbury Law Group PLLC

(57) ABSTRACT

An antiferroelectric memory device includes at least one antiferroelectric memory cell. Each of the at least one antiferroelectric memory cell includes a first electrode, a second electrode and a stack containing an antiferroelectric layer and a doped semiconductor layer or a ferroelectric layer located between the first and the second electrodes.

6 Claims, 75 Drawing Sheets

(56) References Cited

U.S. PATENT DOCUMENTS

| | | |
|---|---|---|
| 10,199,434 B1 | 2/2019 | Lee et al. |
| 10,224,372 B2 | 3/2019 | Mori |
| 10,249,683 B1 | 4/2019 | Lille et al. |
| 10,256,272 B2 | 4/2019 | Yoshida et al. |
| 10,283,710 B2 | 5/2019 | Kikuchi et al. |
| 10,354,728 B2 | 7/2019 | Rajamohanan et al. |
| 10,381,409 B1 | 8/2019 | Zhou et al. |
| 10,381,411 B2 | 8/2019 | Lille |
| 10,381,559 B1 | 8/2019 | Zhou et al. |
| 10,700,093 B1 | 6/2020 | Kalitsov et al. |
| 2001/0005249 A1 | 6/2001 | Stebler et al. |
| 2001/0011986 A1 | 8/2001 | Kondoh |
| 2002/0027544 A1 | 3/2002 | Kondoh |
| 2002/0075445 A1 | 6/2002 | Dabrowski et al. |
| 2002/0158831 A1 | 10/2002 | Kondoh |
| 2002/0168132 A1 | 11/2002 | Takeuchi et al. |
| 2003/0034944 A1 | 2/2003 | Kondoh et al. |
| 2003/0041457 A1 | 3/2003 | Takeuchi et al. |
| 2003/0108264 A1 | 6/2003 | Nishizawa et al. |
| 2003/0122768 A1 | 7/2003 | Oton et al. |
| 2004/0262573 A1 | 12/2004 | Wu et al. |
| 2005/0046782 A1 | 3/2005 | Kobayashi et al. |
| 2005/0104478 A1 | 5/2005 | Xu et al. |
| 2005/0156142 A1 | 7/2005 | Kishikawa et al. |
| 2005/0168421 A1 | 8/2005 | Hirose et al. |
| 2007/0114490 A1 | 5/2007 | Furue et al. |
| 2007/0117913 A1 | 5/2007 | Tan et al. |
| 2007/0236647 A1 | 10/2007 | Konuma et al. |
| 2008/0049175 A1 | 2/2008 | Komitov et al. |
| 2008/0259227 A1 | 10/2008 | Hirose et al. |
| 2008/0293864 A1 | 11/2008 | Tan et al. |
| 2008/0302658 A1 | 12/2008 | Sasaki et al. |
| 2009/0207555 A1 | 8/2009 | Hackenberger et al. |
| 2009/0269873 A1 | 10/2009 | Konuma et al. |
| 2009/0284701 A1 | 11/2009 | Konuma et al. |
| 2009/0309259 A1 | 12/2009 | Tan et al. |
| 2009/0312474 A1 | 12/2009 | Tan et al. |
| 2010/0067661 A1 | 3/2010 | Cao et al. |
| 2010/0079926 A1 | 4/2010 | Tan et al. |
| 2010/0085527 A1 | 4/2010 | Konuma et al. |
| 2010/0171921 A1 | 7/2010 | Khokhlov et al. |
| 2010/0258765 A1 | 10/2010 | Dabrowski et al. |
| 2010/0279844 A1 | 11/2010 | Hackenberger et al. |
| 2011/0233507 A1* | 9/2011 | Sonehara ............... H01L 45/12 257/E21.003 |
| 2011/0285928 A1 | 11/2011 | Chigrinov et al. |
| 2012/0286342 A1 | 11/2012 | Kamon |
| 2013/0107150 A1 | 5/2013 | Lagerwall et al. |
| 2013/0107189 A1 | 5/2013 | Lagerwall et al. |
| 2013/0223467 A1 | 8/2013 | Musevic et al. |
| 2015/0014813 A1 | 1/2015 | Mueller et al. |
| 2016/0102235 A1 | 4/2016 | Ihlefeld et al. |
| 2016/0340258 A1 | 11/2016 | Engel |
| 2016/0359109 A1 | 12/2016 | Kamimuta et al. |
| 2016/0365133 A1 | 12/2016 | Ino et al. |
| 2017/0069841 A1 | 3/2017 | Ino et al. |
| 2018/0130823 A1* | 5/2018 | Kim ..................... H01L 29/6684 |
| 2018/0277647 A1 | 9/2018 | Yoo |
| 2018/0342557 A1 | 11/2018 | Mori |
| 2018/0351071 A1 | 12/2018 | James et al. |
| 2018/0366476 A1 | 12/2018 | Liu |
| 2018/0374899 A1 | 12/2018 | Yoshida et al. |
| 2019/0074441 A1 | 3/2019 | Kikuchi et al. |
| 2019/0088664 A1 | 3/2019 | Kabuyanagi et al. |
| 2019/0172649 A1 | 6/2019 | Fairchild et al. |
| 2019/0189688 A1 | 6/2019 | Lille |
| 2019/0287599 A1 | 9/2019 | Higashi et al. |
| 2019/0288192 A1 | 9/2019 | Takahashi et al. |
| 2019/0326313 A1 | 10/2019 | Cui et al. |
| 2019/0354843 A1 | 11/2019 | Park et al. |
| 2020/0006516 A1 | 1/2020 | Manipatruni et al. |
| 2020/0119047 A1 | 4/2020 | Yoo et al. |
| 2020/0251495 A1 | 8/2020 | Ahn et al. |
| 2020/0395460 A1* | 12/2020 | Haratipour ............ H01L 29/151 |

OTHER PUBLICATIONS

Kim, S.J. et al., "Large ferroelectric polarization of TiN/Hf0.5Zr0.5O2/TiN capacitors due to stress-induced crystallization at low thermal budget," Appl. Phys. Lett., vol. 111, pp. 242901-1 to 242901-5; https://doi.org/10.1083/1 4995619, (2017).

Schroeder, U., "Hafnium Oxide Based Ferroelectric Materials," http://www.namlab.de/research/dielectric-materials-1/hafnium-oxide-based-ferroelectric-materials, (Viewed on Aug. 8, 2019).

Khan, A. et al., "Negative capacitance in a ferroelectric capacitor," Nature Materials, Feb. 2015; vol. 14, No. 2, pp. 182-186, (2015).

Karda, K. "An anti-ferroelectric gated Landau transistor to achieve sub-60 mV/dec switching at low voltage and high speed," Appl. Phys. Lett. 106, 163501 (2015); https://doi.org/10.1063/1.4918649.

Alam, M. A., "Tutorial Introduction to Negative-Capacitor Landau Transistors: Perspective on the Road Ahead," Dec. 2015, Available online at https://nanohub.org/resources/23157.

Karda, K. et al., "An anti-ferroelectric gated Landau transistor to achieve sub-60 mV/dec switching at low voltage and high speed," Applied Physics Letters, vol. 106, 163501 (2015); https://doi.org/10.1063/1.4918649.

Notification of Transmittal of the International Search Report and Written Opinion of the International Search Authority for International Patent Application No. PCT/US2020/023423, dated Jul. 23, 2020, 12 pages.

U.S. Appl. No. 16/138,001, filed Sep. 21, 2018 SanDisk Technologies LLC.

U.S. Appl. No. 16/227,889, filed Dec. 20, 2018 SanDisk Technologies LLC.

U.S. Appl. No. 16/249,300, filed Jan. 16, 2019 SanDisk Technologies LLC.

U.S. Appl. No. 16/291,673, filed Mar. 4, 2019 SanDisk Technologies LLC.

U.S. Appl. No. 16/412,764, filed May 15, 2019 SanDisk Technologies LLC.

U.S. Appl. No. 16/454,458, filed Jun. 27, 2019 SanDisk Technologies LLC.

U.S. Appl. No. 16/454,475, filed Jun. 27, 2019 SanDisk Technologies LLC.

U.S. Appl. No. 16/456,736, filed Jun. 28, 2019 SanDisk Technologies LLC.

U.S. Appl. No. 16/457,687, filed Jun. 28, 2019 SanDisk Technologies LLC.

U.S. Appl. No. 16/457,721, filed Jun. 28, 2019 SanDisk Technologies LLC.

U.S. Appl. No. 16/530,256, filed Aug. 2, 2019 SanDisk Technologies LLC.

Non-Final Office Action for U.S. Appl. No. 16/743,436, dated Oct. 28, 2020, 18 pages.

Chanthbouala, A. et al., "Solid-state memories based on ferroelectric tunnel junctions," Nature Nanotechnology, vol. 7, pp. 101-104, Feb. 2012, www.nature.com/naturenanotechnology, (2012).

Benjamin, S. L. et al., "Controlling the nanostructure of bismuth telluride by selective chemical vapour deposition from a single source precursor," J. Mater. Chem. A, 2014, vol. 2, pp. 4865-4869, (2014).

Goh, Y. et al., "Enhanced tunneling electroresistance effects in HfZrO-based ferroelectric tunnel junctions by high-pressure nitrogen annealing," Appl. Phys. Lett., vol. 113, pp. 052905-1-052905-5 (2018); doi: 10.1063/1.5040031, (2018).

Garcia, V. et al., "Ferroelectric tunnel junctions for information storage and processing," Nature Communications, Nature Communications | 5:4289 | DOI: 10.1038/ncomms5289, www.nature.com/naturecommunications, (2014).

Garcia, V. et al., "Giant tunnel electroresistance for non-destructive readout of ferroelectric states," Nature, vol. 460, Jul. 2, 2009, pp. 81-84, doi:10.1038/nature08128, (2009).

Xi, Z. et al., "Giant tunnelling electroresistance in metal/ferroelectric/semiconductor tunnel junctions by engineering the Schottky barrier," Nature Communications, vol. 8:15217, pp. 1-9, DOI: 10.1038/ncomms15217, (2016).

(56) References Cited

OTHER PUBLICATIONS

De Groot, C. H. et al., "Highly Selective Chemical Vapor Deposition of Tin Diselenide Thin Films onto Patterned Substrates via Single Source Diselenoether Precursors," Chem. Mater. 2012, vol. 24, pp. 4442-4449, (2012).

Wen, Z. et al., "Ferroelectric-field-effect-enhanced electroresistance in metal / ferroelectric / semiconductor tunnel junctions," Nature Materials, vol. 12, pp. 617-621 (2013).

M. Pesic, et al., "Built-in Bias Generation in Anti-Ferroelectric Stacks: Methods and Device Applications", Journal of the Electron Device Society, 6 (2018) 1019, 7 pages.

A. Chanthbouala et al. "Solid-State based on ferroelectric tunnel junctions", Nature nanotechnology, Letters, Published Online: Dec. 4, 2011, DOI: 10,10038/NNANO.2011.213, vol. 7, 4 pages.

M. Pesic et al., "Nonvolatile Random Access Memory and Energy Storage Based on Antiferroelectric Like Hysteresis in ZrO2" Advanced Functional Materials, www.afm-journal.de, Adv. Funct. Mater. 2016, 26, pp. 7486-7494.

U.S. Appl. No. 16/374,330, filed Apr. 3, 2019, SanDisk Technologies LLC.

U.S. Appl. No. 16/440,250, filed Jun. 13, 2019, SanDisk Technologies LLC.

U.S. Appl. No. 16/440,378, filed Jun. 13, 2019, SanDisk Technologies LLC.

U.S. Appl. No. 16/541,289, filed Aug. 15, 2019, SanDisk Technologies LLC.

U.S. Appl. No. 16/568,668, filed Sep. 12, 2019, SanDisk Technologies LLC.

U.S. Appl. No. 16/577,176, filed Sep. 20, 2019, SanDisk Technologies LLC.

U.S. Appl. No. 16/694,340, filed Nov. 25, 2019, SanDisk Technologies LLC.

U.S. Appl. No. 16/743,436, filed Jan. 15, 2020, SanDisk Technologies LLC.

U.S. Appl. No. 16/778,245, filed Jan. 31, 2020, SanDisk Technologies LLC.

U.S. Appl. No. 16/798,643, filed Feb. 24, 2020, SanDisk Technologies LLC.

U.S. Appl. No. 16/737,088, filed Jan. 8, 2020, SanDisk Technologies LLC.

U.S. Appl. No. 17/081,147, filed Oct. 27, 2020, SanDisk Technologies LLC.

USPTO Office Communication, Notice of Allowance and Fee(s) Due for U.S. Appl. No. 17/081,147, dated Jan. 27, 2022, 13 pages.

\* cited by examiner

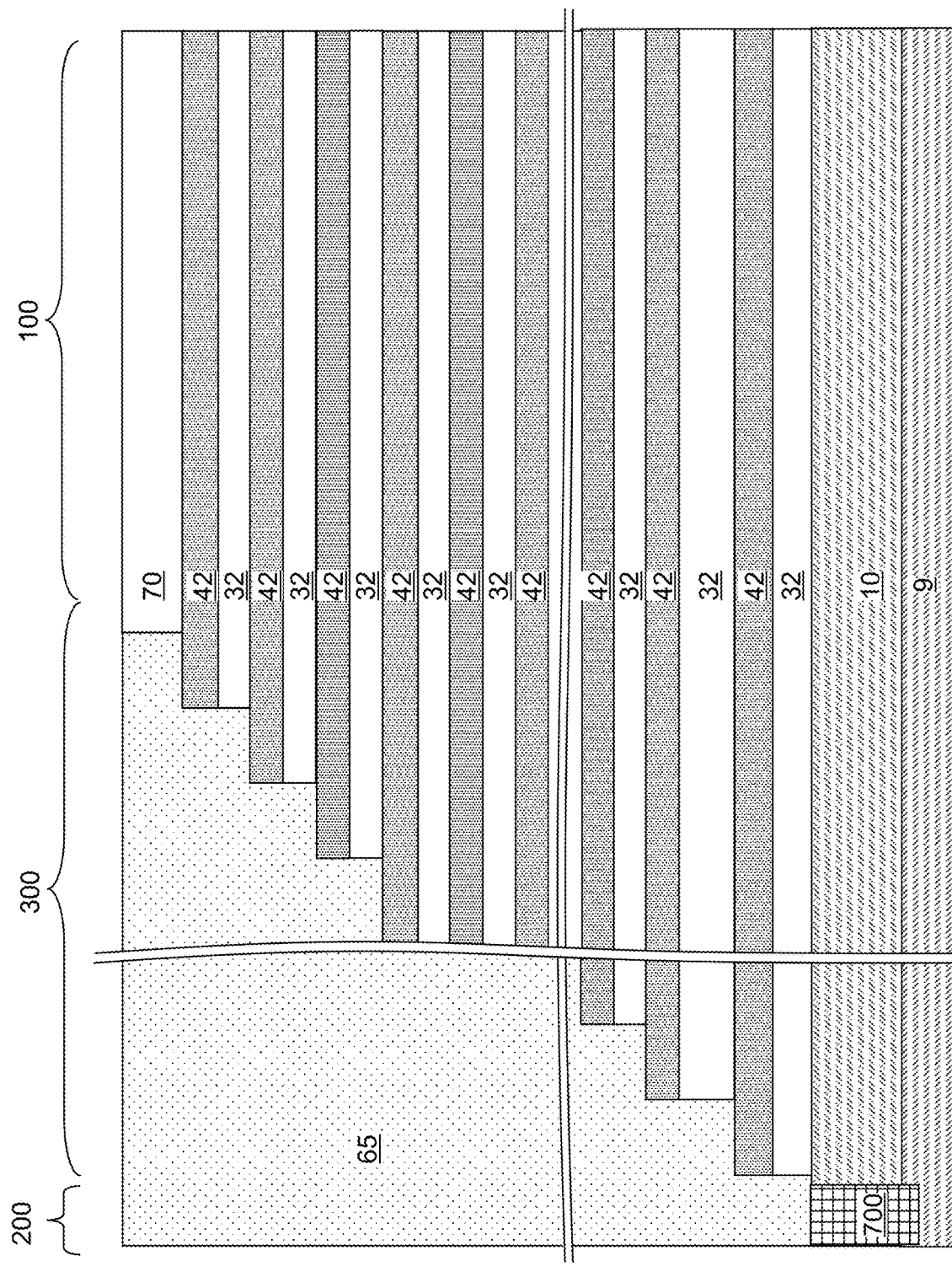

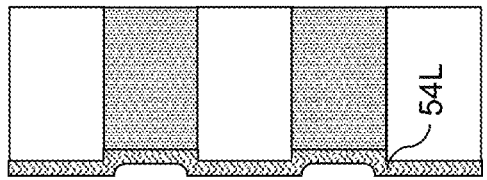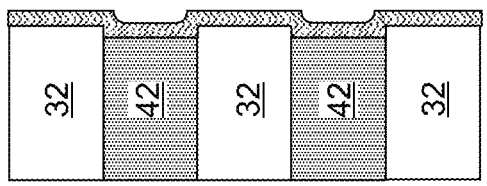
FIG. 5C
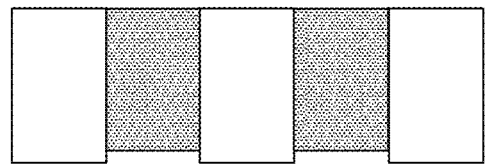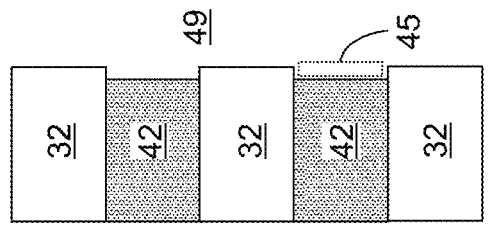
FIG. 5B
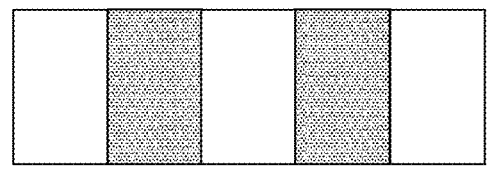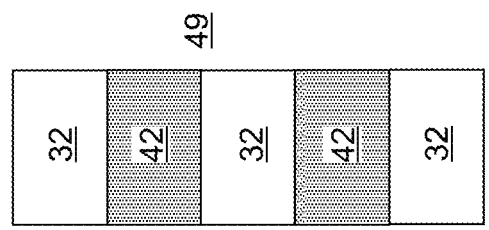
FIG. 5A

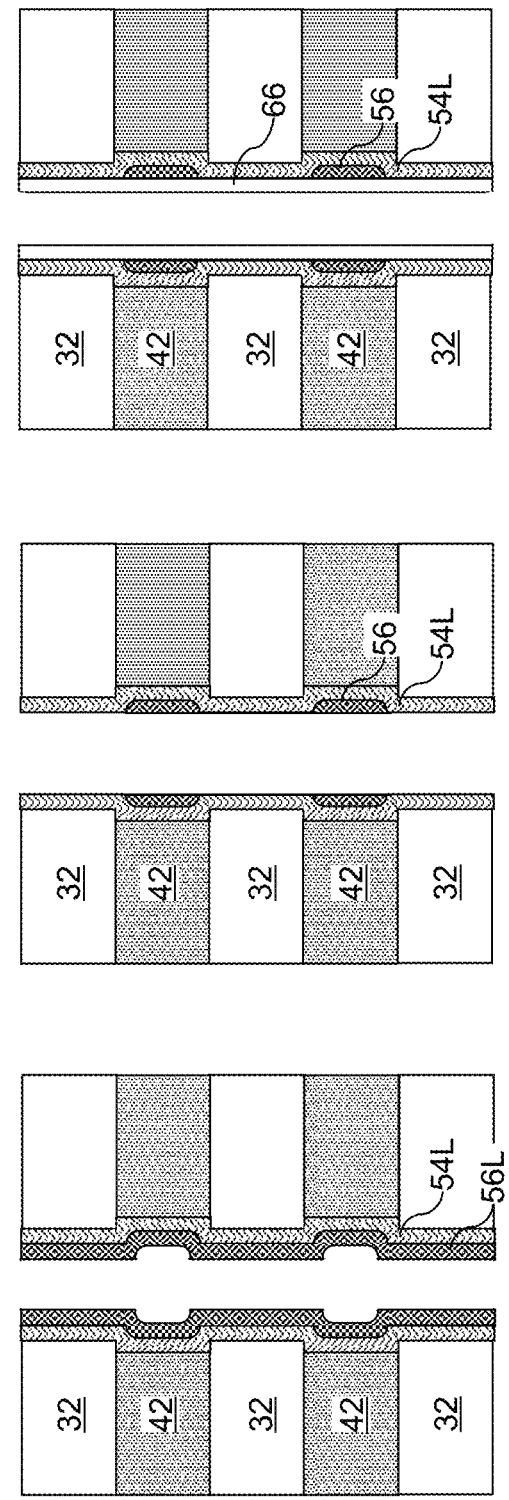

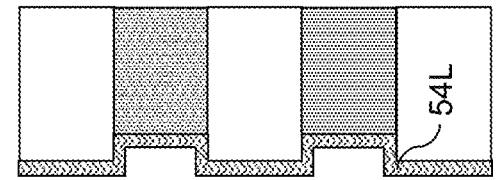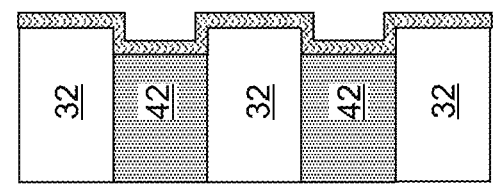
FIG. 14C
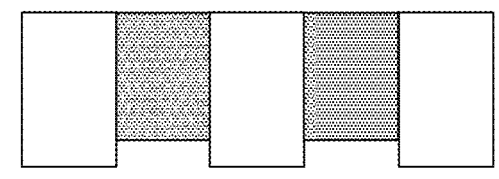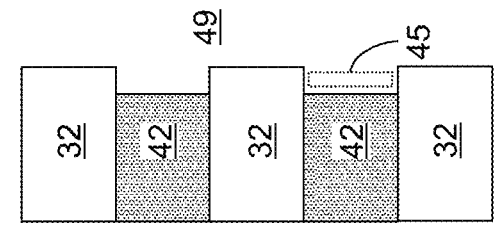
FIG. 14B
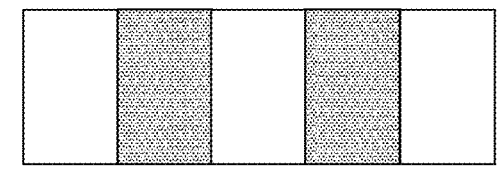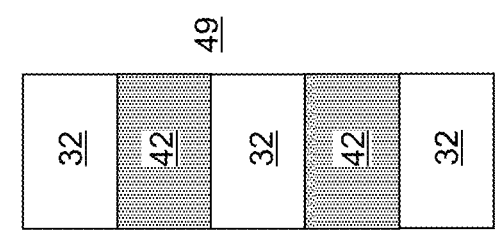
FIG. 14A

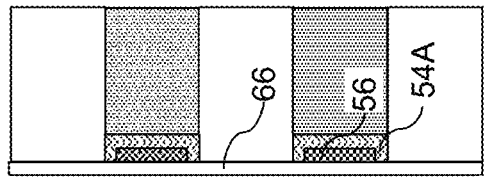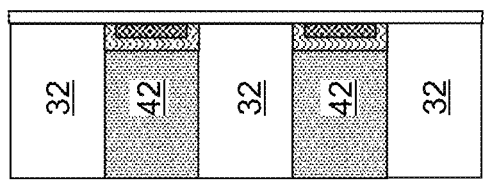
FIG. 14F
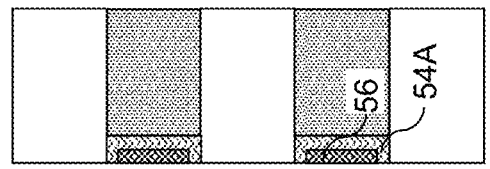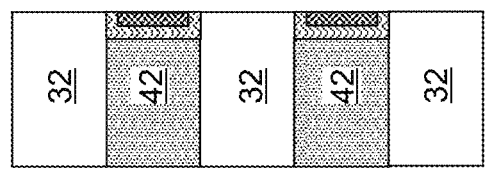
FIG. 14E
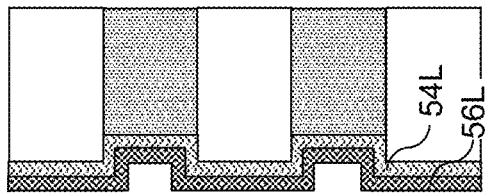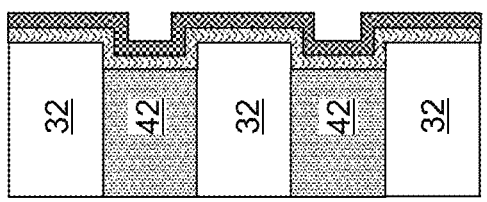
FIG. 14D

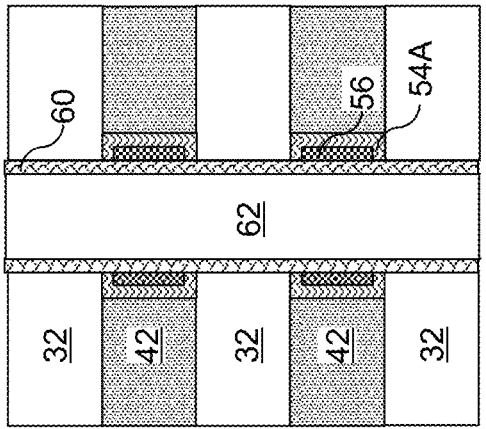
FIG. 14I
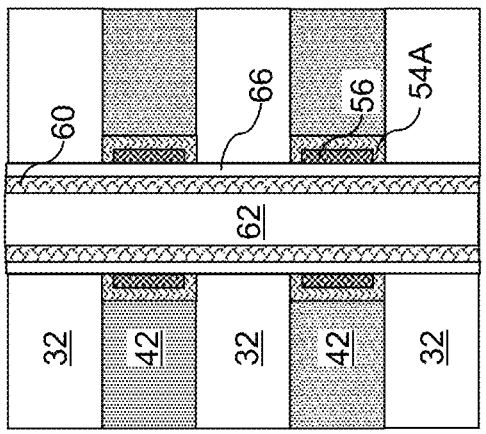
FIG. 14H
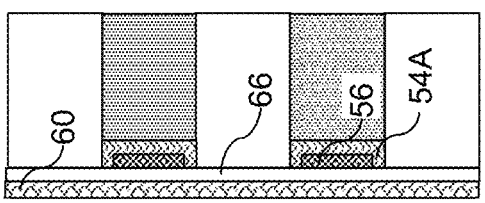
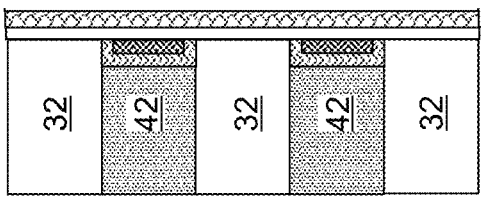
FIG. 14G

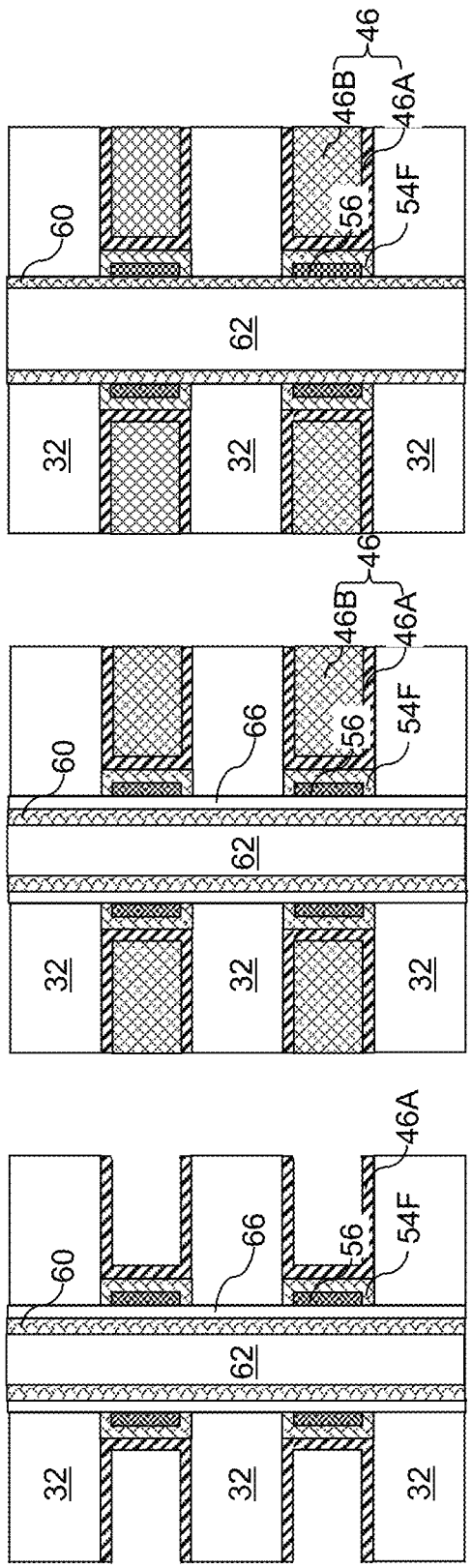

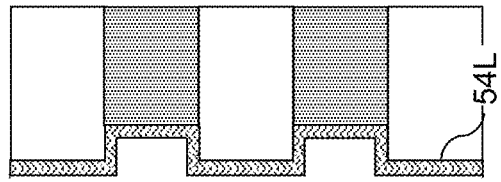
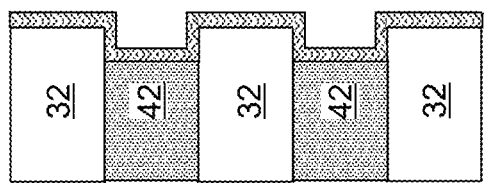
FIG. 16C
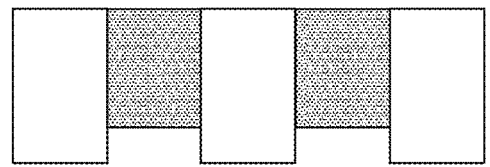
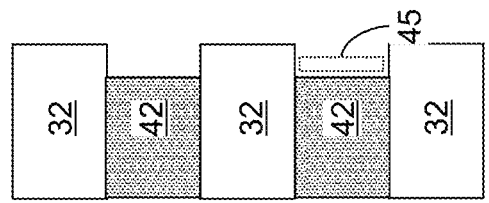
FIG. 16B
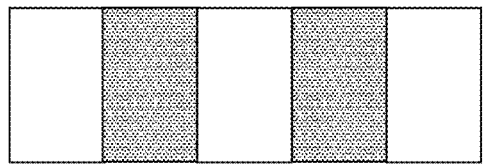
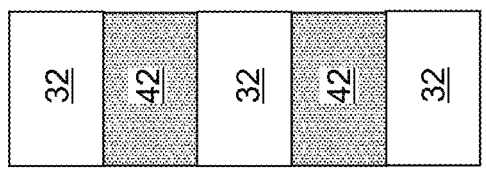
FIG. 16A

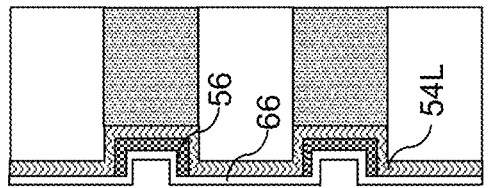
FIG. 16F
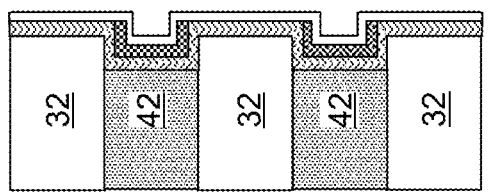
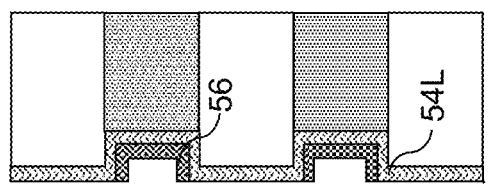
FIG. 16E
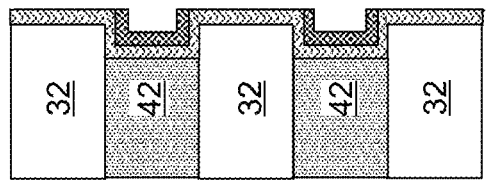
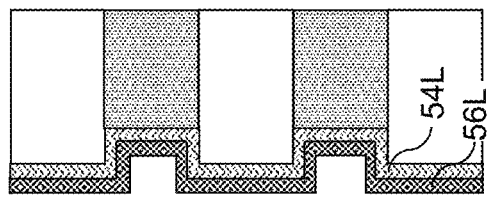
FIG. 16D
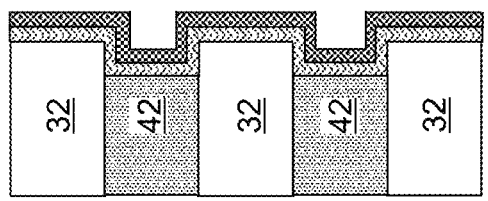

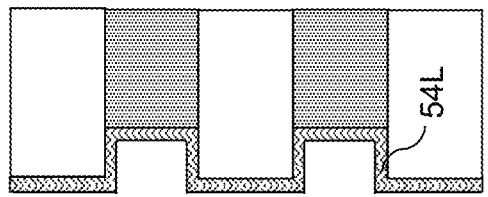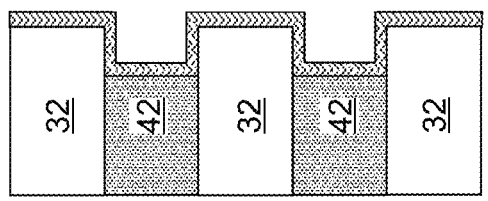
FIG. 18C
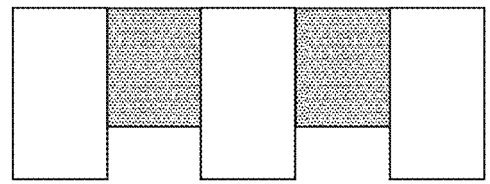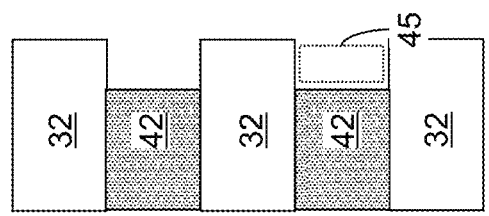
FIG. 18B
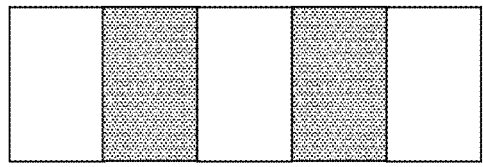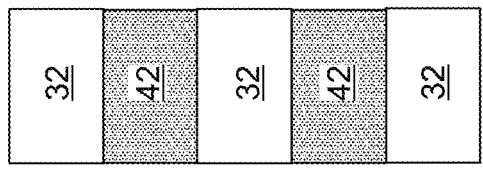
FIG. 18A

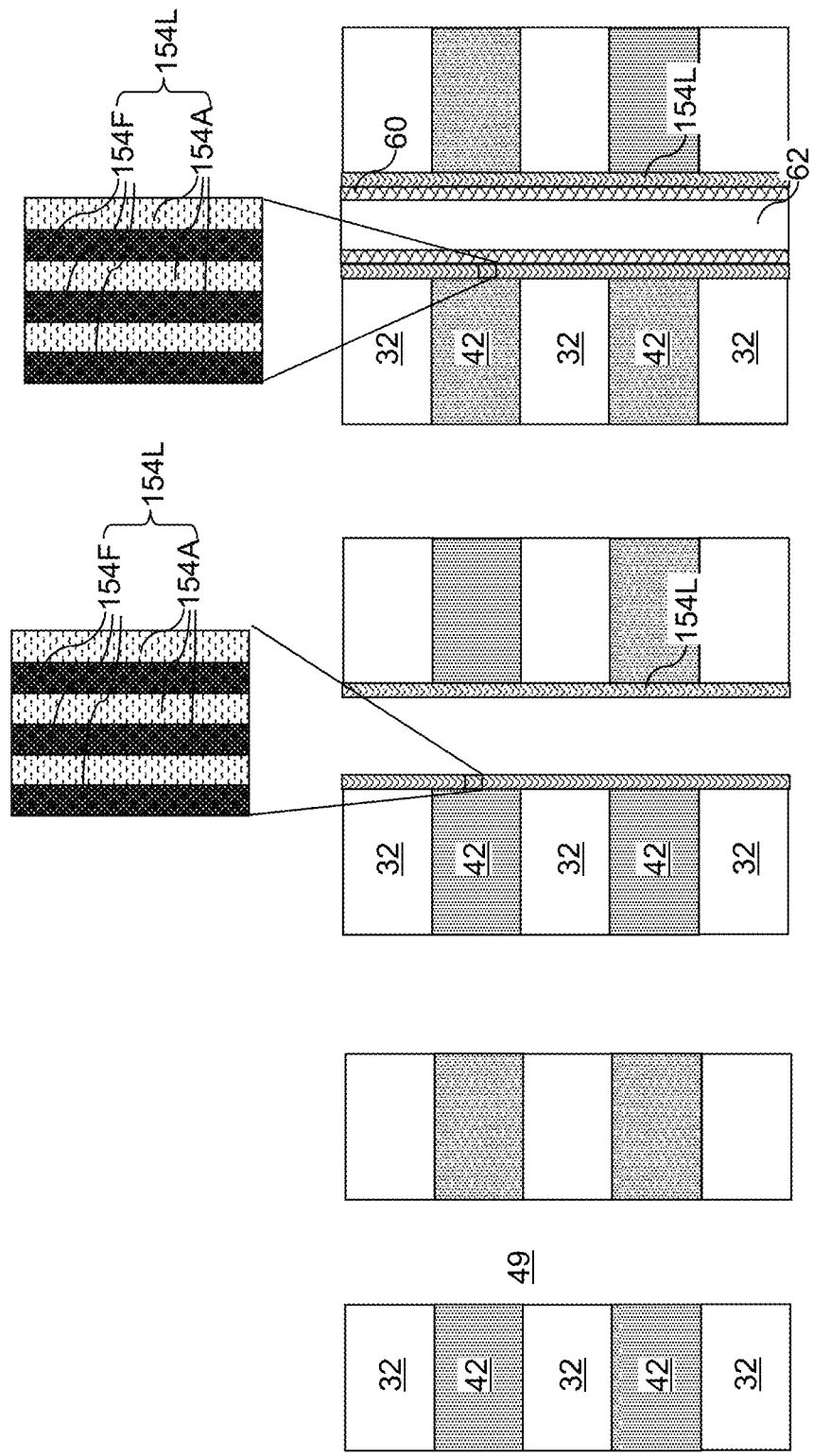

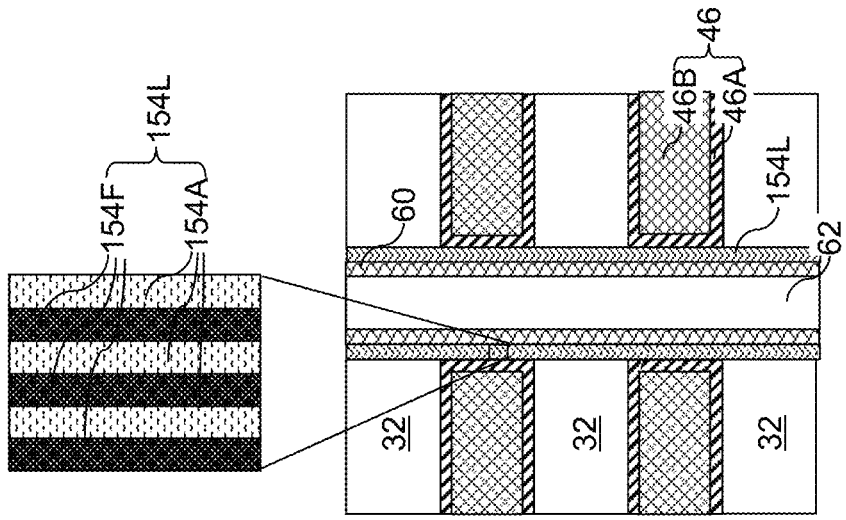
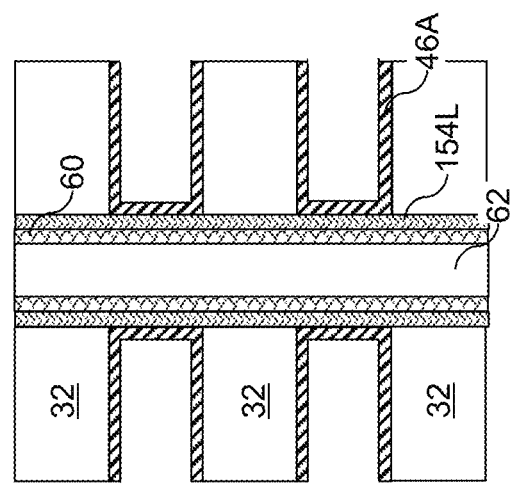
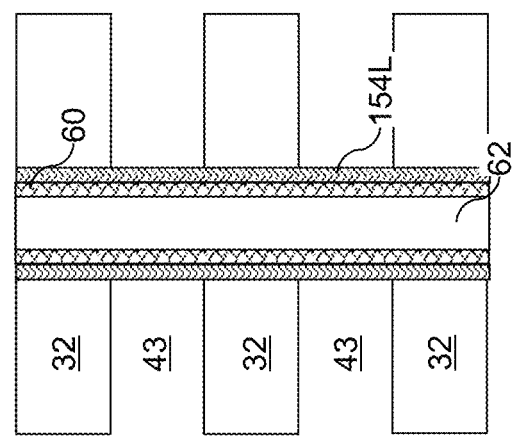
FIG. 22A
FIG. 22B
FIG. 22C

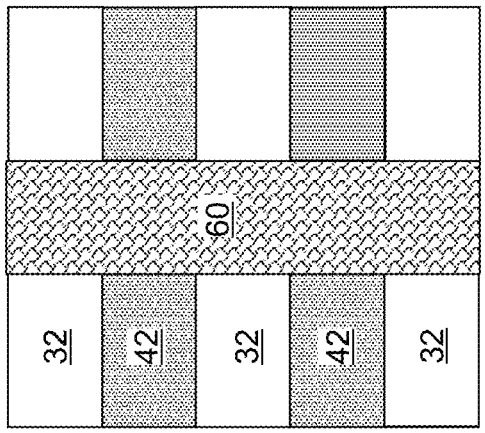
FIG. 24C
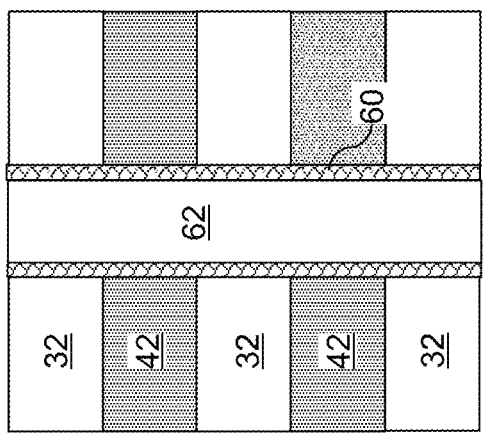
FIG. 24B
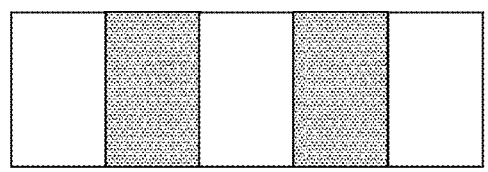
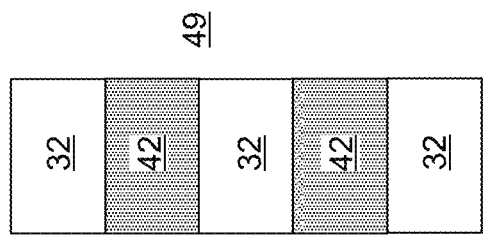
FIG. 24A

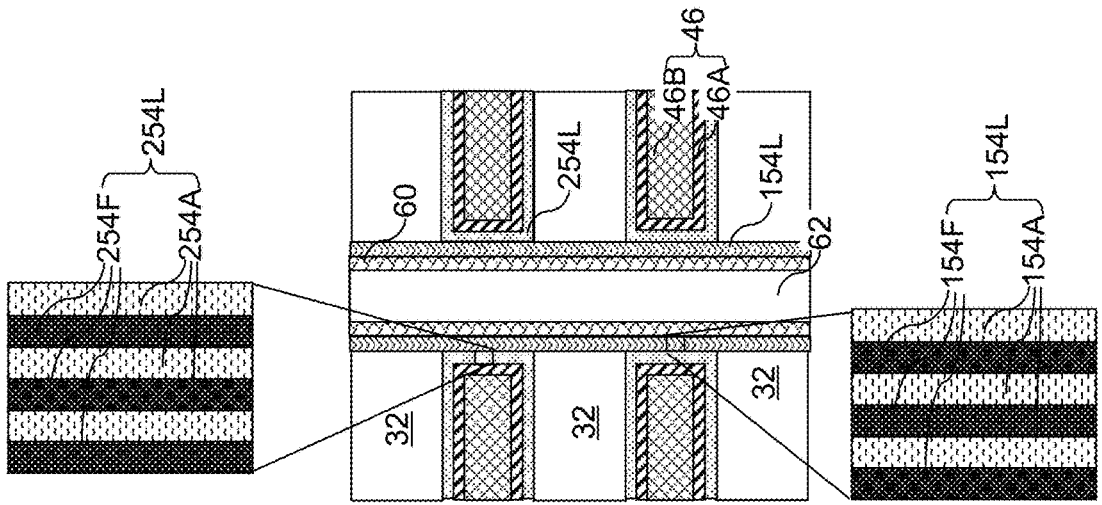
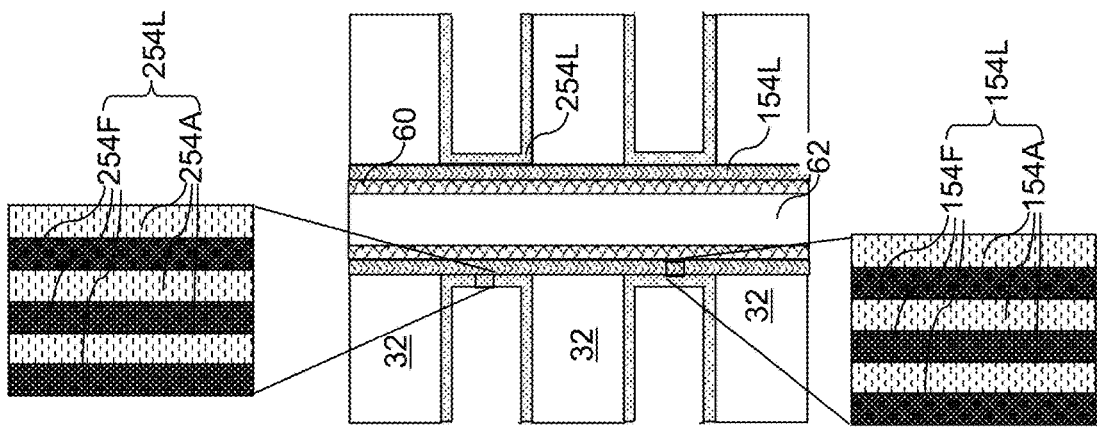
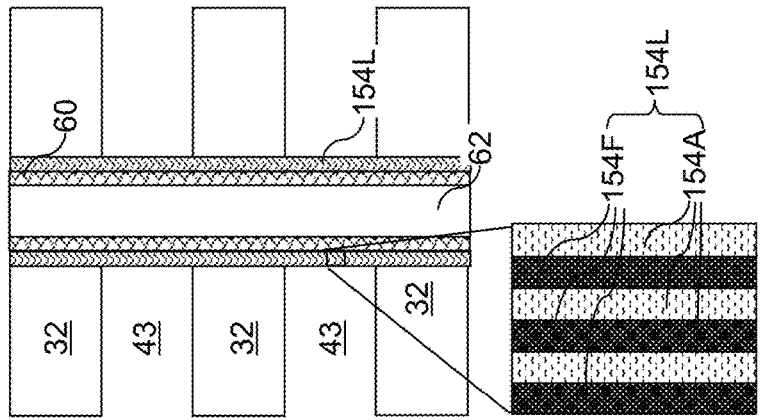

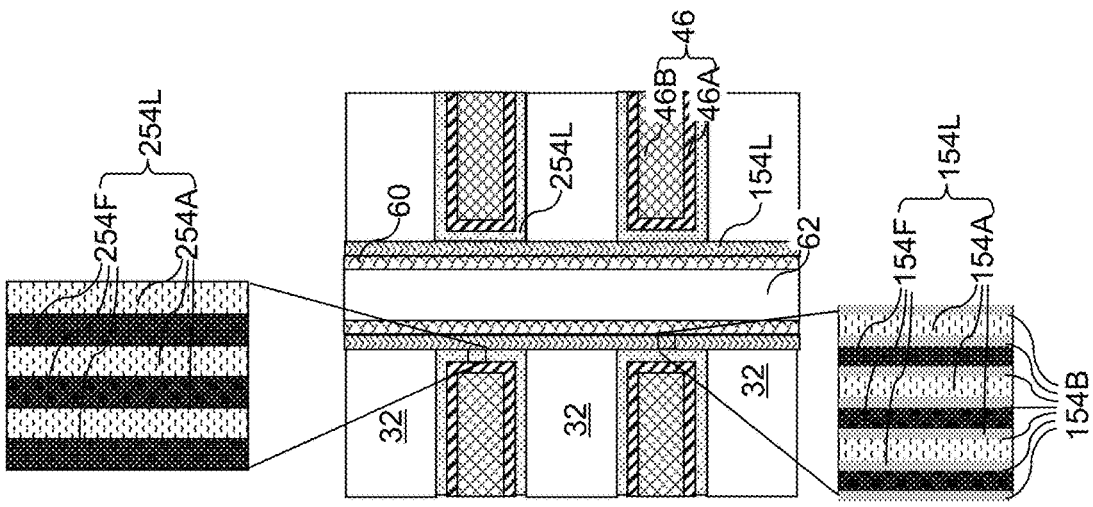
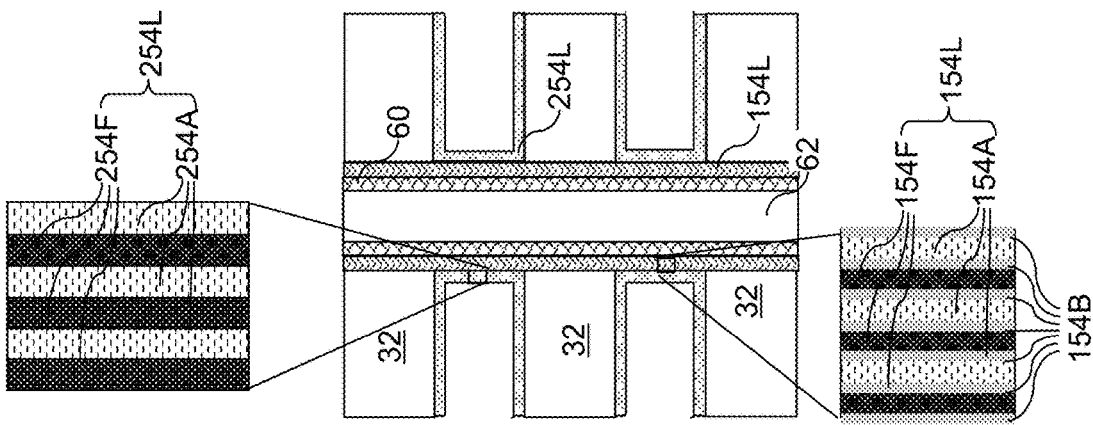
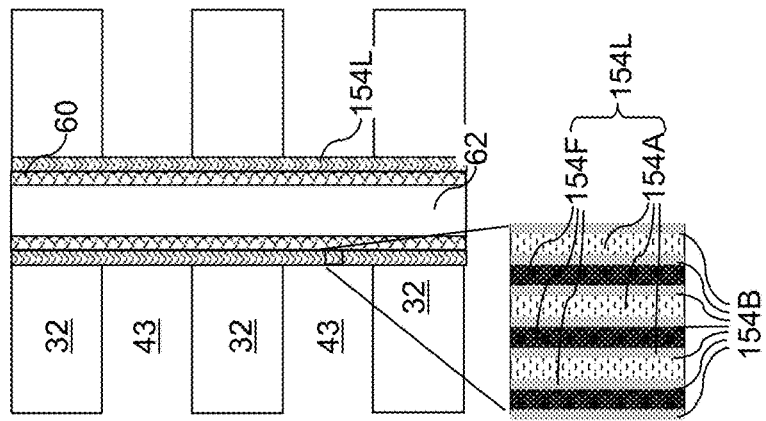

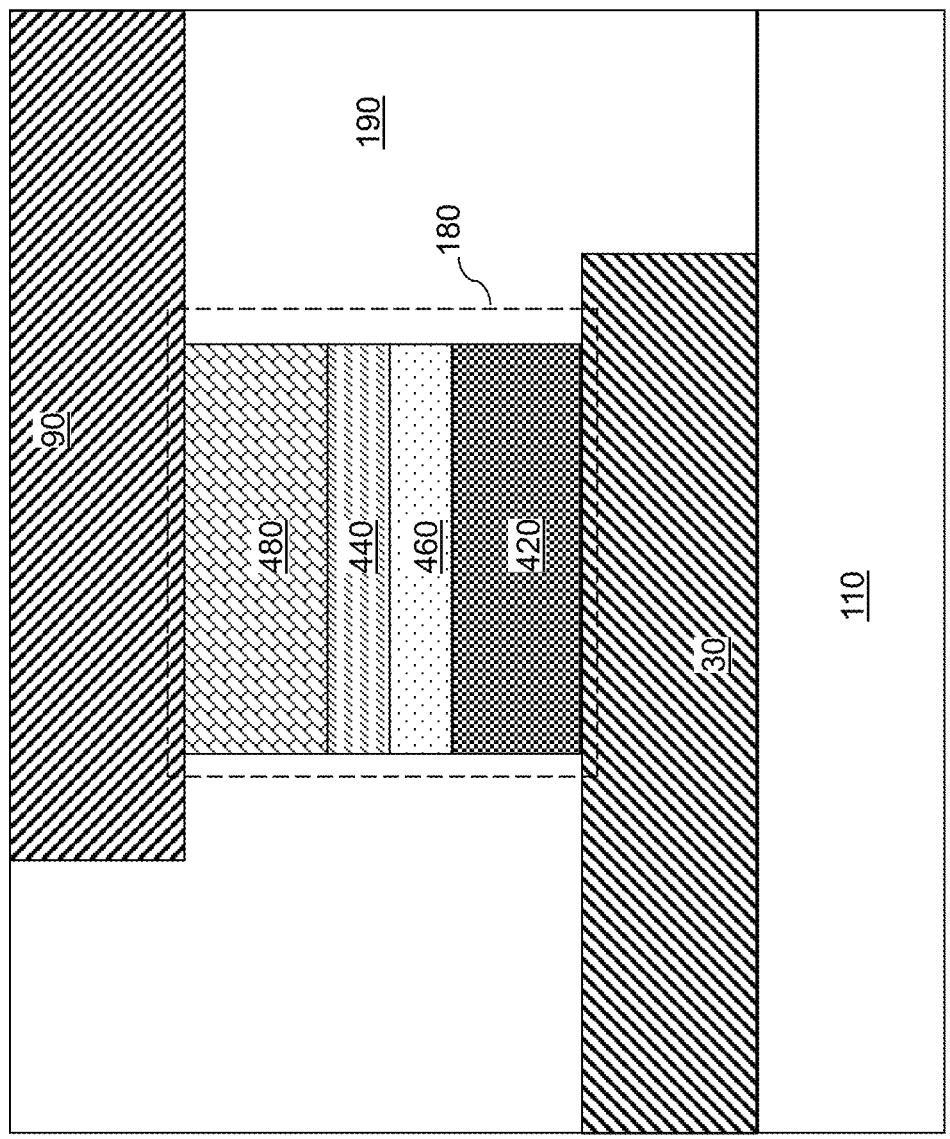

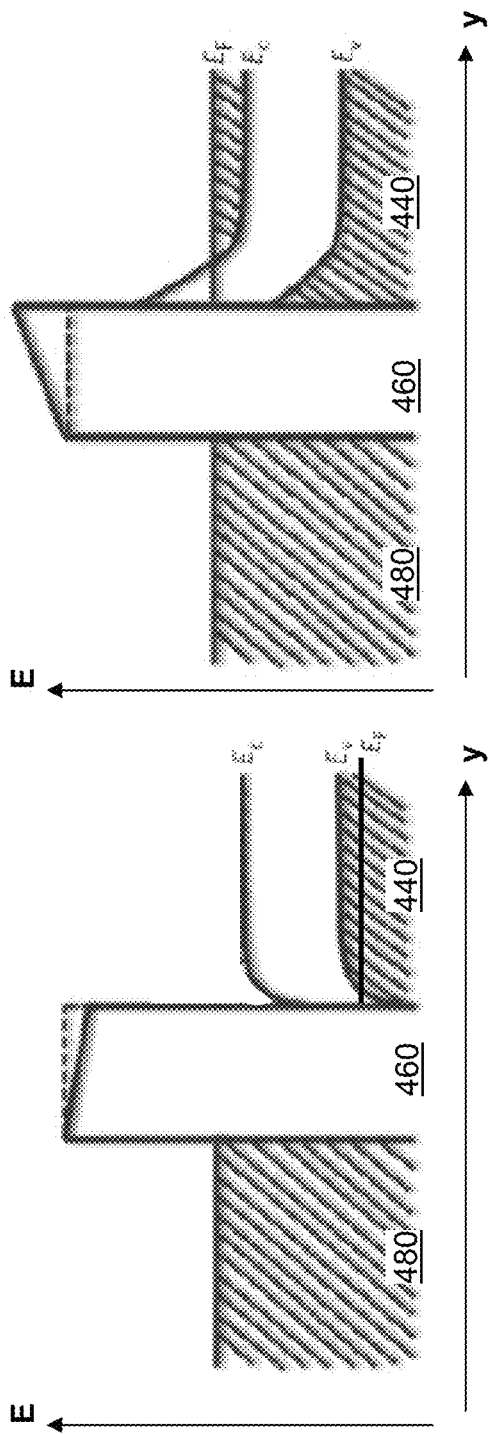

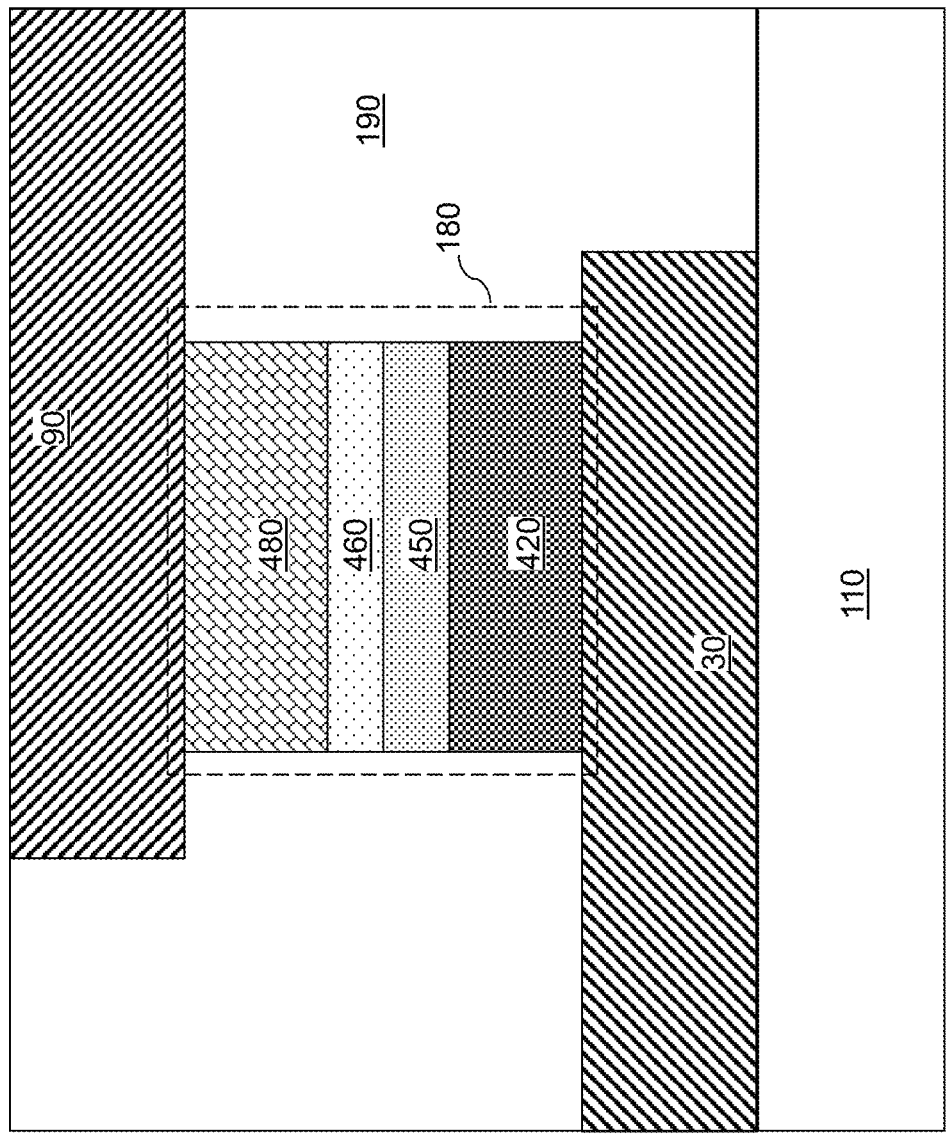

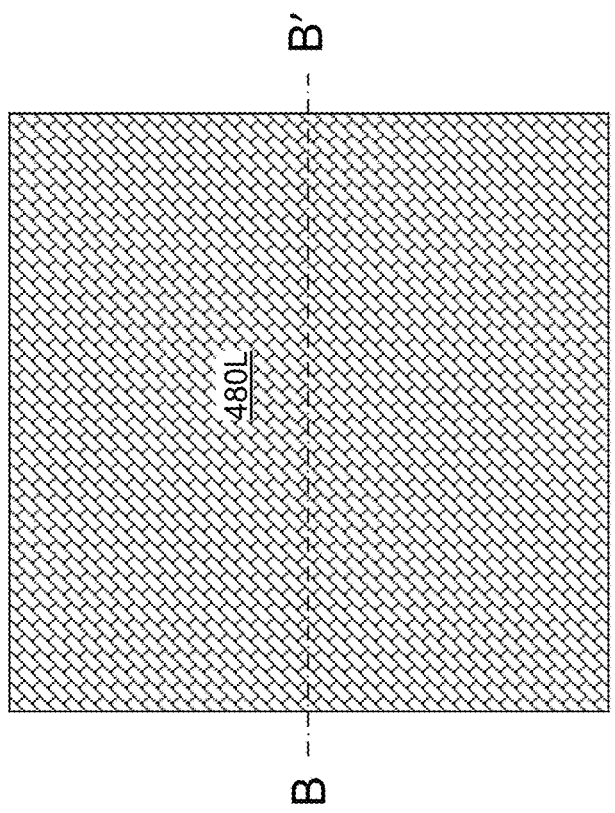
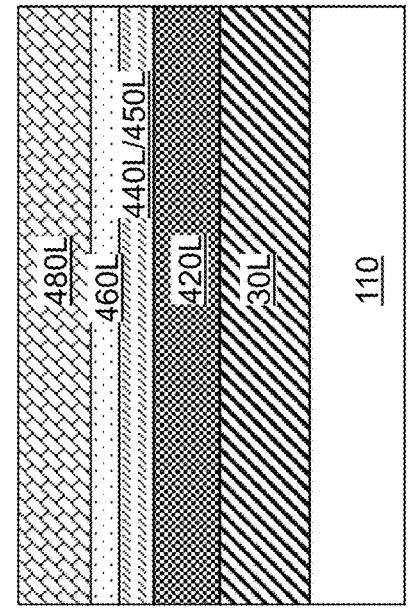
FIG. 36A
FIG. 36B

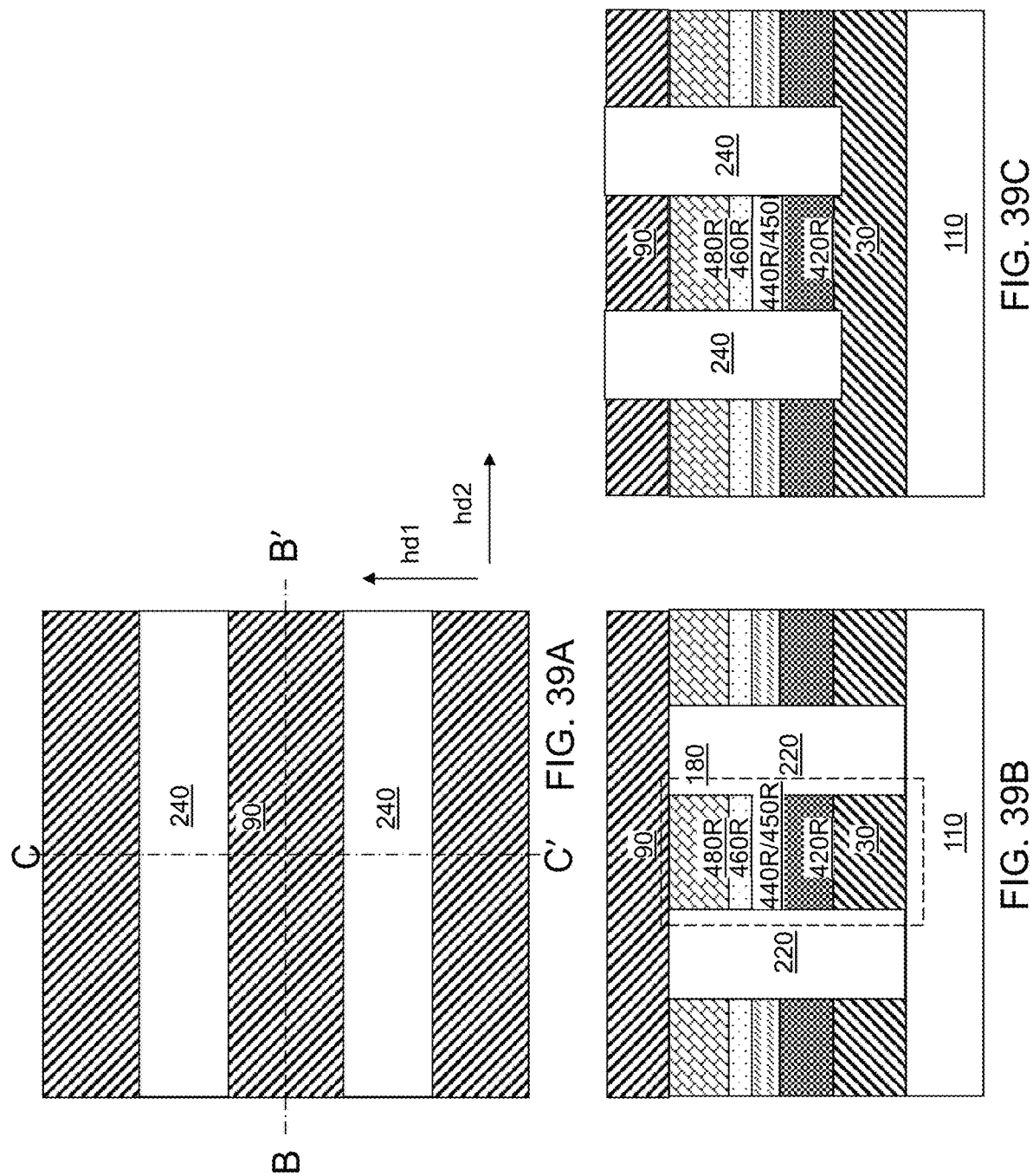

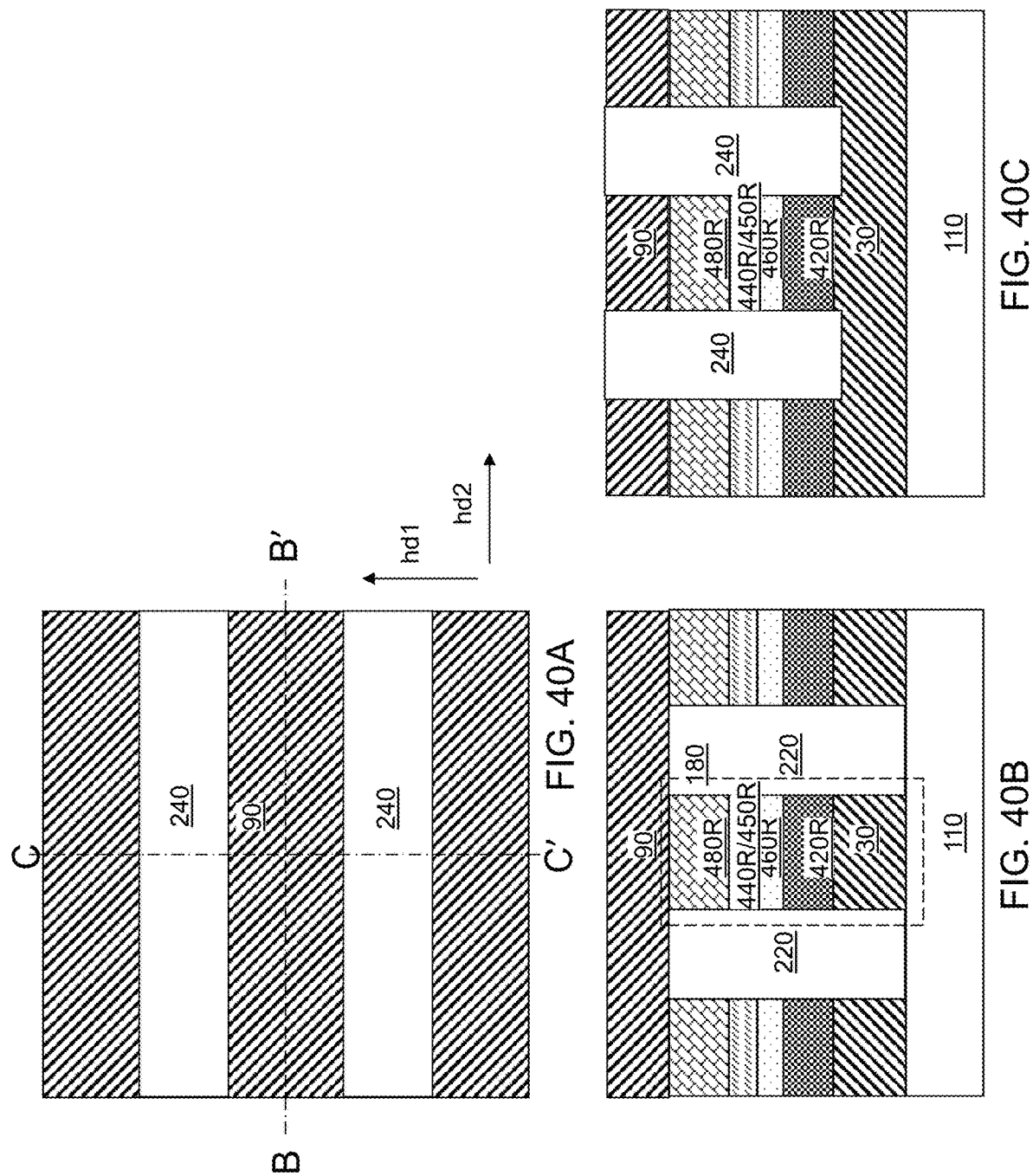

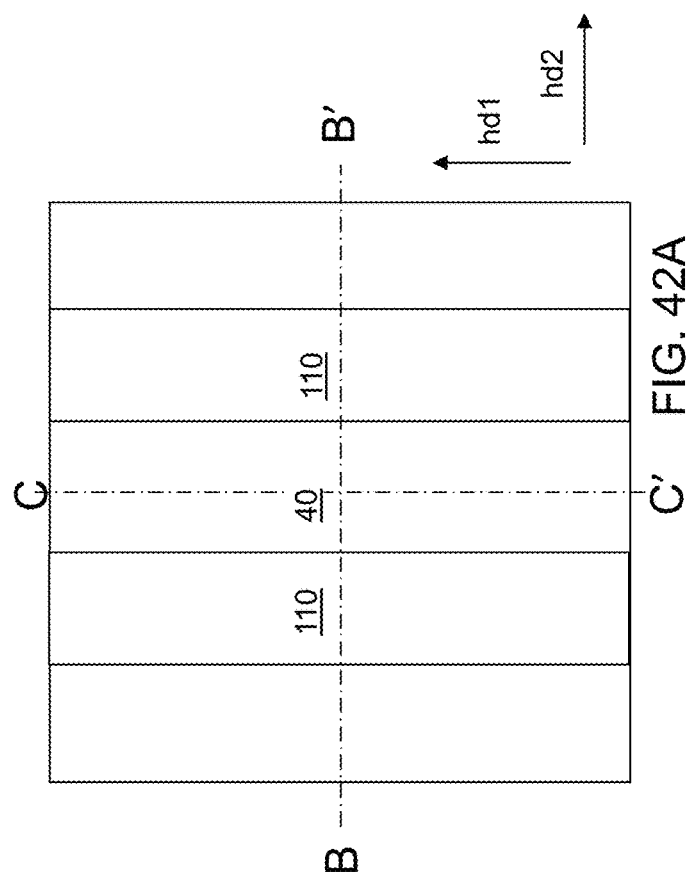
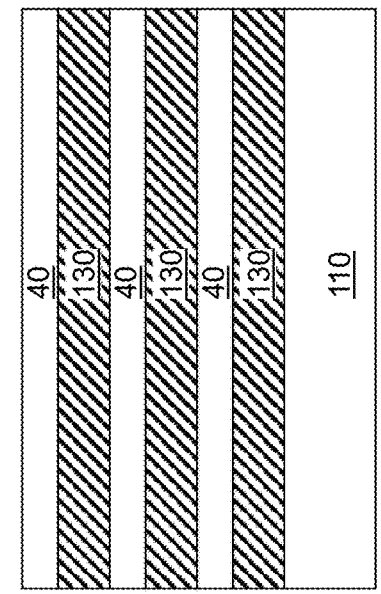
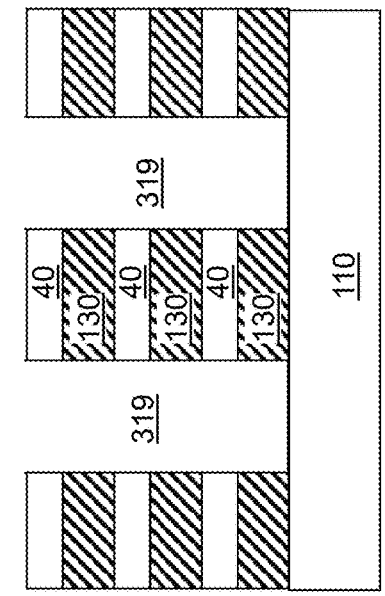

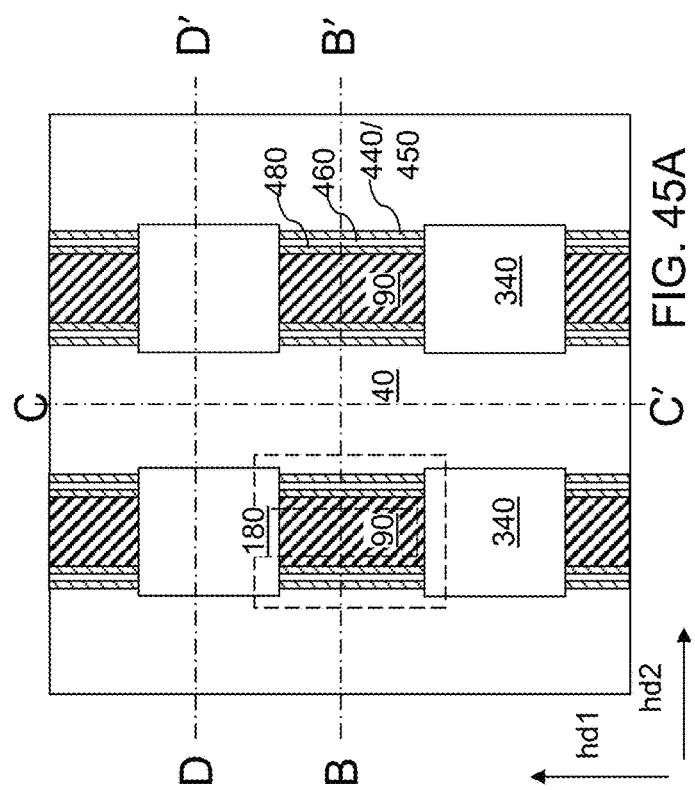
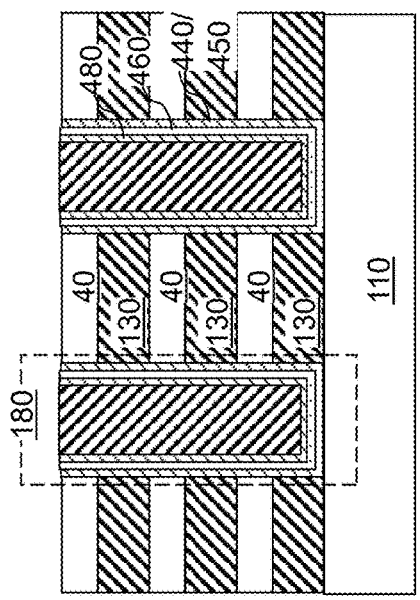
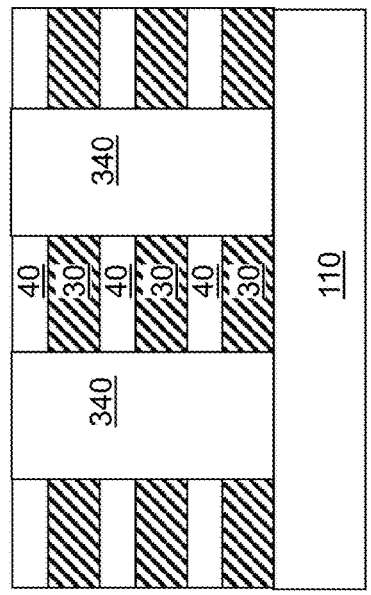
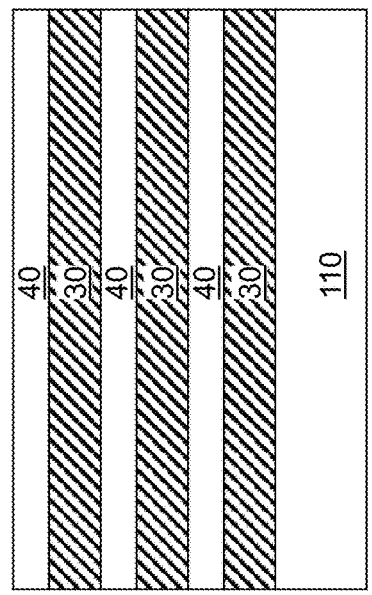

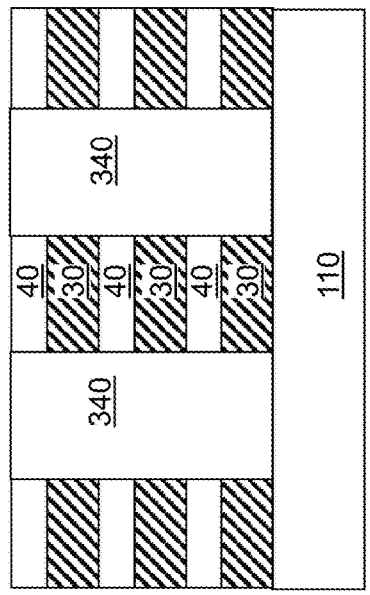
FIG. 46D
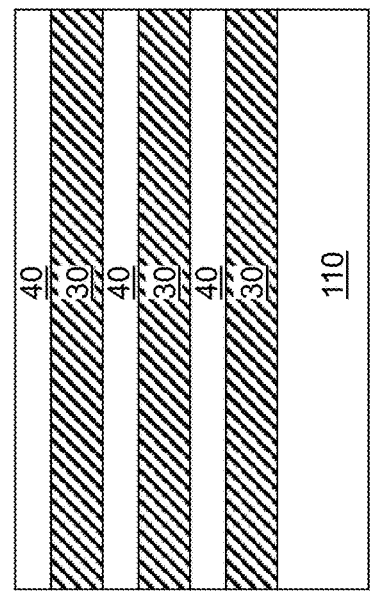
FIG. 46C
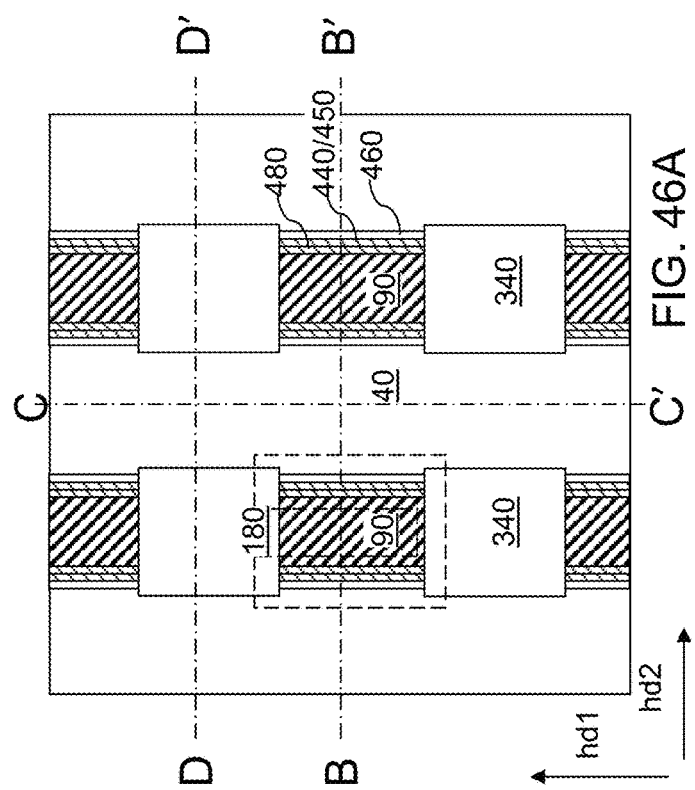
FIG. 46A
FIG. 46B
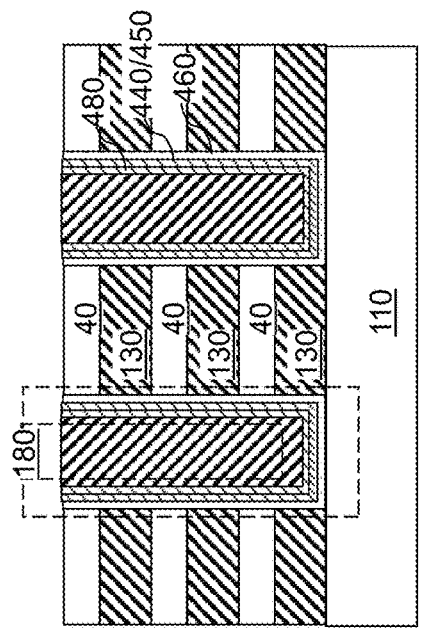

ANTIFERROELECTRIC MEMORY DEVICES AND METHODS OF MAKING THE SAME

RELATED APPLICATIONS

This application is a continuation-in-part (CIP) application of U.S. patent application Ser. No. 16/743,436 filed on Jan. 15, 2020, which is a continuation-in-part application of U.S. patent application Ser. No. 16/541,289 filed on Aug. 15, 2019, the entire contents of which are incorporated herein by reference.

FIELD

The present disclosure relates generally to the field of memory devices, and particularly to antiferroelectric memory devices and methods of manufacturing the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material may be detected by the electric field generated by the dipole moment of the ferroelectric material. For example, the orientation of the dipole moment may be detected by measuring electrical current passing through a semiconductor channel provided adjacent to the ferroelectric material in a field effect transistor ferroelectric memory device.

SUMMARY

According to an aspect of the present disclosure, an antiferroelectric memory device includes at least one antiferroelectric memory cell. Each of the at least one antiferroelectric memory cell includes a first electrode, a second electrode and a stack containing an antiferroelectric layer and a doped semiconductor layer or a ferroelectric layer located between the first and the second electrodes.

According to another aspect of the present disclosure, a method of forming an antiferroelectric memory device is provided. The method comprises: forming a continuous layer stack including a first continuous electrically conductive layer, a continuous symmetry-breaking material layer, and a continuous antiferroelectric layer, wherein the continuous symmetry-breaking material layer comprises a continuous doped semiconductor layer or a continuous ferroelectric layer located above or below the continuous antiferroelectric layer and in contact with the continuous antiferroelectric layer; patterning the continuous layer stack into first electrically conductive lines, symmetry-breaking material rails, and antiferroelectric rails by forming first dielectric rails through the continuous layer stack; depositing a second continuous electrically conductive layer over the symmetry-breaking material rails and the antiferroelectric rails; and patterning the second continuous electrically conductive layer, the symmetry-breaking material rails, and antiferroelectric rails into second electrically conductive lines, symmetry-breaking material layers, and antiferroelectric layers, respectively.

According to still another aspect of the present disclosure, a method of forming a three-dimensional array of antiferroelectric memory array is provided. The method comprises: forming a vertically alternating sequence of electrically conductive layers and insulating layers over a dielectric material layer; dividing the vertically alternating sequence into multiple alternating stacks of first electrically conductive lines and insulating layers by forming line trenches through the vertically alternating sequence; forming a line trench fill structure including a combination of a symmetry-breaking material rail, an antiferroelectric rail, and an electrically conductive rail within each of the line trenches, wherein the symmetry-breaking material layer comprises a doped semiconductor layer or a ferroelectric layer; and dividing each line trench fill structure into a row of composite pillar structures, wherein each of the composite pillar structures comprises a U-shaped symmetry-breaking material layer, a U-shaped antiferroelectric layer, and a second electrically conductive line that extends vertically.

According to an aspect of the present disclosure, a ferroelectric memory device includes a semiconductor channel, a gate electrode, and a ferroelectric memory element located between the semiconductor channel and the gate electrode. The ferroelectric memory element includes at least one ferroelectric material portion and at least one antiferroelectric material portion.

According to another aspect of the present disclosure, a method of forming a three-dimensional ferroelectric memory device comprises forming an alternating stack of insulating layers and spacer material layers over a substrate, wherein the spacer material layers are formed as, or are subsequently replaced with, electrically conductive layers, forming memory openings vertically extending through the alternating stack, forming vertical semiconductor channels within the memory openings, and forming ferroelectric memory elements, each of which comprises at least one ferroelectric material portion and at least one antiferroelectric material portion.

According to an aspect of the present disclosure, a three-dimensional ferroelectric memory device includes an alternating stack of insulating layers and electrically conductive layers located over a substrate, where each of the electrically conductive layers comprises a respective transition metal nitride liner and a respective conductive fill material layer, a vertical semiconductor channel vertically extending through the alternating stack, a transition metal nitride spacer laterally surrounding the vertical semiconductor channel, and a ferroelectric material portion laterally surrounding the transition metal nitride spacer.

BRIEF DESCRIPTION OF THE DRAWINGS

FIG. 3 is a schematic vertical cross-sectional view of the exemplary structure after formation of stepped terraces and a retro-stepped dielectric material portion according to an embodiment of the present disclosure.

FIGS. 5A-5H are sequential schematic vertical cross-sectional views of a memory opening within the exemplary structure during formation of a first exemplary memory opening fill structure according to a first embodiment of the present disclosure.

FIGS. 14A-14H are sequential schematic vertical cross-sectional views of a memory opening within the exemplary structure during formation of a second exemplary memory opening fill structure according to a second embodiment of the present disclosure.

FIG. 14I is a vertical cross-sectional view of an alternative configuration of the second exemplary memory opening fill structure according to the second embodiment of the present disclosure.

FIGS. 15A-15D are sequential vertical cross-sectional views of a memory opening during formation of a second exemplary memory opening fill structure according to the second embodiment of the present disclosure.

FIG. 15E is a vertical cross-sectional view of a memory opening after formation of an alternative configuration of the second exemplary memory opening fill structure according to the second embodiment of the present disclosure.

FIGS. 16A-16H are sequential schematic vertical cross-sectional views of a memory opening within the exemplary structure during formation of a third exemplary memory opening fill structure according to a third embodiment of the present disclosure.

FIGS. 18A-18H are sequential schematic vertical cross-sectional views of a memory opening within the exemplary structure during formation of a fourth exemplary memory opening fill structure according to a fourth embodiment of the present disclosure.

FIGS. 20A-20C are sequential vertical cross-sectional views of a memory opening during formation of a fifth exemplary memory opening fill structure according to a fifth embodiment of the present disclosure.

FIGS. 22A-22C are sequential vertical cross-sectional views of a memory opening during replacement of the sacrificial material layers with electrically conductive layers according to the fifth embodiment of the present disclosure.

FIGS. 24A-24C are sequential vertical cross-sectional views of a memory opening during formation of a sixth exemplary memory opening fill structure according to a sixth embodiment of the present disclosure.

FIGS. 26A-26C are sequential vertical cross-sectional views of a region around a memory opening during replacement of the sacrificial material layers with dielectric layer stacks and electrically conductive layers according to a seventh embodiment of the present disclosure.

FIGS. 27A-27C are sequential vertical cross-sectional views of a region around a memory opening during replacement of the sacrificial material layers with dielectric layer stacks and electrically conductive layers according to an eighth embodiment of the present disclosure.

FIG. 31B is a vertical cross-sectional view of an alternative configuration of the seventh exemplary structure according to the twelfth embodiment of the present disclosure.

FIGS. 32A and 32B are energy band diagrams of energy versus stack height direction (i.e., y-direction) of layers within the seventh exemplary structure according to the twelfth embodiment of the present disclosure.

FIG. 34A is a vertical cross-sectional view of an eighth exemplary structure after formation according to the thirteenth embodiment of the present disclosure.

FIG. 36A is a top-down view of a ninth exemplary structure after formation of a continuous layer stack including a first continuous electrically conductive layer, a continuous symmetry-breaking material layer, and a continuous antiferroelectric layer according to the fourteenth embodiment of the present disclosure.

FIG. 36B is a vertical cross-sectional view of the ninth exemplary structure along the vertical plane B-B' of FIG. 36A.

FIG. 39A is a vertical cross-sectional view of the ninth exemplary structure after formation of second dielectric rails according to the fourteenth embodiment of the present disclosure.

FIG. 39B is vertical cross-sectional view of the ninth exemplary structure along the vertical plane B-B' of FIG. 39A.

FIG. 39C is vertical cross-sectional view of the ninth exemplary structure along the vertical plane C-C' of FIG. 39A.

FIG. 40A is a vertical cross-sectional view of an alternative configuration of the ninth exemplary structure according to the fifteenth embodiment of the present disclosure.

FIG. 40B is vertical cross-sectional view of the ninth exemplary structure along the vertical plane B-B' of FIG. 40A.

FIG. 40C is vertical cross-sectional view of the ninth exemplary structure along the vertical plane C-C' of FIG. 40A.

FIG. 42A is a vertical cross-sectional view of the tenth exemplary structure after formation of first line trenches according to the sixteenth embodiment of the present disclosure.

FIG. 42B is vertical cross-sectional view of the tenth exemplary structure along the vertical plane B-B' of FIG. 42A.

FIG. 42C is vertical cross-sectional view of the tenth exemplary structure along the vertical plane C-C' of FIG. 42A.

FIG. 45A is a vertical cross-sectional view of the tenth exemplary structure after formation of a two-dimensional array of dielectric pillar structures according to the sixteenth embodiment of the present disclosure.

FIG. 45B is vertical cross-sectional view of the tenth exemplary structure along the vertical plane B-B' of FIG. 45A.

FIG. 45C is vertical cross-sectional view of the tenth exemplary structure along the vertical plane C-C' of FIG. 45A.

FIG. 45D is vertical cross-sectional view of the tenth exemplary structure along the vertical plane D-D' of FIG. 45A.

FIG. 46A is a vertical cross-sectional view of an alternative configuration of the tenth exemplary structure after formation of a two-dimensional array of dielectric pillar structures according to the sixteenth embodiment of the present disclosure.

FIG. 46B is vertical cross-sectional view of the tenth exemplary structure along the vertical plane B-B' of FIG. 46A.

FIG. 46C is vertical cross-sectional view of the tenth exemplary structure along the vertical plane C-C' of FIG. 46A.

FIG. 46D is a vertical cross-sectional view of the tenth exemplary structure along the vertical plane D-D' of FIG. 46A.

DETAILED DESCRIPTION

Figure 1:
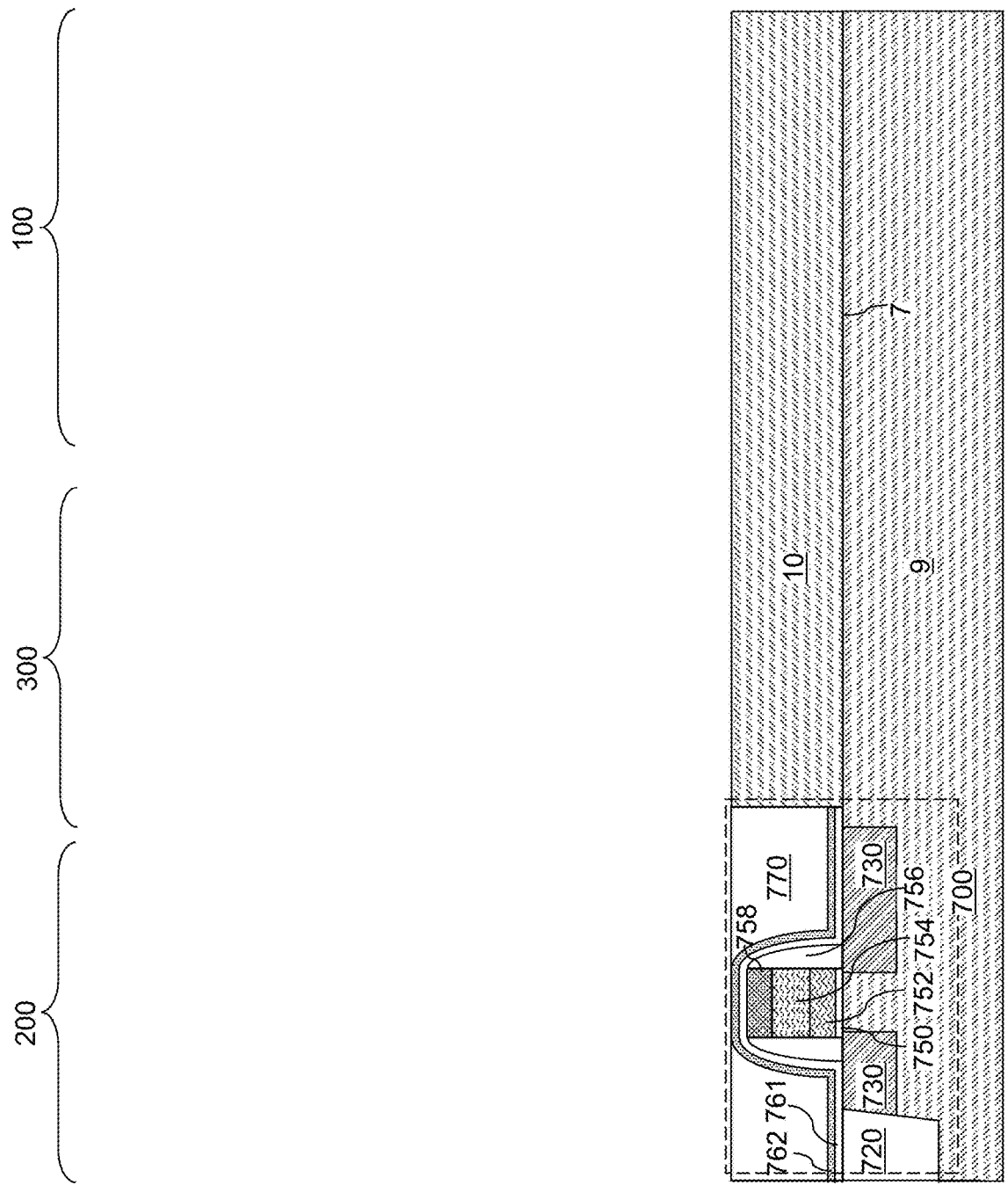
FIG. 1 is a schematic vertical cross-sectional view of an exemplary structure after formation of at least one peripheral device and a semiconductor material layer according to an embodiment of the present disclosure.

As discussed above, the present disclosure is directed to antiferroelectric memory devices, such as antiferroelectric tunnel junction (AFTJ) devices containing antiferroelectric layers in combination with ferroelectric and/or semiconductor layers and methods of manufacturing the same, the various aspects of which are described below. The embodiments of the disclosure may be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated employing the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure according to a first embodiment of the present disclosure is illustrated, which may be employed, for example, to fabricate a device structure containing vertical NAND memory devices. The exemplary structure includes a substrate (9, 10), which may be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, at least one semiconductor device 700 for a peripheral circuitry may be formed on a portion of the substrate semiconductor layer 9. The at least one semiconductor device can include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 may be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry can contain a driver circuit for memory devices to be subsequently formed, which can include at least one NAND device.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be employed for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers may be provided between the memory array region 100 and the peripheral device region 200. In an alternative embodiment, the at least one semiconductor device 700 is formed under the memory array region 100 in a CMOS under array ("CUA") configuration. In this case, the peripheral device region 200 may be omitted or used in combination with the CUA configuration. In another alternative embodiment, the at least one semiconductor device 700 may be formed on a separate substrate and then bonded to substrate (9, 10) containing the memory array region 100.

Figure 2:
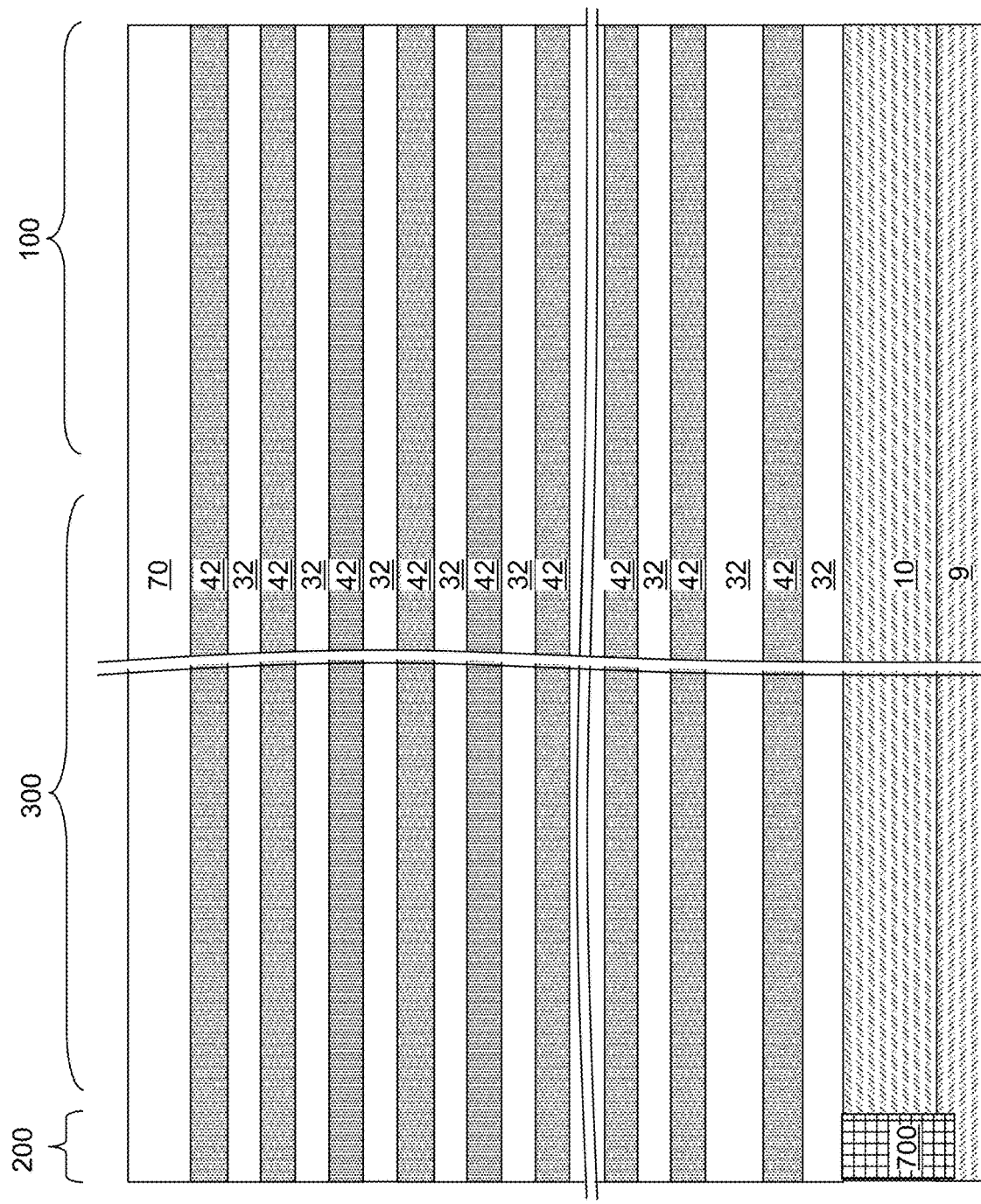
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which may be insulating layers 32) and second material layers (which may be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 may be deposited, for example, by chemical vapor deposition (CVD). For example, if silicon oxide is employed for the insulating layers 32, tetraethyl orthosilicate (TEOS) may be employed as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be employed for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

Optionally, an insulating cap layer 70 may be formed over the alternating stack (32, 42). The insulating cap layer 70 includes a dielectric material that is different from the material of the sacrificial material layers 42. In one embodiment, the insulating cap layer 70 can include a dielectric material that may be employed for the insulating layers 32 as described above. The insulating cap layer 70 can have a greater thickness than each of the insulating layers 32. The insulating cap layer 70 may be deposited, for example, by chemical vapor deposition. In one embodiment, the insulating cap layer 70 may be a silicon oxide layer.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 may be formed through the insulating cap layer 70 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the insulating cap layer 70.

Figure 4A:
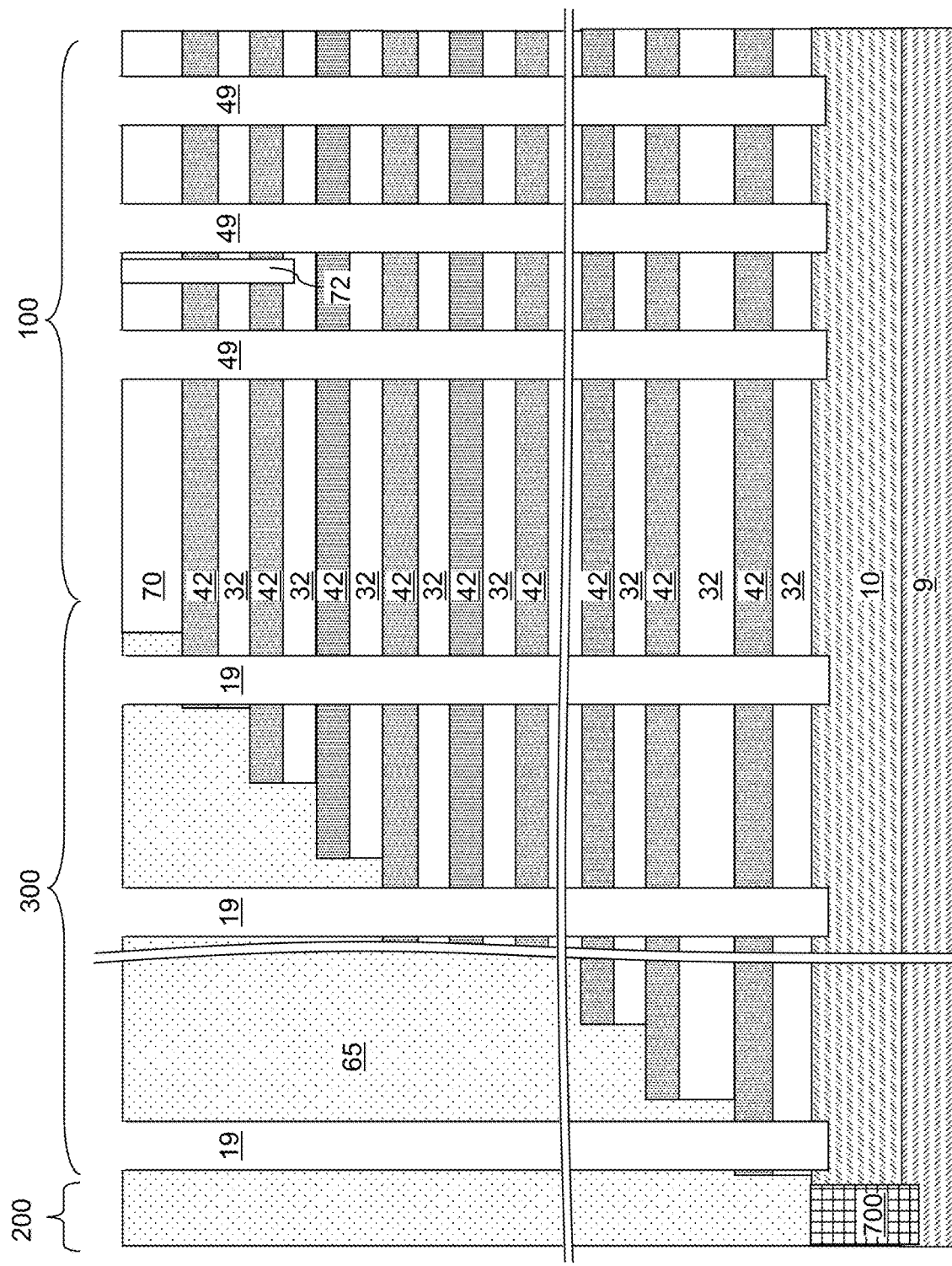
FIG. 4A is a schematic vertical cross-sectional view of the exemplary structure after formation of memory openings and support openings according to an embodiment of the present disclosure.
Figure 4B:
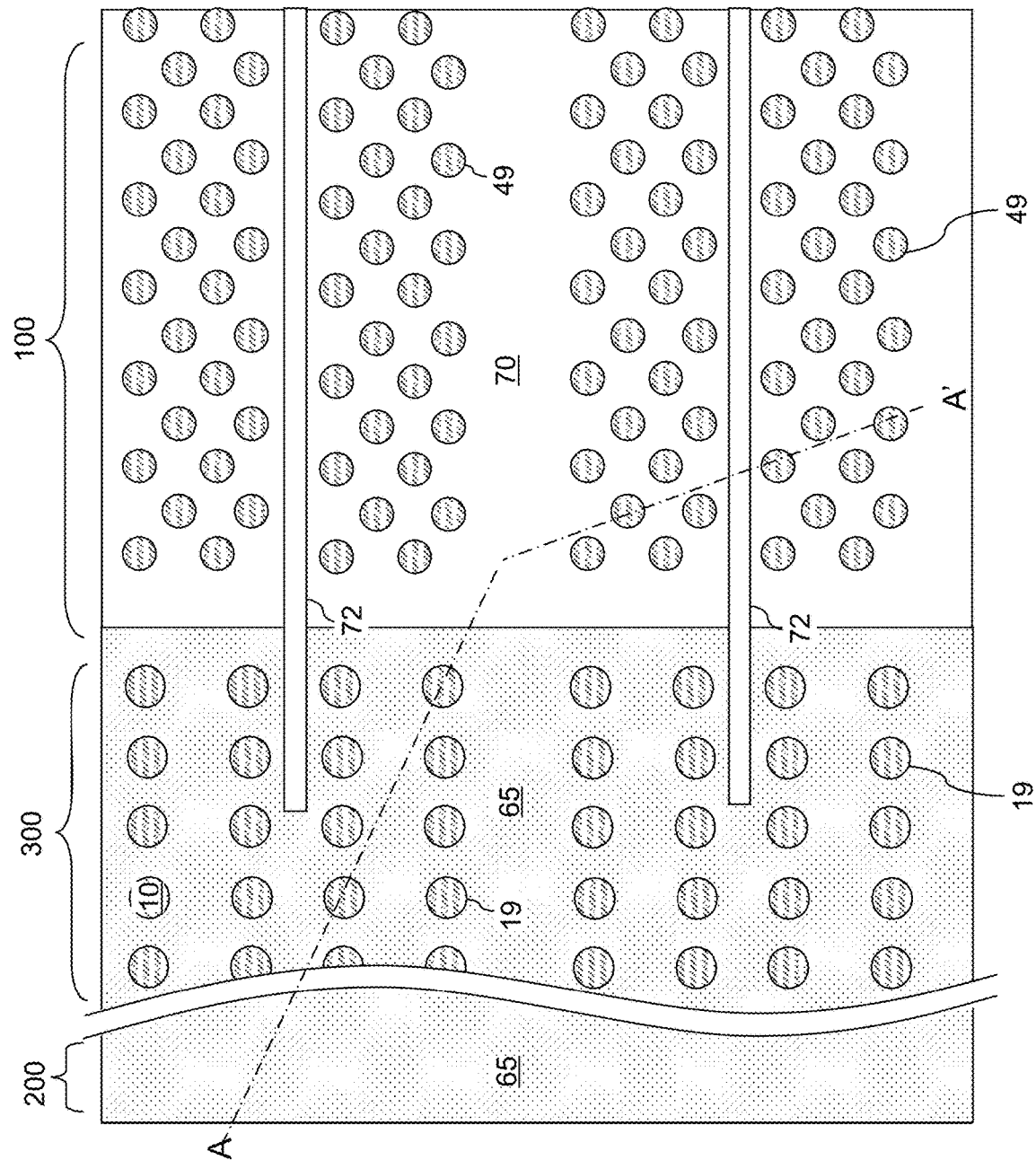
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths can also be employed. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the first exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths can also be employed. Optionally, the sacrificial material layers 42 may be laterally recessed partially to form lateral recesses (not shown), for example, by an isotropic etch.

Referring to FIG. 5B, an isotropic etch process may be performed to etch proximal portions of the sacrificial material layers 42 selective to the insulating layers 32. For example, if the sacrificial material layers 42 include silicon nitride and if the insulating layers 32 include silicon oxide, a timed phosphoric acid wet etch process may be used to laterally recess sidewalls of the sacrificial material layers 42 relative to sidewalls of the insulating layers 32. Lateral annular recesses 45 may be formed by laterally recessing the sidewalls of the sacrificial material layers 42 selective to the insulating layers 32 around each memory opening 49. As used herein, removal of a first material is "selective to" a second material if the etch rate for the first material is at least three times the etch rate for the second material. Lateral etch distance of the isotropic etch process may be in a range from 20 nm to 50 nm, such as 30 to 40 nm, although lesser and greater lateral etch distances can also be employed. The lateral etch distance is the distance between a vertical plane including a recessed sidewall of a sacrificial material layer 42 and a vertical plane including a sidewall of an insulating layer 32 around each memory opening 49.

Referring to FIG. 5C, a continuous amorphous dielectric material layer 54L is deposited on the physically exposed sidewalls of the insulating layers 32 and the sacrificial material layers 42 of the alternating stack (32, 42) by a conformal deposition method. The continuous amorphous dielectric material layer 54L can include, and/or can consist essentially of, an amorphous hafnium oxide dielectric material capable of transitioning into a ferroelectric non-centrosymmetric orthorhombic phase after a crystallization anneal. The continuous amorphous dielectric material layer 54L can include zero to 30 volume percent of any one or more crystalline phases, such as monoclinic, orthorhombic, cubic and/or tetragonal crystalline phases.

As used herein, a "ferroelectric material" refers to a crystalline material that exhibits spontaneous electrical polarization in the absence of an external electric field. In one embodiment, the ferroelectric material comprises hafnium oxide, which has a predominant non-centrosymmetric orthorhombic phase and is preferably doped with at least one dopant selected from Al, Si, Gd, La, Y, Sr or Zr. In one embodiment, the dopant concentration of Al, Gd, Y or Sr may range from about 2 atomic percent to about 5 atomic percent, such as about 3 atomic percent to about 4 atomic percent. The dopant concentration of silicon may range from about 3 atomic percent to about 8 atomic percent, such as about 3 atomic percent to about 5 atomic percent. The dopant concentration of lanthanum may range from about 7 atomic percent to about 17 atomic percent, such as about 10 atomic percent to about 15 atomic percent. If hafnium oxide is doped with zirconium, then the resulting material may form a solid solution of hafnium oxide and zirconium oxide, and the dopant concentration for zirconium may range from about 30 atomic percent to about 70 atomic percent, such as about 40 atomic percent to about 60 atomic percent. In one non-limiting embodiment, the ferroelectric material may have the following formula: $Hf_{1-x}D_xO_{2-y}$, where D is a dopant selected from Al, Si, Gd, La, Y, Sr and/or Zr, where $0 \leq y \leq 0.01$, and where range for Al, Gd, Y or Sr is $0.02 \leq x \leq 0.05$, for Si 0.03 is $\leq x \leq 0.08$, for La is $0.07 \leq x \leq 0.17$, and for Zr is $0.3 \leq x \leq 0.7$. In one embodiment, the ferroelectric material has a predominant non-centrosymmetric orthorhombic phase, such that at least 50 volume percent, such as 70 to 100 volume percent of the ferroelectric material comprises the non-centrosymmetric orthorhombic phase, and has less than 50 volume percent, such as 0 to 30 volume percent total of amorphous, monoclinic, cubic and tetragonal phases.

Generally, the ferroelectric hafnium oxide material exhibits ferroelectric properties only its non-centrosymmetric orthorhombic crystalline phase. Thus, amorphous hafnium oxide having substantially the same material composition as the ferroelectric hafnium oxide material generally does not exhibit ferroelectric properties. As used herein "substantially the same material composition" refers to exactly the same compositions, or compositions that differ by less than 1 atomic percent. For example, and without wishing to be bound by a particular theory, it is believed that when amorphous hafnium oxide is annealed in contact with titanium nitride and/or tantalum nitride, some of the oxygen atoms may be scavenged from hafnium oxide by the nitride, thus increasing the oxygen vacancy concentration and slightly decreasing the oxygen atom concentration in the hafnium oxide after the anneal. As used herein, an "an amorphous dielectric material capable of transitioning into a ferroelectric phase" refers to a dielectric material, such as hafnium oxide, that is predominantly in the amorphous phase and has a substantially similar material composition as the ferroelectric material in the non-centrosymmetric orthorhombic crystalline phase, and as such, is inherently capable of transitioning into a ferroelectric material upon crystallization into a suitable phase. For example, it is believed that hafnium oxide displays ferroelectric properties only in the non-centrosymmetric orthorhombic phase, and does not display ferroelectric properties in other crystalline phases, such as monoclinic, tetragonal or cubic phases.

The continuous amorphous dielectric material layer 54L partially fills the lateral annular recesses 45 at the levels of the sacrificial material layers 42. The continuous amorphous dielectric material layer 54L that extends through, and contacts each of, the insulating layers 32 and the sacrificial material layers 42 of the alternating stack (32, 42). The continuous amorphous dielectric material layer 54L may be deposited employing a conformal deposition process, such as an atomic layer deposition (ALD) process or a chemical vapor deposition (CVD) process. The deposition temperature of the conformal deposition process may be below the crystallization temperature of the amorphous material in the continuous amorphous dielectric material layer 54L. For example, the deposition temperature may be lower than 400 degrees Celsius, such as 250 to 350 degrees Celsius. The continuous amorphous dielectric material layer 54L can have a thickness in a range from 2 nm to 40 nm, such as from 5 nm to 20 nm, although lesser and greater thicknesses can also be employed. An outer sidewall of the continuous amorphous dielectric material layer 54L may have a laterally-undulating profile along a vertical direction, and can include laterally-protruding surfaces at each level of the sacrificial material layers 42.

Referring to FIG. 5D, a continuous transition metal nitride layer 56L may be formed on the inner sidewall of the continuous amorphous dielectric material layer 54L. The continuous transition metal nitride layer 56L includes a conductive metal nitride material of a transition metal, such as TiN or TaN. The continuous transition metal nitride layer 56L may be deposited by a conformal deposition process such as a chemical vapor deposition process. The thickness of the continuous transition metal nitride layer 56L may be in a range from 3 nm to 40 nm, such as from 6 nm to 20 nm, although lesser and greater thicknesses can also be employed.

Referring to FIG. 5E, and anisotropic etch process may be performed to etch the material of the continuous transition metal nitride layer 56L selective to the material of the continuous amorphous dielectric material layer 54L. Portions of the continuous transition metal nitride layer 56L located at the levels of the insulating layers 32 are removed by the anisotropic etch process, and portions of the continuous transition metal nitride layer 56L located in the lateral annular recesses 45 at laterally recessed portions of the continuous amorphous dielectric material layer 54L at the levels of the sacrificial material layers 42 are not removed by the anisotropic etch process. Remaining portions of the continuous transition metal nitride layer 56L constitutes transition metal nitride spacers 56. In other words, the transition metal nitride spacers 56 comprise remaining portions of the continuous transition metal nitride layer 56L that are present adjacent to the lateral annular recesses 45.

Each transition metal nitride spacer 56 has a tubular configuration. Each of the transition metal nitride spacers 56 has an inner cylindrical sidewall and an outer cylindrical sidewall that is laterally offset from the inner cylindrical sidewall by a uniform lateral thickness. The thickness of each transition metal nitride spacer 56, and measured between an inner sidewall and an outer sidewall, may be uniform, and may be in a range from 3 nm to 30 nm, although lesser and greater thicknesses can also be employed. The inner sidewalls of the transition metal nitride spacer 56 may be vertically coincident with the inner sidewall of the continuous amorphous dielectric material layer 54L. A combination of an amorphous dielectric material portion (comprising a portion of the continuous amorphous dielectric material layer 54L) and a transition metal nitride spacer 56 is formed adjacent to each of the lateral annular recesses 45. The amorphous dielectric material portion comprises an amorphous dielectric material capable of transitioning into a ferroelectric phase under crystallization.

Referring to FIG. 5F, an optional gate dielectric layer 66 may be formed by conformal deposition of a dielectric material on the physically exposed inner surfaces of the transition metal nitride spacer 56 and the physically exposed portions of the inner sidewall of the continuous amorphous dielectric material layer 54L. The gate dielectric layer 66 can include a dielectric material such as silicon oxide, silicon oxynitride and/or a non-ferroelectric dielectric metal oxide (such as aluminum oxide). The gate dielectric layer 66 can comprise a straight outer sidewall that extends through each layer of the alternating stack (32, 42) and contacting a respective vertical stack of transition metal nitride spacers 56. The gate dielectric layer 66 may be deposited by a conformal deposition process such as chemical vapor deposition (CVD). The thickness of the gate dielectric layer 66 may be in a range from 1 nm to 6 nm, such as from 2 nm to 4 nm, although lesser and greater thicknesses can also be employed. An anisotropic etch process may be performed to remove horizontal portions of the gate dielectric layer 66, and to physically expose a top surface of the semiconductor material layer 10 at the bottom of each memory opening 49.

Figure 5G:
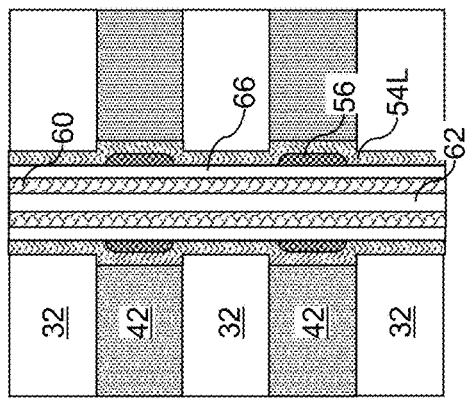

Referring to FIG. 5G, a vertical semiconductor channel 60 may be formed by conformal deposition of a semiconductor channel material on the inner sidewall of the gate dielectric layer 66. The vertical semiconductor channel 60 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the vertical semiconductor channel 60 includes polysilicon or amorphous silicon that is subsequently crystallized into polysilicon by annealing. A vertical semiconductor channel 60 is formed directly on a respective set of transition metal nitride spacers 56 in each of the memory openings 49.

The vertical semiconductor channel 60 may be formed by a conformal deposition method such as low pressure chemical vapor deposition (LPCVD). The vertical semiconductor channel 60 can include electrical dopants of a first conductivity type, which may be p-type or n-type. The atomic concentration of dopants of the first conductivity type in the vertical semiconductor channel 60 may be in a range from $1.0 \times 10^{14}/cm^3$ to $3.0 \times 10^{17}/cm^3$, although lesser and greater dopant concentrations can also be employed. The thickness of the vertical semiconductor channel 60 may be in a range from 2 nm to 10 nm, although lesser and greater thicknesses can also be employed.

A bottom end of the vertical semiconductor channel 60 may be electrically connected to, and may directly contact, the semiconductor material layer 10 within the substrate (9, 10). An optional memory cavity may be present in the volume of each memory opening 49 that is not filled with the vertical semiconductor channel 60. The gate dielectric layer 66 can include a straight inner sidewall that extends through each layer of the alternating stack (32, 42) and contacting the vertical semiconductor channel 60. The gate dielectric layer 66 laterally surrounds the vertical semiconductor channel 60, and is laterally surrounded by a vertical stack of transition metal nitride spacers 56.

Figure 5H:
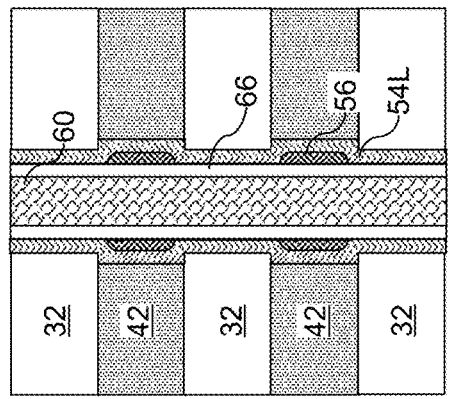
Figure 6:
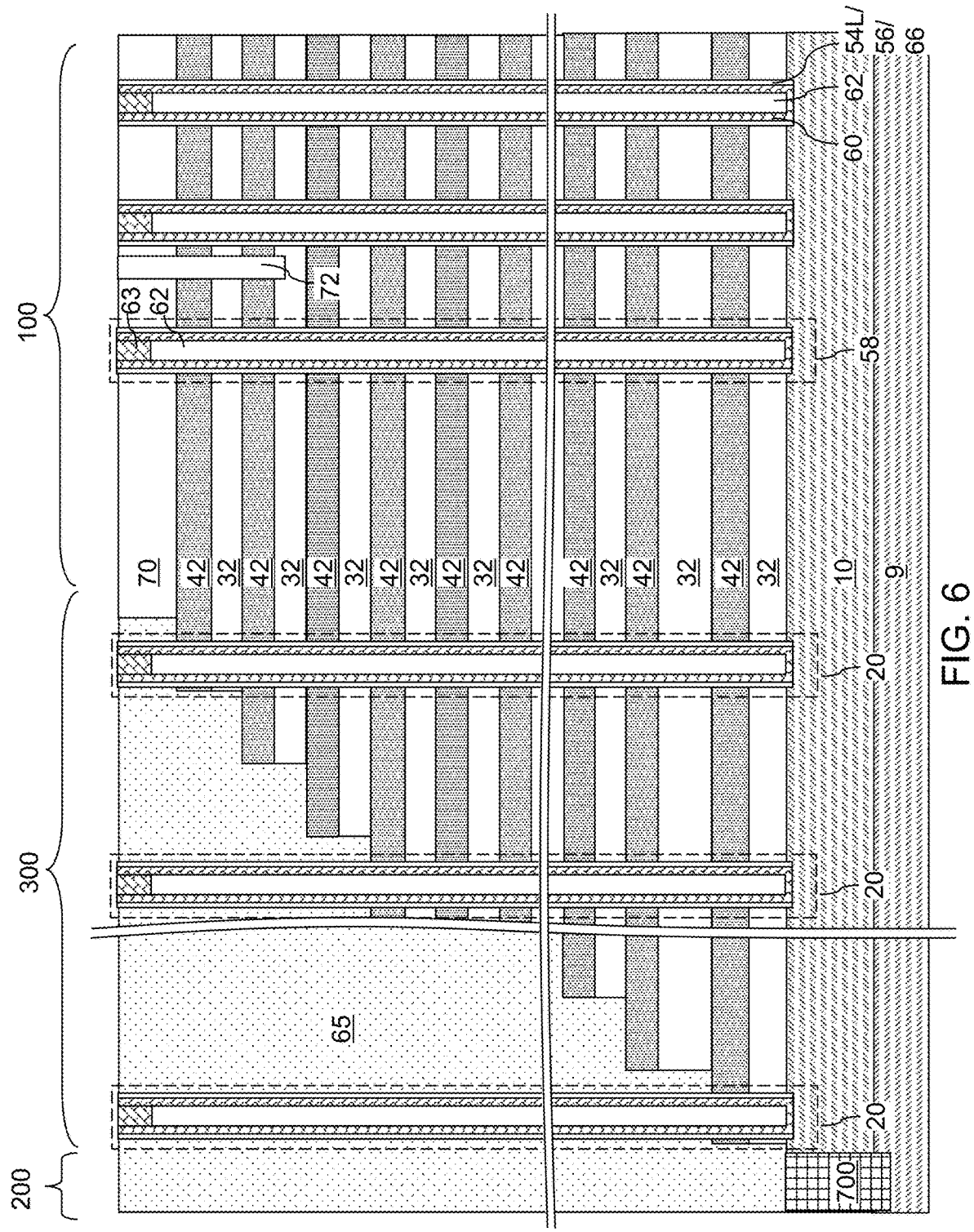
FIG. 6 is a schematic vertical cross-sectional view of the exemplary structure after formation of memory stack structures and support pillar structures according to an embodiment of the present disclosure.

Referring to FIGS. 5H and 6, a dielectric material such as silicon oxide may be deposited in the memory cavity to form a dielectric core 62. A drain region 63 may be formed by vertically recessing the dielectric core to form a cavity at the level of the insulating cap layer 70, and by filling the cavity with a doped semiconductor material including dopants of a second conductivity type. The second conductivity type is the opposite of the first conductivity type. The atomic concentration of dopants of the second conductivity in the drain regions may be in a range from $5.0 \times 10^{19}/cm^3$ to $2.0 \times 10^{21}/cm^3$, although lesser and greater thicknesses can also be employed.

The set of all material portions that fills a memory opening 49 constitutes a memory opening fill structure 58. The set of all material portions that fills a support opening 19 constitutes a support pillar structure 20. Each of the memory opening fill structures 58 and each of the support pillar structures 20 can comprise a continuous amorphous dielectric material layer 54L, a vertical stack of transition metal nitride spacers 56, an optional gate dielectric layer 66, a vertical semiconductor channel 60, an optional dielectric core 62, and a drain region 63. The drain region 63 may be connected to a top end of the vertical semiconductor channel 60.

Figure 5I:
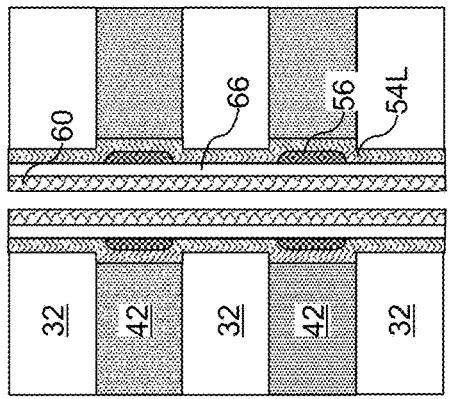
FIGS. 5I and 5J are vertical cross-sectional views of alternative configurations of the first exemplary memory opening fill structures according to the first embodiment of the present disclosure.
Figure 5J:
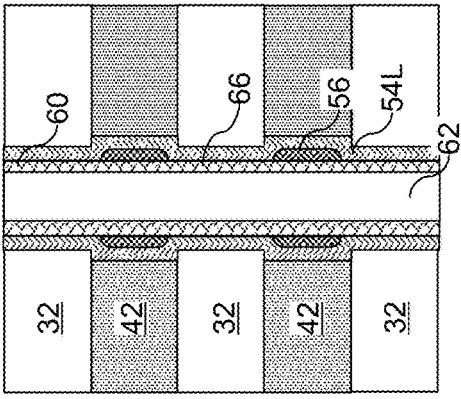

Referring to FIG. 5I, an alternative configuration of the first exemplary structure is illustrated, which may be derived from the exemplary structure illustrated in FIG. 5H by omitting formation of the gate dielectric layer 66. Referring to FIG. 5J, another alternative configuration of the first exemplary structure is illustrated, which may be derived from the exemplary structure illustrated in FIG. 5H by omitting formation of the dielectric core 62. In this configuration, the vertical semiconductor channel fills the entire central axial portion of the memory opening. The gate dielectric layer 66 may be present in the structure of FIG. 5J or may be omitted similar to the structure of FIG. 5I.

Figure 7A:
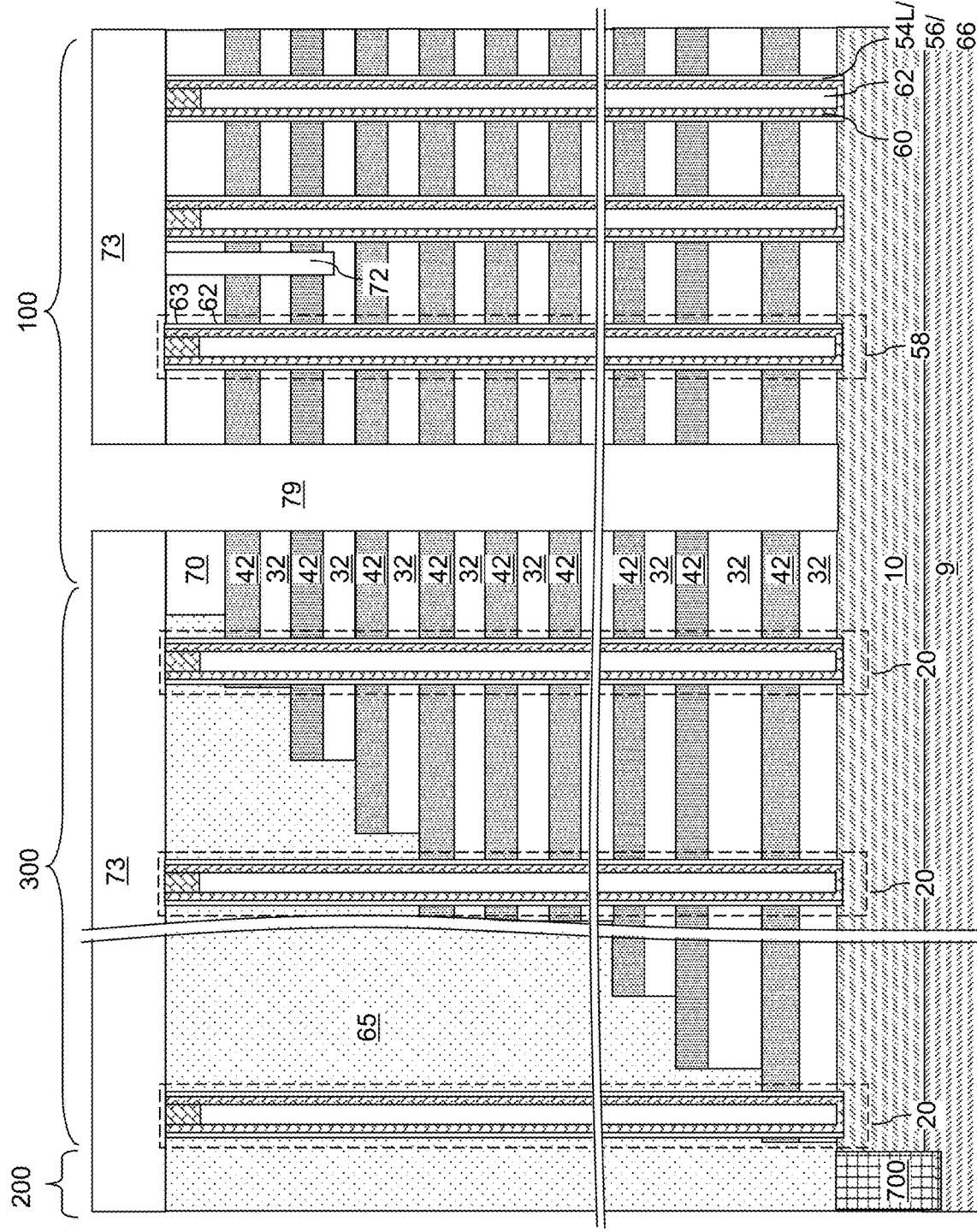
FIG. 7A is a schematic vertical cross-sectional view of the exemplary structure after formation of backside trenches according to an embodiment of the present disclosure.
Figure 7B:
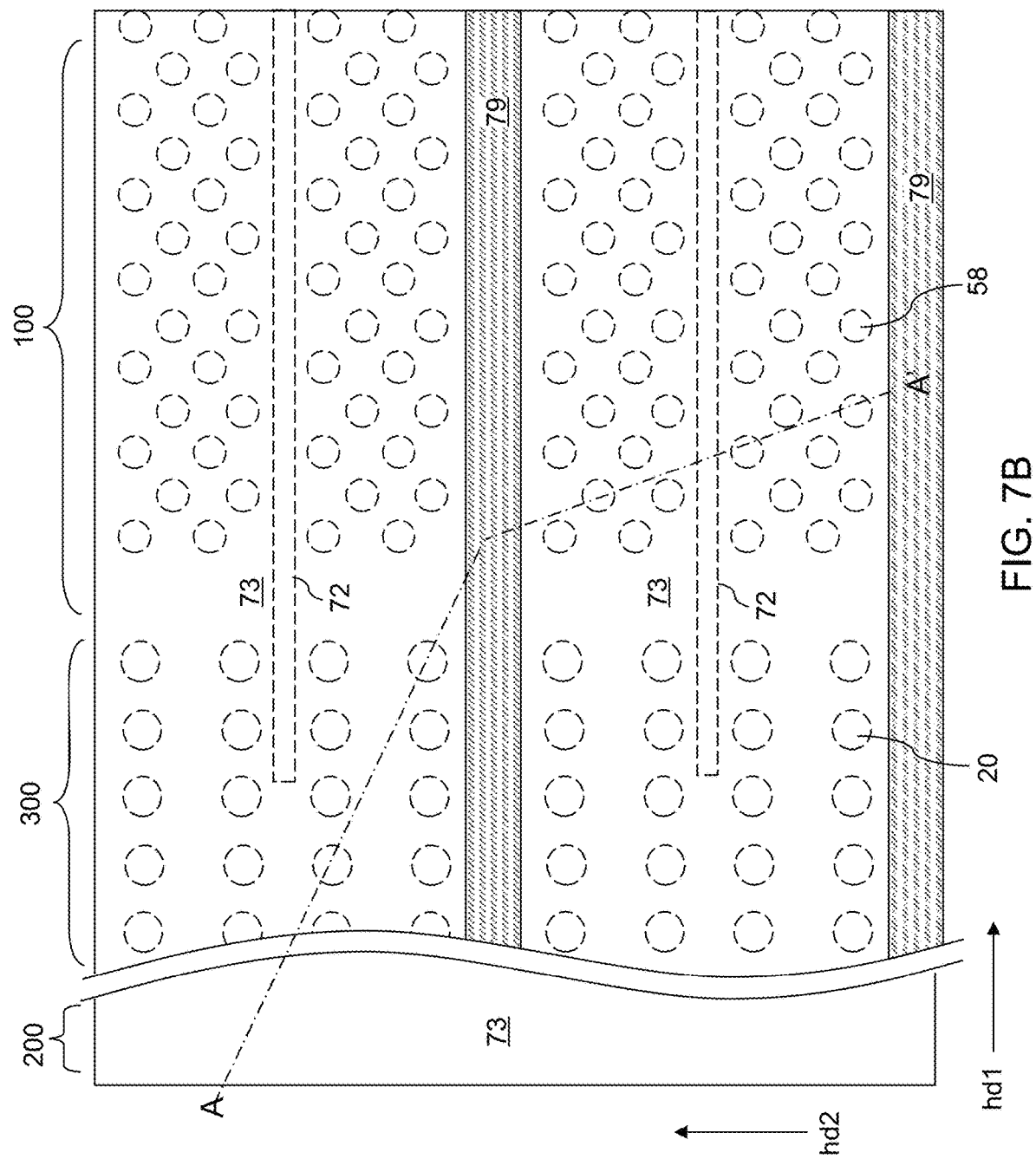
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 may be formed over the alternating stack (32, 42) of insulating layer 32 and sacrificial material layers 42, and over the memory opening fill structures 58 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) may be applied over the contact level dielectric layer 73, and is lithographically patterned to form openings in areas between clusters of memory opening fill structures 58. The pattern in the photoresist layer may be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and may be laterally spaced apart from each other along a second horizontal direction hd2 that is perpendicular to the first horizontal direction hd1. The memory opening fill structures 58 may be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 may be located between a neighboring pair of a backside trench 79 and a drain select level isolation structure 72, or between a neighboring pair of drain select level isolation structures 72. In one embodiment, the backside trenches 79 can include a source contact opening in which a source contact via structure may be subsequently formed. The photoresist layer may be removed, for example, by ashing.

Figure 8:
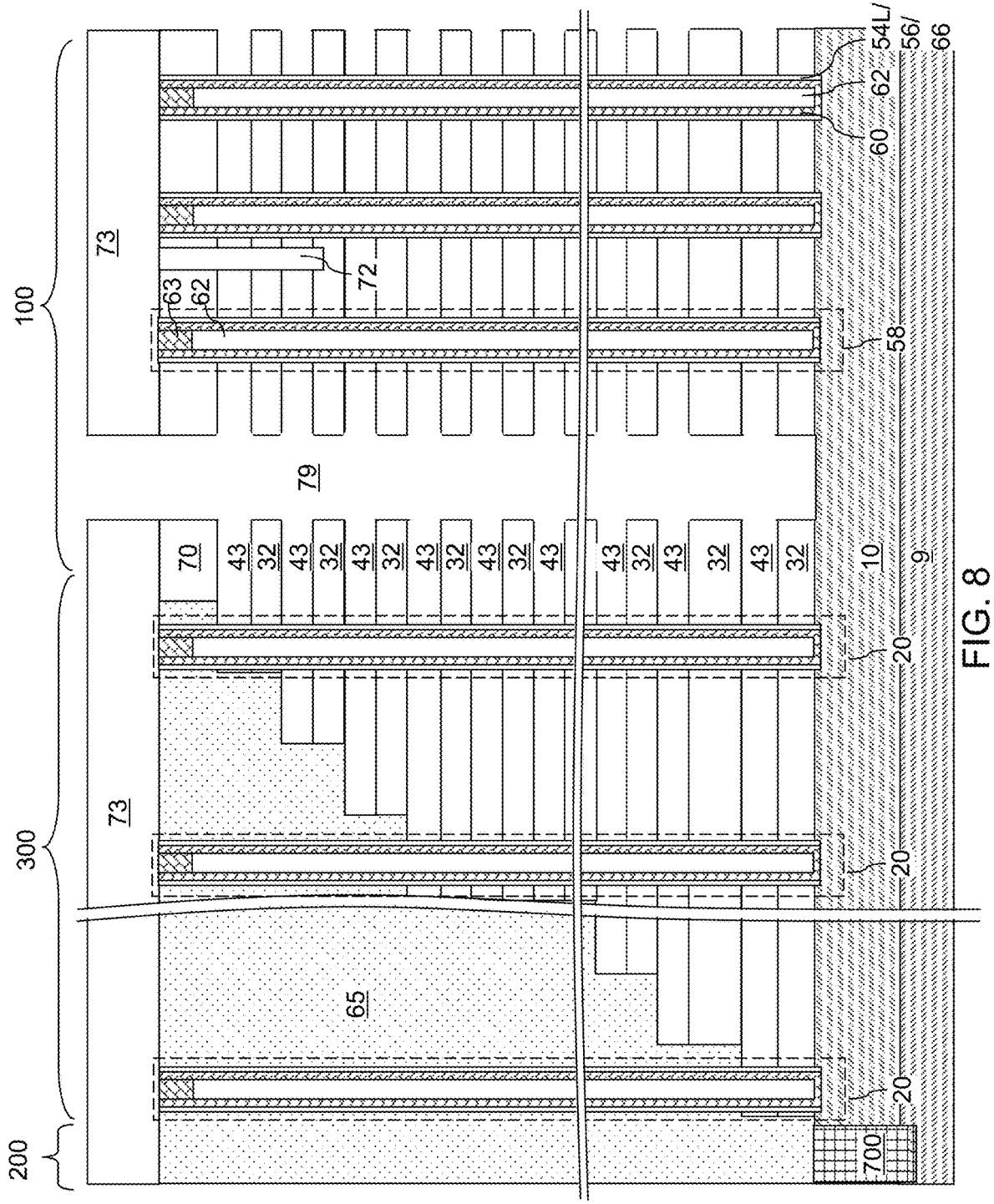
FIG. 8 is a schematic vertical cross-sectional view of the exemplary structure after formation of backside recesses according to an embodiment of the present disclosure.
Figure 9B:
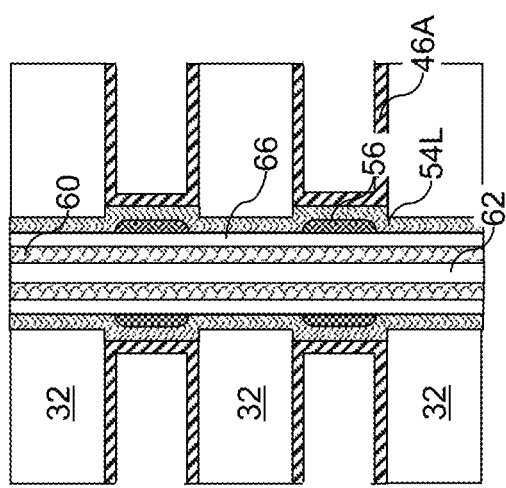
FIGS. 9A-9D are sequential vertical cross-sectional views of a memory opening during formation of a first exemplary memory opening fill structure according to the first embodiment of the present disclosure.
Figure 9A:
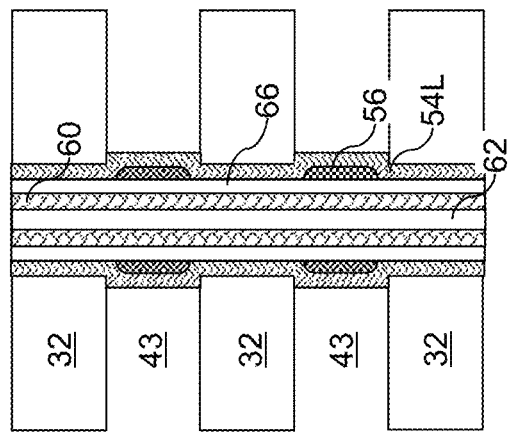

Referring to FIGS. 8 and 9A, an etchant that selectively etches the second material of the sacrificial material layers 42 with respect to the first material of the insulating layers 32 may be introduced into the backside trenches 79, for example, employing an etch process. Backside recesses 43 are formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the continuous amorphous dielectric material layer 54L. In one embodiment, the sacrificial material layers 42 can include silicon nitride, and the materials of the insulating layers 32 and the retro-stepped dielectric material portion 65 may be selected from silicon oxide and dielectric metal oxides.

The etch process that removes the second material selective to the first material and the continuous amorphous dielectric material layer 54L may be a wet etch process employing a wet etch solution, or may be a gas phase (dry) etch process in which the etchant is introduced in a vapor phase into the backside trenches 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory opening fill structures 58 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 can have a uniform height throughout.

Referring to FIG. 9B, a transition metal nitride liner 46A may be deposited in the backside recesses 43 on the physically exposed surfaces of the continuous amorphous dielectric material layer 54L. The transition metal nitride liner 46A can include, and/or can consist essentially of, a conductive nitride material of at least one transition metal element. In one embodiment, the transition metal nitride liner 46A can include, and/or can consist essentially of, TiN and/or TaN. The transition metal nitride liner 46A may be deposited by a conformal deposition process such as a chemical vapor deposition process. The transition metal nitride liner 46A can have a thickness in a range from 2 nm to 40 nm, such as from 4 nm to 15 nm, although lesser and greater thicknesses can also be employed.

Figure 9C:
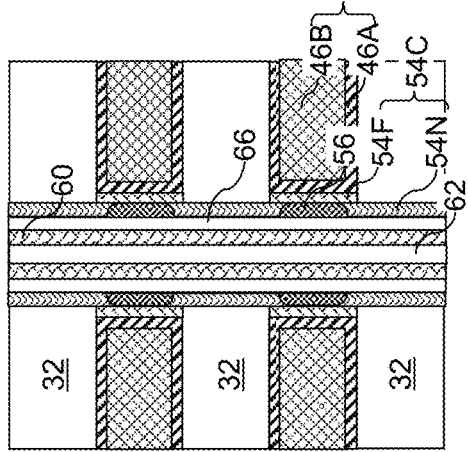

Referring to FIG. 9C, a crystallization anneal process is performed to convert the continuous amorphous dielectric material layer 54L into crystallized material portions. While the crystallization anneal may be conducted at an earlier process step, such as after deposition of the continuous amorphous dielectric material layer 54L, in a preferred embodiment, the crystallization anneal is conducted after both sides of the continuous amorphous dielectric material layer 54L are in contact with a metal nitride material, such as when the continuous amorphous dielectric material layer 54L contacts both the transition metal nitride spacer 56 and the transition metal nitride liner 46A. As discussed above, the continuous amorphous dielectric material layer 54L can include, and/or can consist essentially of, an amorphous dielectric material capable of transitioning into a ferroelectric phase after crystallization. The temperature and the duration of the anneal process is selected such that the amorphous dielectric material portions located between, and preferably contacting, each neighboring pair of a transition metal nitride spacer 56 and a vertically-extending portion of the transition metal nitride liner 46A are converted into discrete ferroelectric material portions 54F which have a predominant ferroelectric crystalline phase, while the remaining non-ferroelectric dielectric material portions 54N of the continuous amorphous dielectric material layer 54L have a predominant non-ferroelectric phase.

In one embodiment, the ferroelectric material portions 54F comprise hafnium oxide, which is preferably doped with at least one dopant selected from Al, Si, Gd, La, Y, Sr or Zr, and have a predominant non-centrosymmetric orthorhombic phase, such that at least 50 volume percent, such as 70 to 100 volume percent of the ferroelectric material portions 54F comprise the non-centrosymmetric orthorhombic phase, and contain less than 50 volume percent, such as 0 to 30 volume percent of amorphous, monoclinic, cubic and tetragonal phases. In contrast, the non-ferroelectric dielectric material portions 54N comprise hafnium oxide, which is preferably doped with at least one dopant selected from Al, Si, Gd, La, Y, Sr or Zr, and have a predominant non-ferroelectric phase or phases, such as amorphous, monoclinic, cubic and/or tetragonal phase or phases, such that at least 50 volume percent, such as 70 to 100 volume percent of the non-ferroelectric dielectric material portions 54N comprise amorphous, monoclinic, cubic and/or tetragonal phases or phases, and comprise less than 50 volume percent, such as 0 to 30 volume percent of the orthorhombic phase.

In one embodiment, the crystallization anneal process may be conducted at a temperature from 400 degrees Celsius to 1000 degrees Celsius, such as from 725 degrees Celsius to 800 degrees Celsius, for 1 second to 20 minutes, such as 1 second to 10 minutes. In one embodiment, the anneal may be a rapid thermal anneal having a duration of 20 to 60 seconds and a temperature from 725 degrees Celsius to 800 degrees Celsius. Without wishing to be bound by a particular theory, it is believed that amorphous hafnium oxide, which is preferably doped with at least one dopant selected from Al, Si, Gd, La, Y, Sr or Zr, that physically contacts the transition metal nitride, such as TiN and/or TaN of the transition metal nitride spacers 56 and liner 46A, is crystallized predominantly into the ferroelectric non-centrosymmetric orthorhombic phase. In contrast, it is believed that the amorphous hafnium oxide, which is preferably doped with at least one dopant selected from Al, Si, Gd, La, Y, Sr or Zr, that does not physically contact the transition metal nitride, such as TiN and/or TaN of the transition metal nitride spacers 56 and liner 46A, either remains predominantly amorphous or crystallizes predominantly into one or more of the non-ferroelectric crystalline phases (e.g., monoclinic, cubic and/or tetragonal phase).

Therefore, portions or segments of the continuous amorphous dielectric material layer 54L located between neighboring pairs of a transition metal nitride spacer 56 and a vertically-extending portion of the transition metal nitride liner 46A are crystallized into the ferroelectric material portions 54F, while the remaining portions or segments of the continuous amorphous dielectric material layer 54L that do not contact neighboring pairs of a transition metal nitride spacer 56 and a vertically-extending portion of the transition metal nitride liner 46A are converted into non-ferroelectric dielectric material portions 54N. Each of the non-ferroelectric dielectric material portions 54N may be located between vertically neighboring pairs of ferroelectric material portions 54F. Each of the ferroelectric material portions 54F may have a tubular shape, and may laterally surround a respective transition metal nitride spacer 56. Each contiguous combination of at least one ferroelectric material portion 54F and at least one non-ferroelectric dielectric material portion 54N constitutes a continuous dielectric material layer 54C. The ferroelectric material portions 54F of the continuous dielectric material layer 54C laterally surround the vertical stack of transition metal nitride spacers 56. The ferroelectric material portions 54F and the non-ferroelectric dielectric material portions 54N can have substantially the same material composition but different phases. For example, if the continuous amorphous dielectric material layer 54L include amorphous, silicon doped hafnium oxide, the ferroelectric material portions 54F can include polycrystalline, silicon doped hafnium oxide in a predominant non-centrosymmetric orthorhombic phase, and the non-ferroelectric dielectric material portions 54N can include polycrystalline, silicon doped hafnium oxide in a predominant non-orthorhombic phase, such as a cubic phase, a tetragonal phase, and/or a monoclinic phase.

Figure 9D:
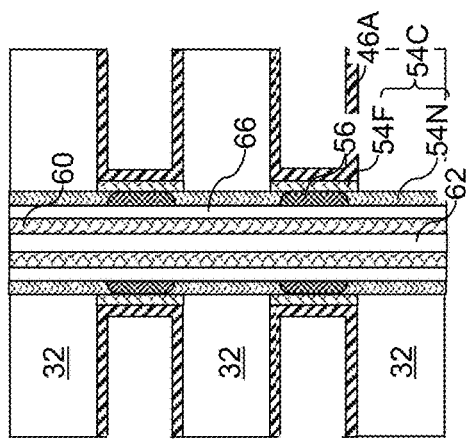
Figure 10:
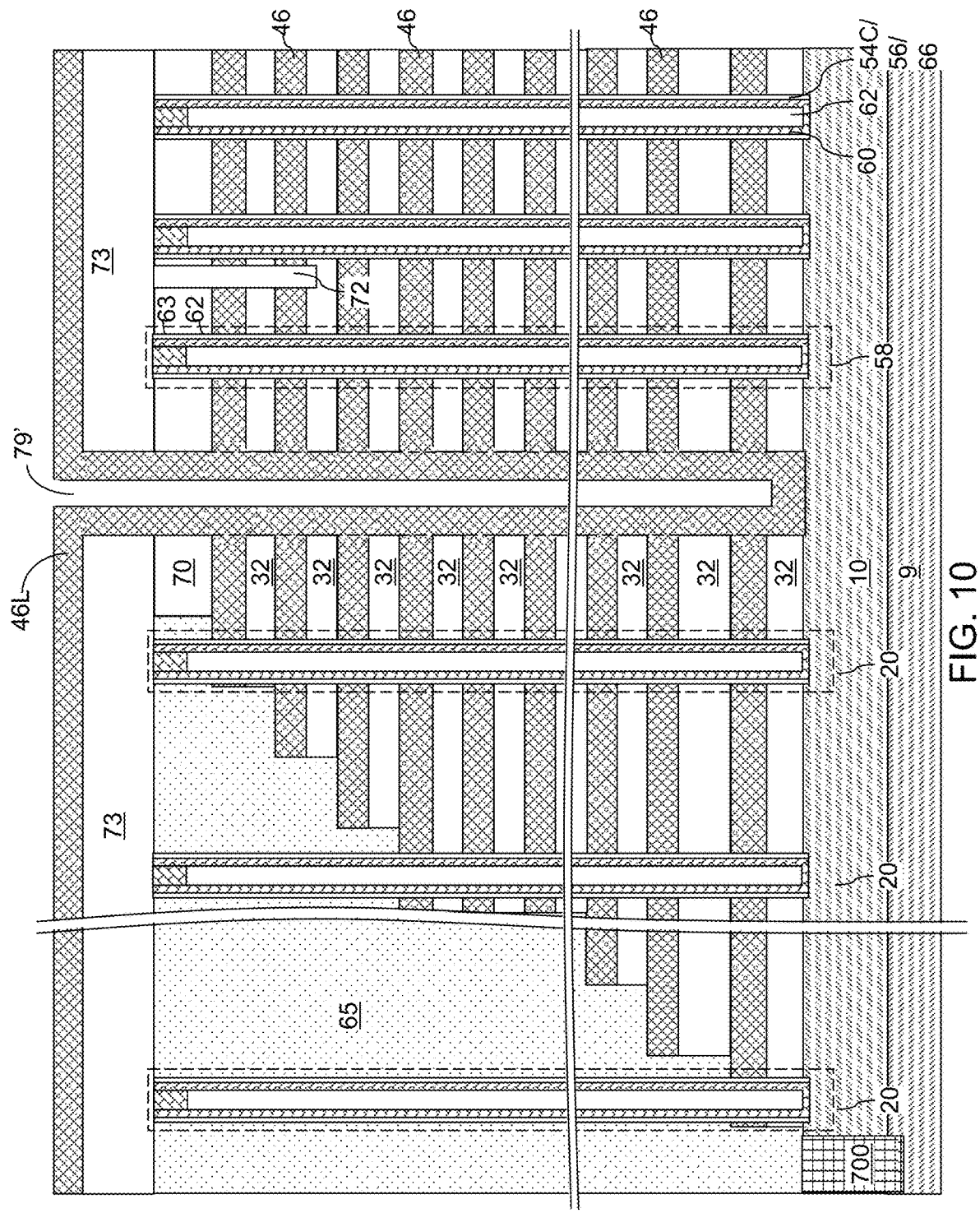
FIG. 10 is a schematic vertical cross-sectional view of the exemplary structure at the processing step of FIG. 9D, FIG. 9E or FIG. 9F.

Referring to FIGS. 9D and 10, a metal fill material is deposited in remaining volumes of the plurality of backside recesses 43, on the sidewalls of the at least one the backside trench 79, and over the top surface of the contact level dielectric layer 73 to form a conductive fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the conductive fill material layer 46B can consist essentially of at least one elemental metal. The at least one elemental metal of the conductive fill material layer 46B may be selected, for example, from tungsten, cobalt, ruthenium, titanium, and tantalum. In one embodiment, the conductive fill material layer 46B can consist essentially of a single elemental metal. In one embodiment, the conductive fill material layer 46B may be deposited employing a fluorine-containing precursor gas such as $WF_6$. In one embodiment, the conductive fill material layer 46B may be a tungsten layer including a residual level of fluorine atoms as impurities. The conductive fill material layer 46B is spaced from the insulating layers 32 and the memory opening fill structures 58 by the transition metal nitride liner 46A.

Each portion of the transition metal nitride liner 46A and the conductive fill material layer 46B that is located within a backside recess 43 constitutes an electrically conductive layer 46. Generally, the continuous dielectric material layer 54C comprises a vertical stack of ferroelectric material portions 54F located at levels of the electrically conductive layers 46 and a vertical stack of non-ferroelectric dielectric material portions 54N located at levels of the insulating layers 32, having substantially the same material composition as the vertical stack of ferroelectric material portions 54F, and being in a non-ferroelectric phase. A plurality of electrically conductive layers 46 may be formed in the plurality of backside recesses 43, and a continuous electrically conductive layer 46L may be formed on the sidewalls of each backside trench 79 and over the contact level dielectric layer 73. Each electrically conductive layer 46 includes a portion of the transition metal nitride liner 46A and a portion of the conductive fill material layer 46B that are located between a vertically neighboring pair of dielectric material layers such as a pair of insulating layers 32. The continuous electrically conductive layer 46L includes a continuous portion of the transition metal nitride liner 46A and a continuous portion of the conductive fill material layer 46B that are located in the backside trenches 79 or above the contact level dielectric layer 73. Each sacrificial material layer 42 may be replaced with an electrically conductive layer 46. A backside cavity is present in the portion of each backside trench 79 that is not filled with the continuous dielectric material layer 54C and the continuous electrically conductive layer 46L.

Figure 9E:
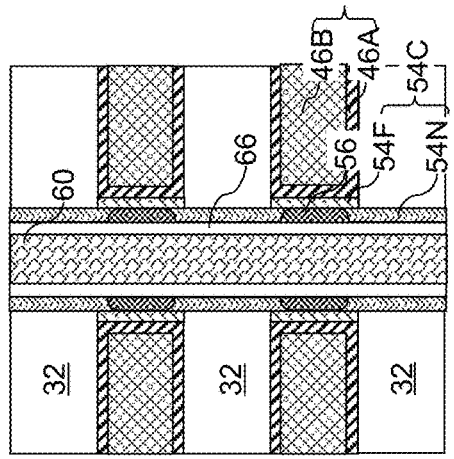
FIGS. 9E and 9F are vertical cross-sectional views of a memory opening after formation of alternative configurations of the first exemplary memory opening fill structure according to the first embodiment of the present disclosure.
Figure 9F:
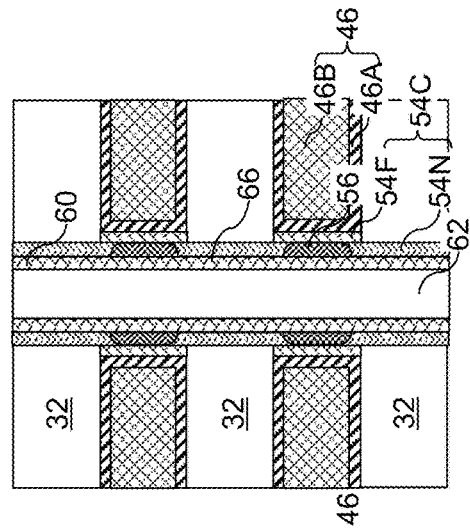

FIG. 9E is an alternative configuration of the exemplary structure of the first embodiment that may be derived from the exemplary structure of the first embodiment illustrated in FIG. 9D by employing the structure of FIG. 5I that lacks the gate dielectric layer 66 instead of the structure illustrated in FIG. 5H. FIG. 9F is another alternative configuration of the exemplary structure of the first embodiment that may be derived from the exemplary structure of the first embodiment illustrated in FIG. 9D by employing the structure of FIG. 5J that lacks the dielectric core 62 instead of the structure illustrated in FIG. 5H.

Figure 11A:
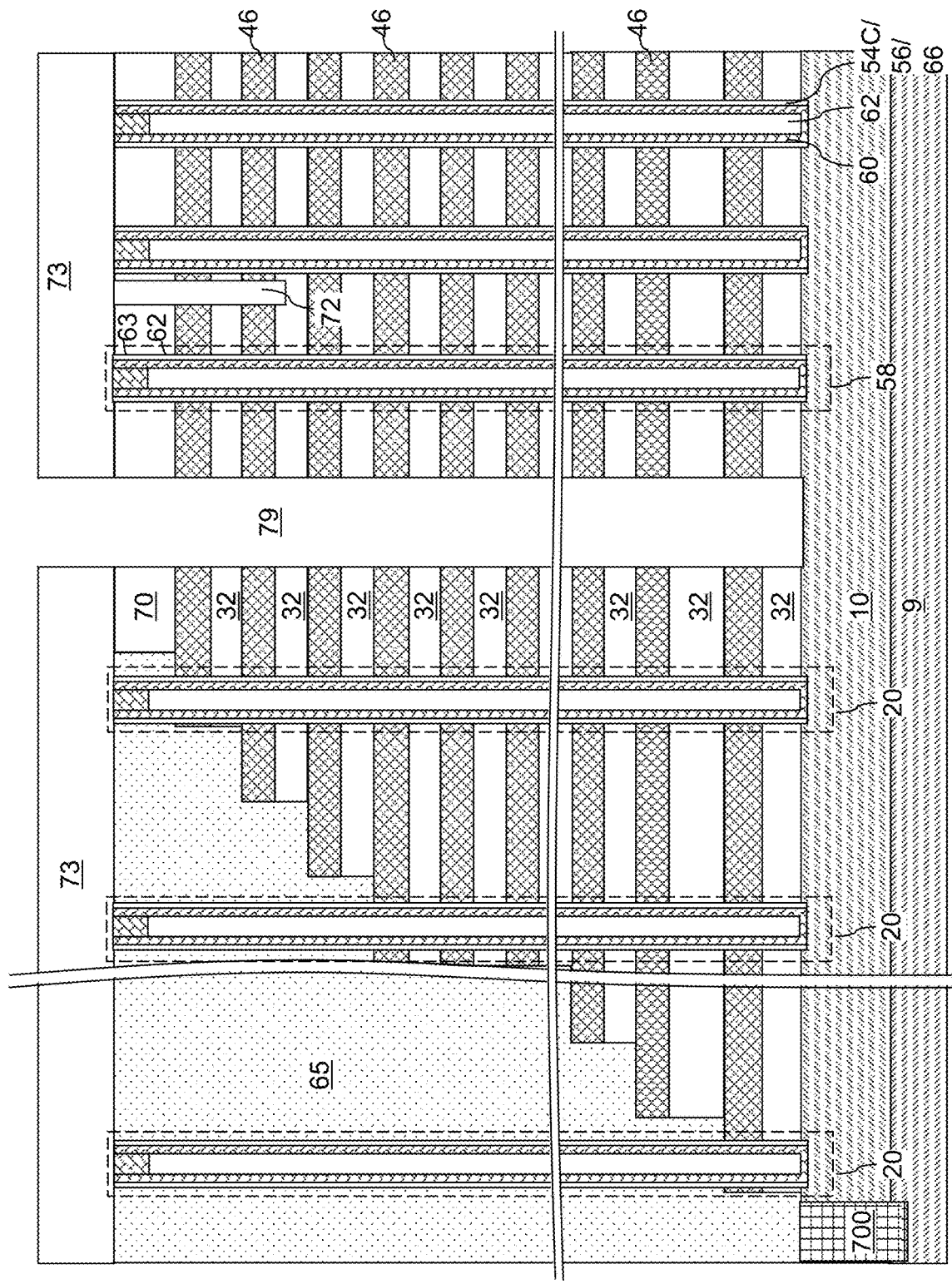
FIG. 11A is a schematic vertical cross-sectional view of the exemplary structure after removal of a deposited conductive material from within the backside trench according to an embodiment of the present disclosure.
Figure 11B:
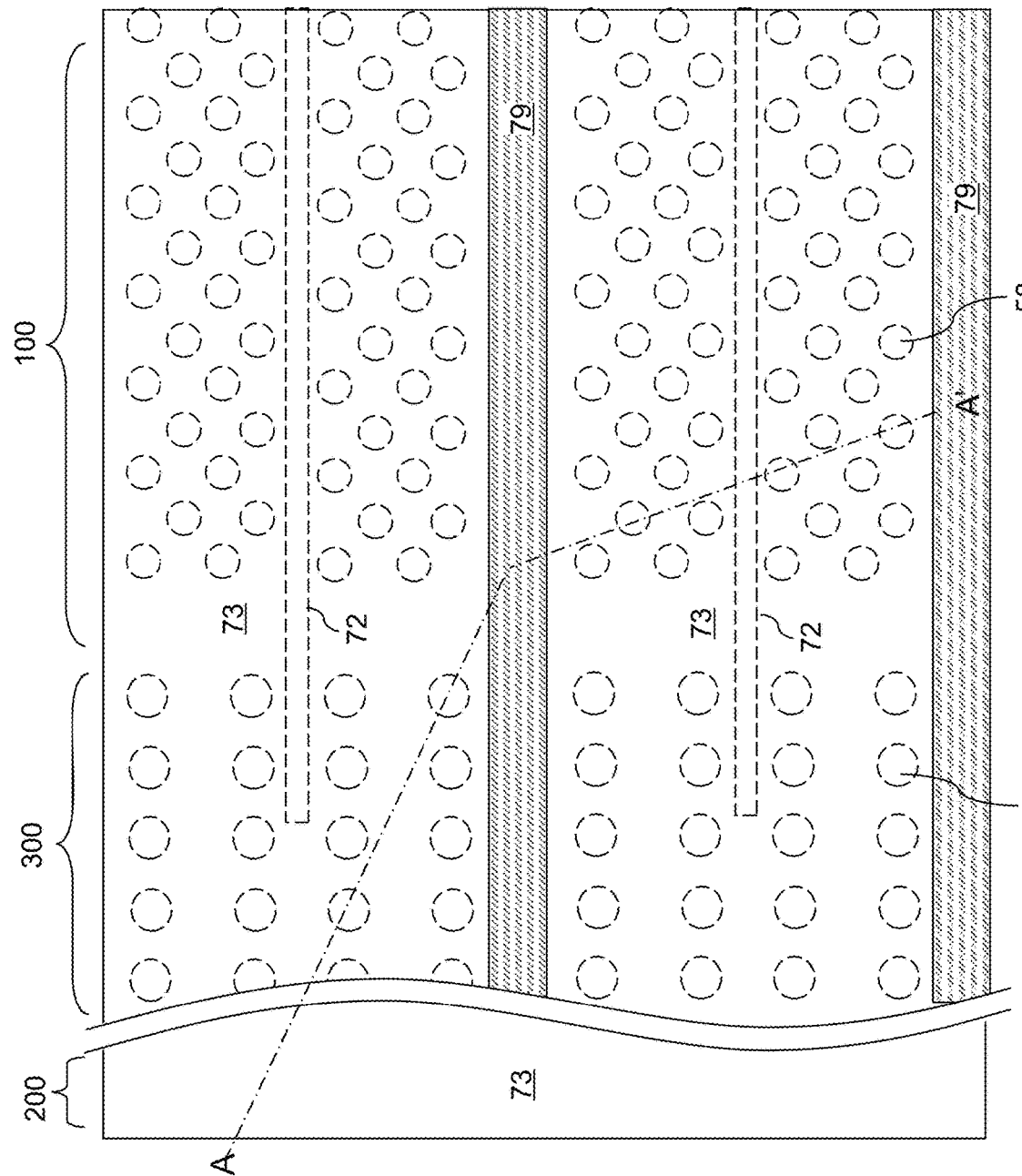
FIG. 11B is a partial see-through top-down view of the exemplary structure of FIG. 11A. The vertical plane A-A' is the plane of the schematic vertical cross-sectional view of FIG. 11A.

Referring to FIGS. 11A and 11B, the deposited metallic material of the continuous electrically conductive layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

The electrically conductive layers 46 are formed in remaining volumes of the backside recesses 43. Each of the electrically conductive layers 46 comprises a transition metal nitride liner 46A and a conductive fill material layer 46B embedded within the transition metal nitride liner 36A.

Each of the electrically conductive material layers 46 may be laterally spaced from each of the vertical stacks of transition metal nitride spacers 56 by a respective ferroelectric material portion 54F. In one embodiment, each of the ferroelectric material portions 54F may be adjoined to a pair of dielectric material portions (i.e., non-ferroelectric dielectric material portions 54N) having a same composition as the ferroelectric material portions 54F and having a non-ferroelectric material phase. In one embodiment, each of the transition metal nitride spacers 56 is spaced from the insulating layers 32 by a respective one of the ferroelectric material portions 54F and/or a dielectric material portion (i.e., non-ferroelectric dielectric material portions 54N) having a same material composition as the ferroelectric material portions 54F and having a non-ferroelectric material phase. In one embodiment, each of the ferroelectric material portions 54F is in contact with a respective one of the transition metal nitride spacers 56, with a respective one of the transition metal nitride liners 46A, with an overlying one of the insulating layers 32, and with a respective one of the underlying insulating layers 32.

Figure 12:
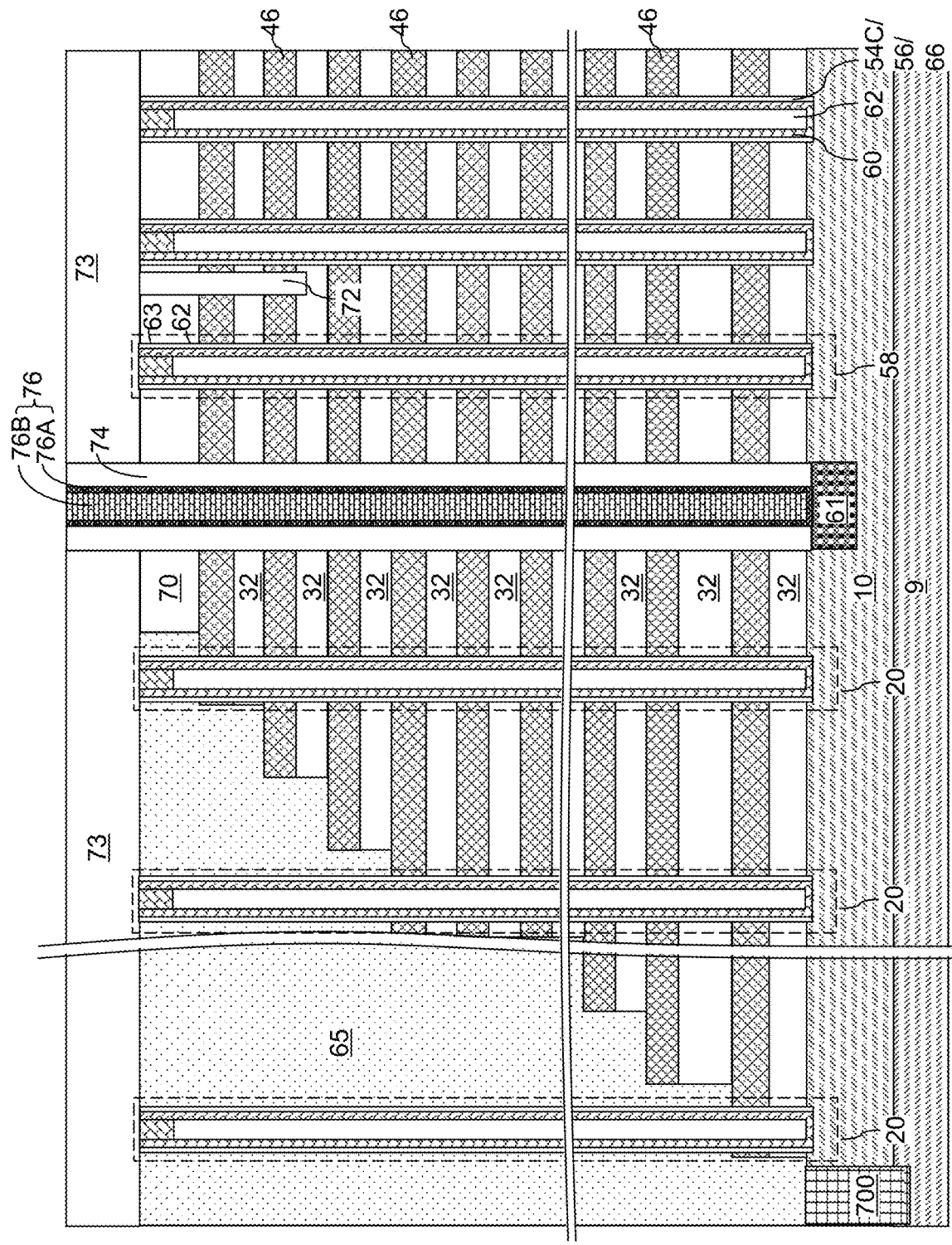
FIG. 12 is a schematic vertical cross-sectional view of the exemplary structure after formation of an insulating spacer and a backside contact structure according to an embodiment of the present disclosure.

Referring to FIG. 12, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses can also be employed.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the vertical semiconductor channels 60 constitutes a horizontal semiconductor channel 59 for a plurality of field effect transistors (e.g., vertical ferroelectric NAND strings). The horizontal semiconductor channel 59 connects the source region 61 to multiple vertical semiconductor channels 60. One or more bottommost electrically conductive layers 46 provided upon formation of the electrically conductive layers 46 within the alternating stack (32, 46) may comprise source select gate electrode(s) for a vertical ferroelectric NAND string. One or more topmost electrically conductive layers 46 provided upon formation of the electrically conductive layers 46 within the alternating stack (32, 46) may comprise drain select gate electrode(s) for the vertical ferroelectric NAND string. The electrically conductive layers 46 between the source and the drain select gate electrodes comprise control gates/word lines for the vertical ferroelectric NAND string. Each source region 61 is formed in an upper portion of the substrate (9, 10). Semiconductor channels (59, 60) extend between each source region 61 and a respective set of drain regions 63. The semiconductor channels (59, 60) include the vertical semiconductor channels 60 of the memory opening fill structures 58.

A backside contact via structure 76 may be formed within each backside cavity. Each contact via structure 76 can fill a respective backside cavity 79'. The contact via structures 76 may be formed by depositing at least one conductive material in the remaining unfilled volume (i.e., the backside cavity 79') of the backside trench 79. For example, the at least one conductive material can include a conductive liner 76A and a conductive fill material layer 76B. The conductive liner 76A can include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses can also be employed. The conductive fill material layer 76B can include a metal or a metallic alloy. For example, the conductive fill material layer 76B can include W, Cu, Al, Co, Ru, Ni, an alloy thereof, or a stack thereof.

The at least one conductive material may be planarized employing the contact level dielectric layer 73 overlying the alternating stack (32, 46) as a stopping layer. If chemical mechanical planarization (CMP) process is employed, the contact level dielectric layer 73 may be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Figure 13A:
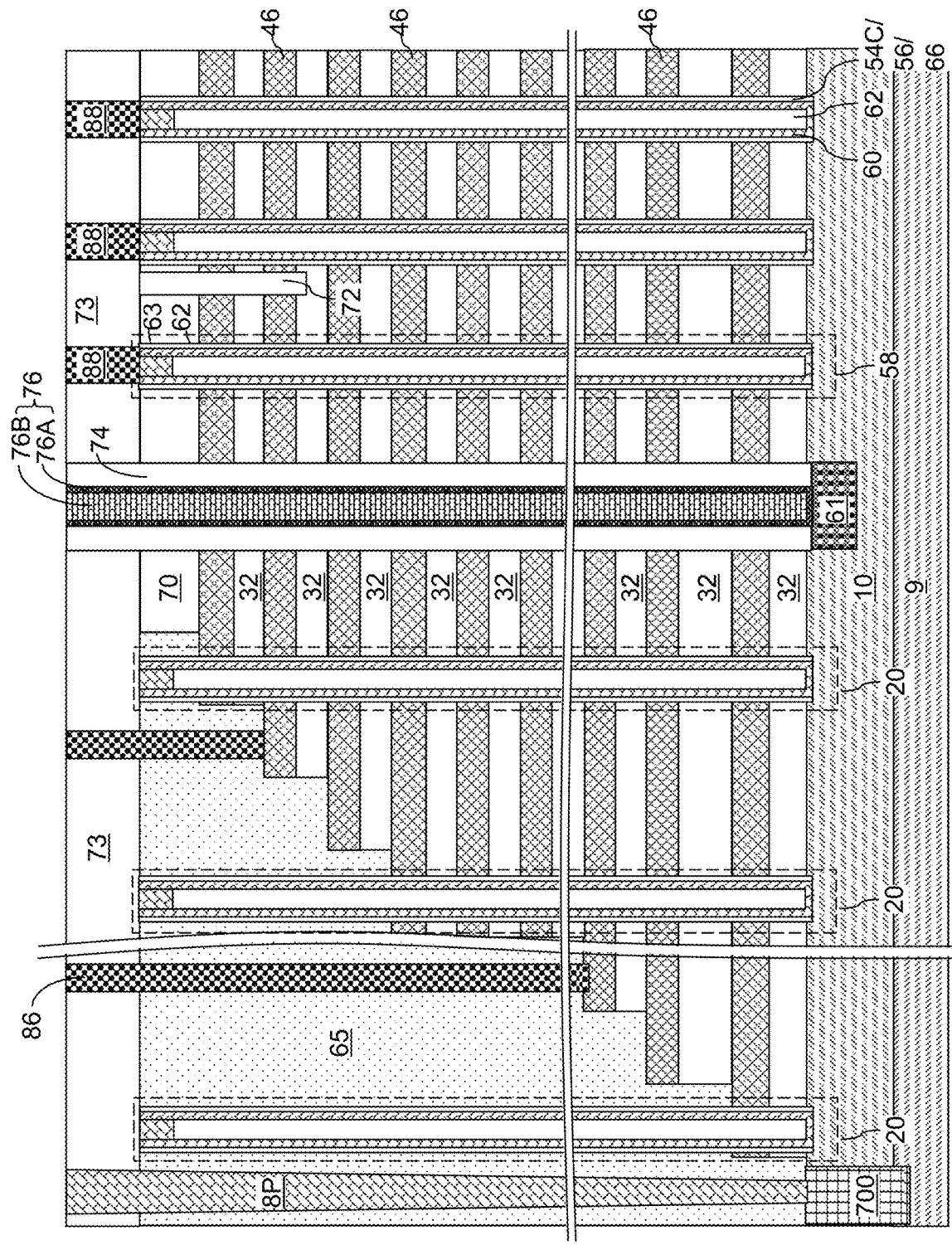
FIG. 13A is a schematic vertical cross-sectional view of the exemplary structure after formation of additional contact via structures according to an embodiment of the present disclosure.
Figure 13B:
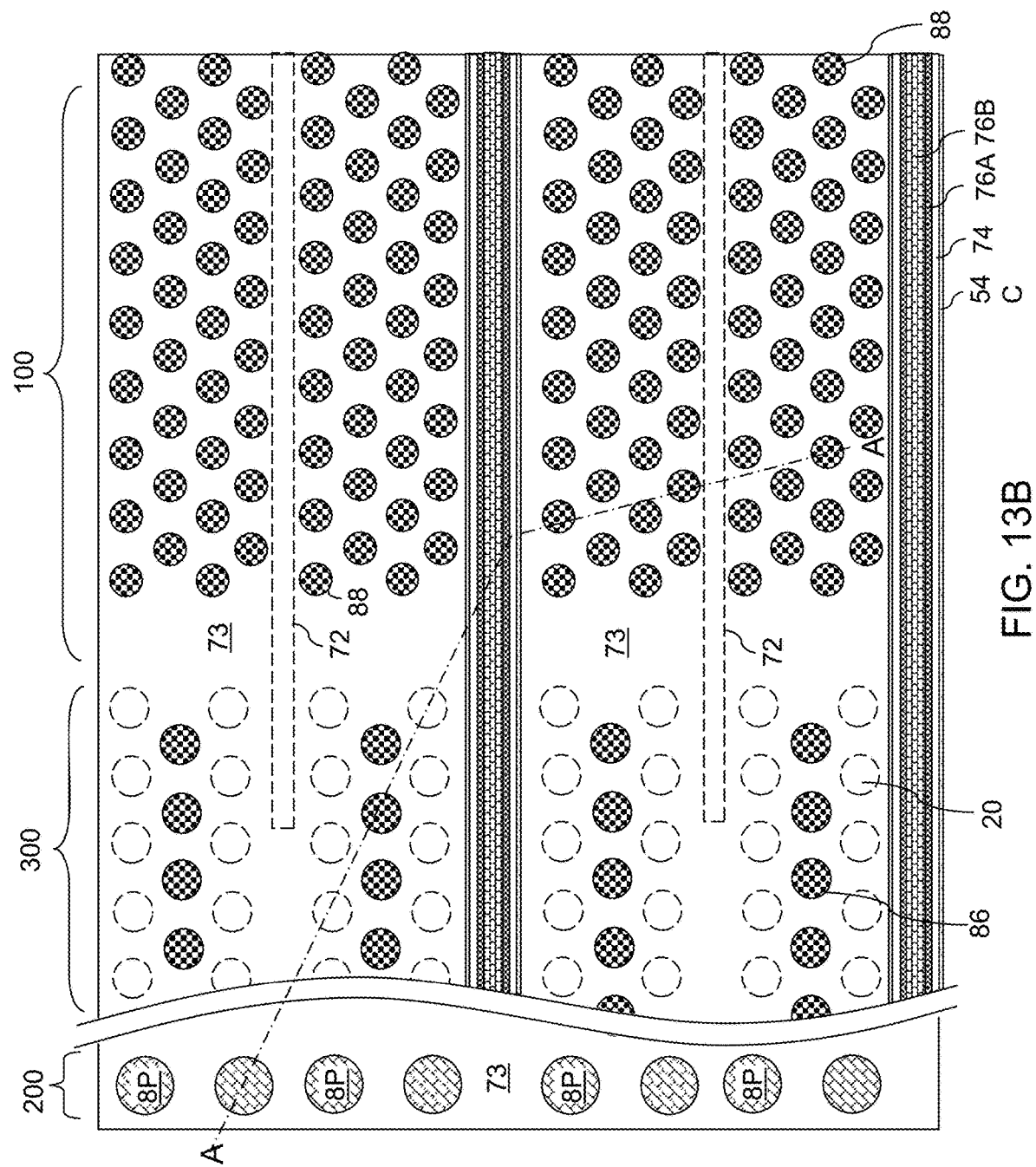
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) may be formed through the contact level dielectric layer 73, and optionally through the retro-stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the retro-stepped dielectric material portion 65. Peripheral device contact via structures 8P may be formed through the retro-stepped dielectric material portion 65 directly on respective nodes of the peripheral devices. In one alternative embodiment, the peripheral devices may be formed on a separate substrate and then bonded to the memory devices. In that case, the peripheral device contact via structures 8P may be omitted. In another alternative embodiment, the peripheral devices may be formed underneath the alternating stack (32, 46). In that case, a horizontal source line may be provided in contact with a side of the vertical semiconductor channels 60 and the peripheral device contact via structures 8P may extend through the alternating stack (32, 46).

FIGS. 14A-14H are sequential schematic vertical cross-sectional views of a memory opening 49 within the exemplary structure during formation of a second exemplary memory opening fill structure according to a second embodiment of the present disclosure.

Referring to FIG. 14A, a memory opening 49 is shown at the processing step of FIG. 5A.

Referring to FIG. 14B, the lateral annular recesses 45 may be formed by isotropically recess the sacrificial material layers 42 relative to the insulating layers 32 around each memory opening 49, using the processing steps of FIG. 5B.

Referring to FIG. 14C, the continuous amorphous dielectric material layer 54L may be formed by performing the processing steps of FIG. 5C. The continuous amorphous dielectric material layer 54L can have the same thickness and the same material composition as in the structure of FIG. 5C.

Referring to FIG. 14D, a continuous transition metal nitride layer 56L may be formed on the inner sidewall of the continuous amorphous dielectric material layer 54L. The continuous transition metal nitride layer 56L can have the same thickness and the same material composition as in the structure of FIG. 5D.

Referring to FIG. 14E, an anisotropic etch process may be performed to remove portions of the continuous transition metal nitride layer 56L and the continuous amorphous dielectric material layer 54L that are located in the lateral annular recesses 45 and are not masked by an overlying portion of a respective insulating layer 32. Portions of the continuous transition metal nitride layer 56L and the continuous amorphous dielectric material layer 54L that are located within a cylindrical volume bounded by the sidewalls of the insulating layers 32 may be removed by the anisotropic etch process.

A combination of an amorphous dielectric material portion 54A and a transition metal nitride spacer 56 is formed within each of the lateral annular recesses 45. Each amorphous dielectric material portion 54A is a remaining portion of the continuous amorphous dielectric material layer 54L. Each transition metal nitride spacer 56 is a remaining portion of the continuous transition metal nitride layer 56L. As such, the amorphous dielectric material portions 54A comprise an amorphous dielectric material capable of transitioning into a ferroelectric phase under crystallization. In one embodiment, each the amorphous dielectric material portions 54A is formed entirely within a volume of a respective one of the lateral annular recesses 45, and a vertical stack of transition metal nitride spacers 56 is formed on each amorphous dielectric material portion 54A at levels of the sacrificial material layers 42 within the volume of the respective one of the lateral annular recesses 45.

Referring to FIG. 14F, the processing steps of FIG. 5F may be performed to form the optional gate dielectric layer 66. The gate dielectric layer 66 can have the same thickness and the same material composition as in the structure of FIG. 5F. An anisotropic etch process may be performed to remove horizontal portions of the gate dielectric layer 66, and to physically expose a top surface of the semiconductor material layer 10 at the bottom of each memory opening 49.

Referring to FIG. 14G, the processing steps of FIG. 5G may be performed to form the vertical semiconductor channel 60 on an inner sidewall of the gate dielectric layer 66. The vertical semiconductor channel 60 can have the same thickness and the same material composition as in the structure of FIG. 5G.

Referring to FIG. 14H, the processing steps of FIGS. 5H and 6 may be performed to form the optional dielectric core 62 and a drain region (not shown) in each memory opening.

Referring to FIG. 14I, an alternative configuration of the structure of FIG. 14H is illustrated, which may be derived from the structure of FIG. 14H by omitting formation of the gate dielectric layer 66.

Subsequently, the processing steps of FIGS. 7A and 7B, 8, and 9A may be performed to provide the structure illustrated in FIG. 15A.

Figure 15B:
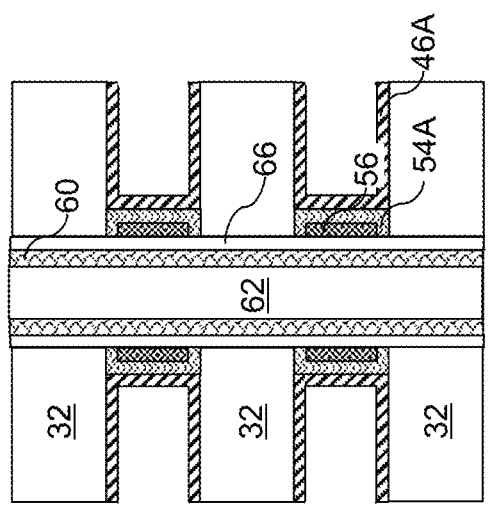
Figure 15A:
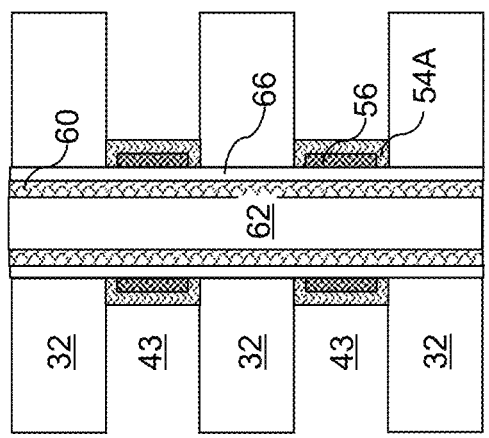

Referring to FIG. 15B, the processing steps of FIG. 9B may be performed to form a transition metal nitride liner 46A in the backside recesses 43 on the physically exposed surfaces of the amorphous dielectric material portions 54A.

Referring to FIG. 15C, the processing steps of FIG. 9C may be performed to convert the amorphous dielectric material portions 54A into the ferroelectric material portions 54F. The amorphous dielectric material portions 54A are located between neighboring pairs of a transition metal nitride spacer 56 and a vertically-extending portion of the transition metal nitride liner 46A. As such, each amorphous dielectric material portion 54A may be converted into the ferroelectric material portion 54F.

Referring to FIG. 15D, the processing steps of FIGS. 9D and 10 may be performed to deposit the metal fill material in remaining volumes of the plurality of backside recesses 43, on the sidewalls of the at least one the backside trench 79, and over the top surface of the contact level dielectric layer 73 to form the conductive fill material layer 46B. The electrically conductive layer 46 may be formed within each backside recess 43.

Referring to FIG. 15E, an alternative configuration of the structure of FIG. 15D is illustrated, which may be derived from the structure illustrated in FIG. 15D by employing the structure of FIG. 14I that lacks the gate dielectric layer 66 instead of the structure of FIG. 14H.

Subsequently, the processing steps of FIGS. 11A and 11B, 12, 13A and 13B may be performed.

In the structures illustrated in FIGS. 15D and 15E, the ferroelectric material portions 54F comprise vertical stacks of ferroelectric material spacers. The ferroelectric material spacers within each vertical stack of ferroelectric material spacers are vertically spaced apart and have a respective vertical extent that is not greater than, and may be the same as, a vertical spacing between a vertically neighboring pair of insulating layers 32 that include a respective overlying insulating layer 32 and a respective underlying insulating layer 32. In one embodiment, each of the ferroelectric material portions 54F embeds a respective one of the transition metal nitride spacers 56, and comprises a cylindrical ferroelectric material segment that contacts a respective one of the electrically conductive layers 46, an upper annular ferroelectric material segment that contacts the respective overlying insulating layer 32, and a lower annular segment that contacts the respective underlying insulating layer 32. In one embodiment, an inner sidewall of the upper annular segment and an inner sidewall of the lower annular segment are vertically coincident with an inner sidewall of the respective one of the transition metal nitride spacers 56.

FIGS. 16A-16H are sequential schematic vertical cross-sectional views of a memory opening within the exemplary structure during formation of a third exemplary memory opening fill structure according to a third embodiment of the present disclosure.

Referring to FIG. 16A, a memory opening 49 is shown at the processing step of FIG. 5A.

Referring to FIG. 16B, the lateral annular recesses 45 may be formed by isotropically recess the sacrificial material layers 42 relative to the insulating layers 32 around each memory opening 49, using the processing steps of FIG. 5B. The duration of the isotropic etch process may be longer than during the processing steps of FIG. 5B and may be selected such that a lateral recess distance is in a range from 10 nm to 150 nm, such as from 20 nm to 70 nm, although lesser and greater lateral recess distances can also be employed. Thus, the lateral annular recesses 45 are wider in the third exemplary structure than in the first exemplary structure of FIG. 5B.

Referring to FIG. 16C, the continuous amorphous dielectric material layer 54L may be formed by performing the processing steps of FIG. 5C. The continuous amorphous dielectric material layer 54L can have the same thickness and the same material composition as in the structure of FIG. 5C.

Referring to FIG. 16D, the continuous transition metal nitride layer 56L may be formed on the inner sidewall of the continuous amorphous dielectric material layer 54L. The continuous transition metal nitride layer 56L can have the same thickness and the same material composition as in the structure of FIG. 5D.

Referring to FIG. 16E, the anisotropic etch process of FIG. 5E may be performed to remove portions of the continuous transition metal nitride layer 56L selective to the continuous amorphous dielectric material layer 54L. Thus, portions of the continuous transition metal nitride layer 56L that are not masked by an overlying portion of the continuous amorphous dielectric material layer 54L are removed by the anisotropic etch process. Each remaining portion of the continuous transition metal nitride layer 56L constitutes a transition metal nitride spacer 56. In one embodiment, each transition metal nitride spacer 56 can have a tubular portion, a top annular portion adjoined to an upper end of the tubular portion, and a bottom annular portion adjoined to a lower end of the tubular portion. In this case, a vertical cross-sectional view of each transition metal nitride spacer 56 can have a pair of "C-shaped" portions that face each other. A combination of an amorphous dielectric material portion (which is a portion of the continuous amorphous dielectric material layer 54L) and a transition metal nitride spacer 56 is formed within each of the lateral annular recesses 45. As such, each amorphous dielectric material portion comprises an amorphous dielectric material capable of transitioning into a ferroelectric phase under crystallization. In one embodiment, each the amorphous dielectric material portions is formed within a volume of a respective one of the lateral annular recesses 45, and a vertical stack of transition metal nitride spacers 56 is formed on each amorphous dielectric material portion at levels of the sacrificial material layers 42 within the volume of the respective one of the lateral annular recesses 45.

Referring to FIG. 16F, the processing steps of FIG. 5F may be performed to form the optional gate dielectric layer 66. The gate dielectric layer 66 can have the same thickness and the same material composition as in the structure of FIG. 5F. An anisotropic etch process may be performed to remove horizontal portions of the gate dielectric layer 66, and to physically expose a top surface of the semiconductor material layer 10 at the bottom of each memory opening 49. The gate dielectric layer 66 can have a laterally undulating profile in a vertical cross-sectional view.

Figure 16I:
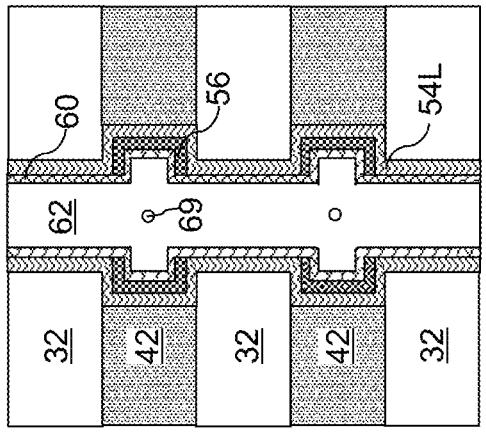
FIG. 16I is a vertical cross-sectional view of an alternative configuration of the third exemplary memory opening fill structure according to the third embodiment of the present disclosure.
Figure 16H:
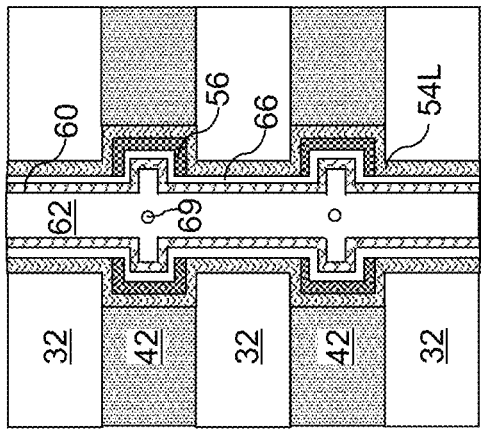
Figure 16G:
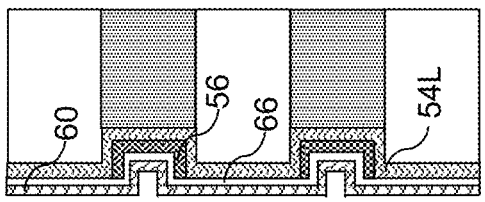

Referring to FIG. 16G, the processing steps of FIG. 5G may be performed to form the vertical semiconductor channel 60 on an inner sidewall of the gate dielectric layer 66. The vertical semiconductor channel 60 can have the same thickness and the same material composition as in the structure of FIG. 5G. The vertical semiconductor channel 60 can have a laterally undulating profile in a vertical cross-sectional view.

Referring to FIG. 16H, the processing steps of FIGS. 5H and 6 may be performed to form the optional dielectric core 62 and a drain region (not shown) in each memory opening. In some embodiments, optional voids 69 may be formed within each dielectric core 62 at levels of the sacrificial material layers 42.

Referring to FIG. 16I, an alternative configuration of the structure of FIG. 16H is illustrated, which may be derived from the structure of FIG. 16H by omitting formation of a gate dielectric layer 66.

Figure 17B:
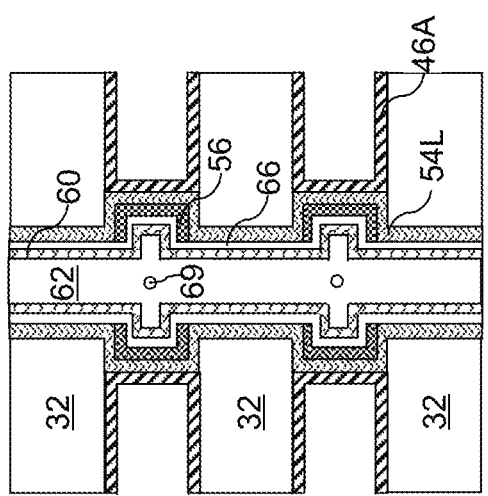
FIGS. 17A-17D are sequential vertical cross-sectional views of a memory opening during formation of a third exemplary memory opening fill structure according to the third embodiment of the present disclosure.
Figure 17A:
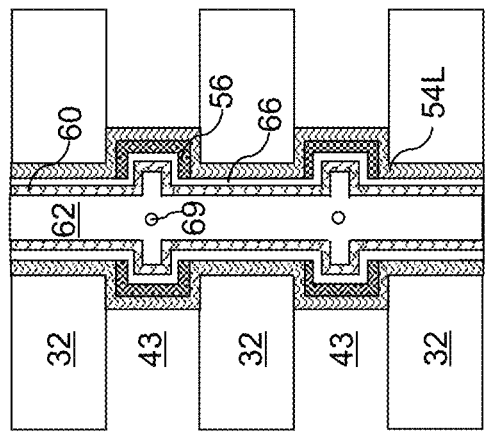

Subsequently, the processing steps of FIGS. 7A and 7B, 8, and 9A may be performed to provide the structure illustrated in FIG. 17A. Referring to FIG. 17B, the processing steps of FIG. 9B may be performed to form a transition metal nitride liner 46A in the backside recesses 43 on the physically exposed surfaces of the continuous amorphous dielectric material layer 54L.

Figure 17E:
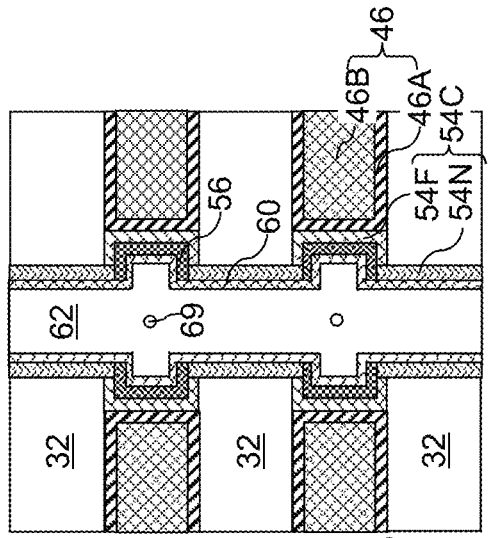
FIG. 17E is a vertical cross-sectional view of a memory opening after formation of an alternative configuration of the third exemplary memory opening fill structure according to the third embodiment of the present disclosure.
Figure 17D:
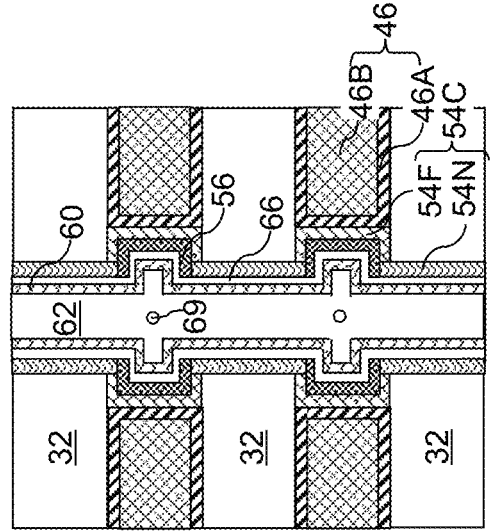
Figure 17C:
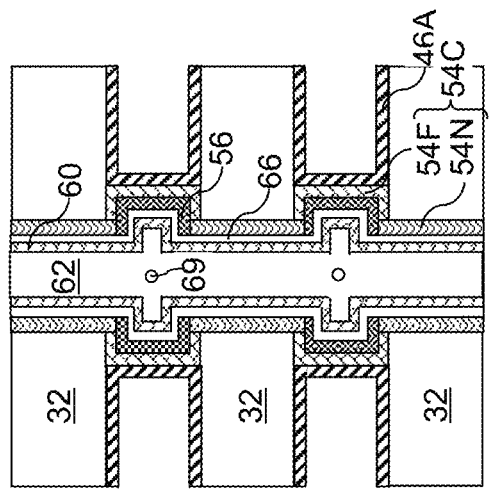

Referring to FIG. 17C, the processing steps of FIG. 9C may be performed to convert vertically-extending segments of the continuous amorphous dielectric material layer 54L into ferroelectric material portions 54F. Portions of the continuous amorphous dielectric material layer 54L located between neighboring pairs of a transition metal nitride spacer 56 and a vertically-extending portion of the transition metal nitride liner 46A may be converted into ferroelectric material portions 54F. Portions of the continuous amorphous dielectric material layer 54L contacting the insulating layers 32 may be converted into the non-ferroelectric dielectric material portions 54N. Each contiguous combination of at least one ferroelectric material portion 54F and at least one non-ferroelectric dielectric material portion 54N constitutes the continuous dielectric material layer 54C.

Referring to FIG. 17D, the processing steps of FIGS. 9D and 10 may be performed to deposit a metal fill material in remaining volumes of the plurality of backside recesses 43, on the sidewalls of the at least one the backside trench 79, and over the top surface of the contact level dielectric layer 73 to form a conductive fill material layer 46B. An electrically conductive layer 46 may be formed within each backside recess 43.

Referring to FIG. 17E, an alternative configuration of the structure of FIG. 17D is illustrated, which may be derived from the structure illustrated in FIG. 17D by employing the structure of FIG. 16I instead of the structure of FIG. 16H.

Subsequently, the processing steps of FIGS. 11A and 11B, 12, 13A and 13B may be performed.

In the structures illustrated in FIGS. 17D and 17E, the ferroelectric material portion 54F are formed as portions of a respective continuous dielectric material layer 54C that extends through and contacts each of the insulating layers 32 and the electrically conductive layers 46 of the alternating stack (32, 46). A vertical stack of transition metal nitride spacers 56 is formed on each continuous dielectric material layer 54C at levels of the electrically conductive layers 46. Regions of the amorphous dielectric material that are in direct contact with the insulating layers 32 are converted into non-ferroelectric dielectric material portions 54N located between vertically neighboring pairs of ferroelectric material portions 54F.

FIGS. 18A-18H are sequential schematic vertical cross-sectional views of a memory opening within the exemplary structure during formation of a fourth exemplary memory opening fill structure according to a fourth embodiment of the present disclosure.

Referring to FIG. 18A, the memory opening 49 is shown at the processing step of FIG. 5A.

Referring to FIG. 18B, the lateral annular recesses 45 may be formed by isotropically recess the sacrificial material layers 42 relative to the insulating layers 32 around each memory opening 49, using the processing steps of FIG. 5B. The duration of the isotropic etch process may be selected similar to the third embodiment, such that a lateral recess distance is in a range from 10 nm to 150 nm, such as from 20 nm to 70 nm, although lesser and greater lateral recess distances can also be employed.

Referring to FIG. 18C, the continuous amorphous dielectric material layer 54L may be formed by performing the processing steps of FIG. 5C. The continuous amorphous dielectric material layer 54L can have the same thickness and the same material composition as in the structure of FIG. 5C.

Figure 18F:
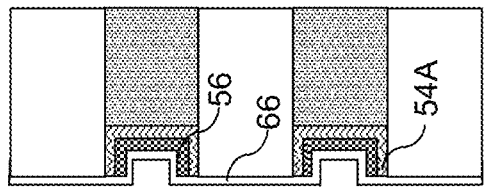
Figure 18E:
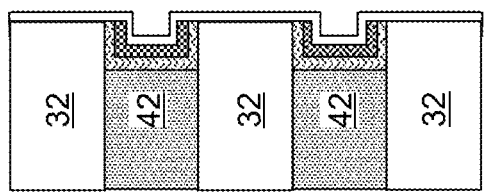
Figure 18D:
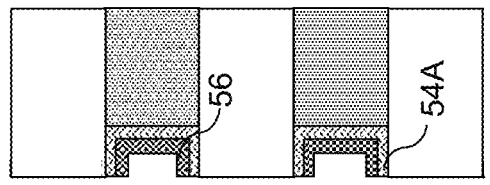

Referring to FIG. 18D, the continuous transition metal nitride layer 56L may be formed on the inner sidewall of the continuous amorphous dielectric material layer 54L. The continuous transition metal nitride layer 56L can have the same thickness and the same material composition as in the structure of FIG. 5D.

Referring to FIG. 18E, an anisotropic etch process may be performed to remove portions of the continuous transition metal nitride layer 56L and the continuous amorphous dielectric material layer 54L that are located outside the lateral annular recesses 45 and are not masked by an overlying portion of a respective insulating layer 32. Portions of the continuous transition metal nitride layer 56L and the continuous amorphous dielectric material layer 54L that are located within a cylindrical volume bounded by the sidewalls of the insulating layers 32 may be removed by the anisotropic etch process.

A combination of an amorphous dielectric material portion 54A and a transition metal nitride spacer 56 is formed within each of the lateral annular recesses 45. Each amorphous dielectric material portion 54A is a remaining portion of the continuous amorphous dielectric material layer 54L. Each transition metal nitride spacer 56 is a remaining portion of the continuous transition metal nitride layer 56L. As such, the amorphous dielectric material portions 54A comprise an amorphous dielectric material capable of transitioning into a ferroelectric phase under crystallization. In one embodiment, each the amorphous dielectric material portions 54A is formed entirely within a volume of a respective one of the lateral annular recesses 45, and a vertical stack of transition metal nitride spacers 56 is formed on each amorphous dielectric material portion 54A at levels of the sacrificial material layers 42 within the volume of the respective one of the lateral annular recesses 45.

In one embodiment, each transition metal nitride spacer 56 can have a tubular portion, a top annular portion adjoined to an upper end of the tubular portion, and a bottom annular portion adjoined to a lower end of the tubular portion. In this case, a vertical cross-sectional view of each transition metal nitride spacer 56 can have a pair of "C-shaped" portions that face each other. Each amorphous dielectric material portion 54A can have a tubular portion, a top annular portion adjoined to an upper end of the tubular portion, and a bottom annular portion adjoined to a lower end of the tubular portion. In this case, a vertical cross-sectional view of each amorphous dielectric material portion 54A can have a pair of "C-shaped" portions that face each other.

Referring to FIG. 18F, the processing steps of FIG. 5F may be performed to form the optional gate dielectric layer 66. The gate dielectric layer 66 can have the same thickness and the same material composition as in the structure of FIG. 5F. An anisotropic etch process may be performed to remove horizontal portions of the gate dielectric layer 66, and to physically expose a top surface of the semiconductor material layer 10 at the bottom of each memory opening 49. The gate dielectric layer 66 can have a laterally undulating profile in a vertical cross-sectional view.

Figure 18I:
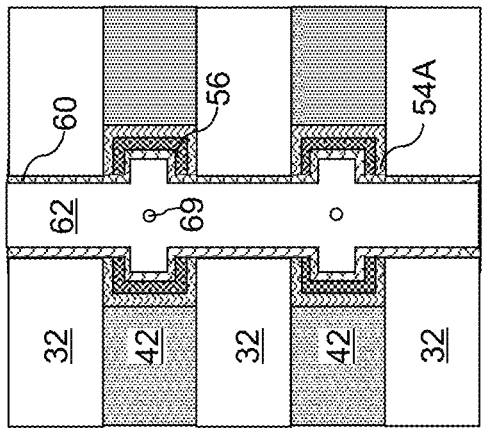
FIG. 18I is a vertical cross-sectional view of an alternative configuration of the fourth exemplary memory opening fill structure according to the fourth embodiment of the present disclosure.
Figure 18H:
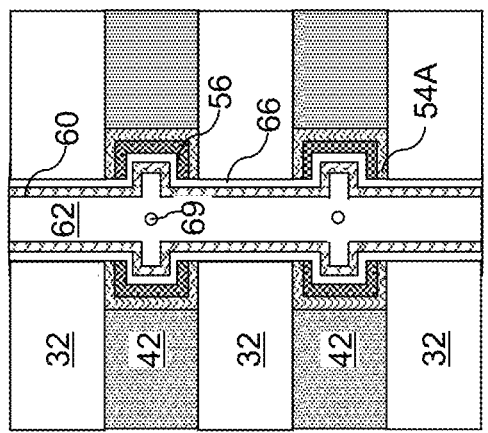
Figure 18G:
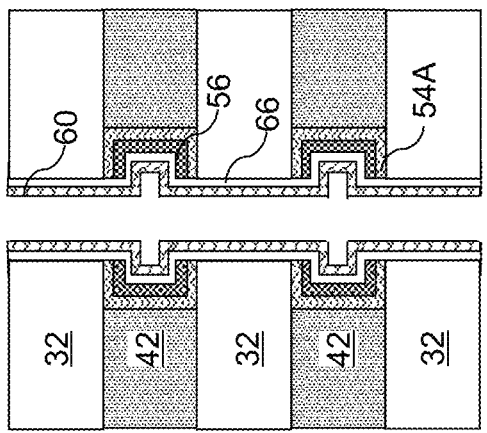

Referring to FIG. 18G, the processing steps of FIG. 5G may be performed to form the vertical semiconductor channel 60 on an inner sidewall of the gate dielectric layer 66. The vertical semiconductor channel 60 can have the same thickness and the same material composition as in the structure of FIG. 5G. The vertical semiconductor channel 60 can have a laterally undulating profile in a vertical cross-sectional view.

Referring to FIG. 18H, the processing steps of FIGS. 5H and 6 may be performed to form the optional dielectric core 62 and a drain region (not shown) in each memory opening. Voids 69 may be present within each dielectric core 62 due to pinching off of a vertical cavity during deposition of the dielectric material of the dielectric cores 62.

Referring to FIG. 18I, an alternative embodiment of the structure of FIG. 18H is illustrated, which may be derived from the structure of FIG. 14H by omitting formation of a gate dielectric layer 66.

Figure 19B:
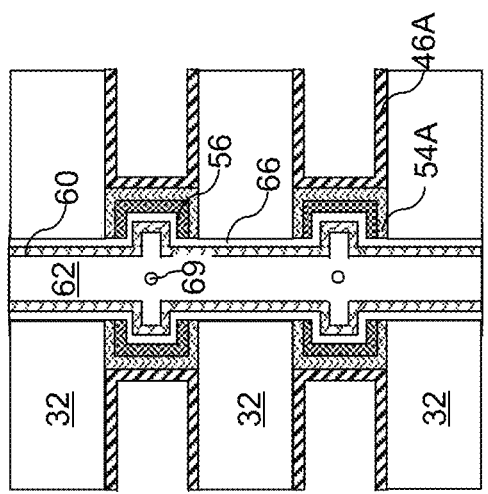
FIGS. 19A-19D are sequential vertical cross-sectional views of a memory opening during formation of a fourth exemplary memory opening fill structure according to the fourth embodiment of the present disclosure.
Figure 19A:
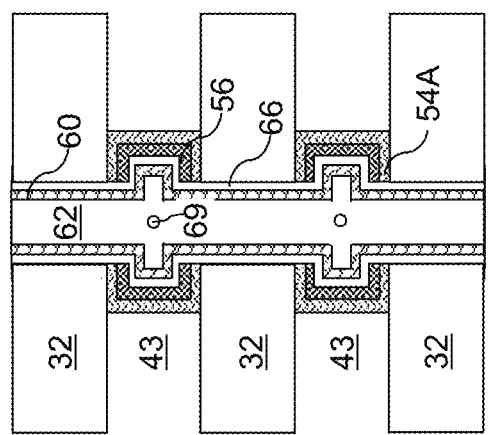

Subsequently, the processing steps of FIGS. 7A and 7B, 8, and 9A may be performed to provide the structure illustrated in FIG. 19A. Referring to FIG. 19B, the processing steps of FIG. 9B may be performed to form a transition metal nitride liner 46A on the physically exposed surfaces of the amorphous dielectric material portions 54A.

Figure 19E:
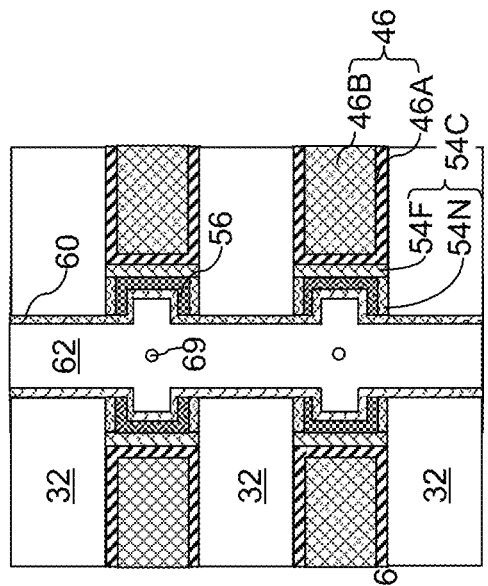
FIG. 19E is a vertical cross-sectional view of a memory opening after formation of an alternative configuration of the fourth exemplary memory opening fill structure according to the fourth embodiment of the present disclosure.
Figure 19D:
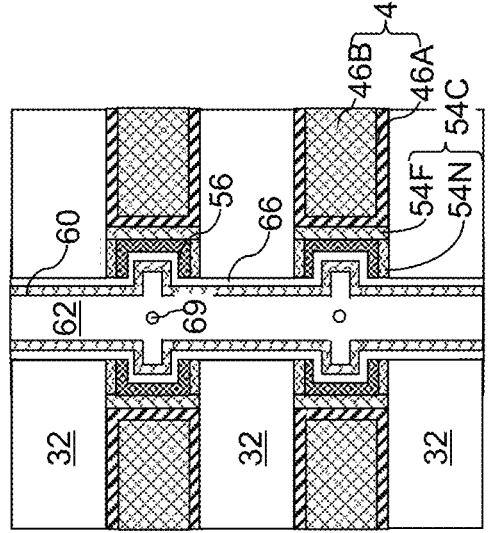
Figure 19C:
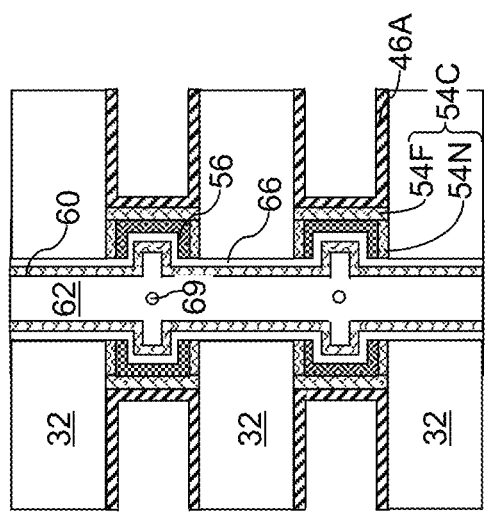

Referring to FIG. 19C, the processing steps of FIG. 9C may be performed to convert vertically-extending segments of the amorphous dielectric material portions 54A into ferroelectric material portions 54F. The vertically-extending segments of the amorphous dielectric material portions 54A are located between neighboring pairs of a transition metal nitride spacer 56 and a vertically-extending portion of the transition metal nitride liner 46A. As such, each vertically-extending segment of the amorphous dielectric material portions 54A may be converted into a ferroelectric material portion 54F.

In one embodiment, the entirety of each amorphous dielectric material portion 54A may be converted into a ferroelectric material portion 54F. In another embodiment, annular horizontal segments of the amorphous dielectric material portions 54A may not be converted into a ferroelectric material, but may be converted into a non-ferroelectric material to form the non-ferroelectric dielectric material portions 54N. The processing conditions employed during the anneal process that forms the ferroelectric material portions 54F can affect presence or absence, and/or the extent, of the non-ferroelectric dielectric material portions 54N. Each contiguous combination of a ferroelectric material portions 54F and at least one non-ferroelectric dielectric material portion 54N constitutes the continuous dielectric material layer 54C.

Referring to FIG. 19D, the processing steps of FIGS. 9D and 10 may be performed to deposit the metal fill material in remaining volumes of the plurality of backside recesses 43, on the sidewalls of the at least one the backside trench 79, and over the top surface of the contact level dielectric layer 73 to form the conductive fill material layer 46B. The electrically conductive layer 46 may be formed within each backside recess 43.

Referring to FIG. 19E, an alternative configuration of the structure of FIG. 19D is illustrated, which may be derived from the structure illustrated in FIG. 19D by employing the structure of FIG. 18I that lacks the gate dielectric layer 66 instead of the structure of FIG. 18H.

Subsequently, the processing steps of FIGS. 11A and 11B, 12, 13A and 13B may be performed.

In the structures illustrated in FIGS. 19D and 19E, the ferroelectric material portions 54F comprise vertical stacks of discrete ferroelectric material spacers. The discrete ferroelectric material spacers within each vertical stack of discrete ferroelectric material spacers are vertically spaced apart and have a respective vertical extent that is not greater than, and may be the same as, a vertical spacing between a vertically neighboring pair of insulating layers 32 that include a respective overlying insulating layer 32 and a respective underlying insulating layer 32. In one embodiment, each of the ferroelectric material portions 54F embeds a respective one of the transition metal nitride spacers 56 inside, and comprises a cylindrical ferroelectric material segment that contacts a respective one of the electrically conductive layers 46. An upper annular ferroelectric material segment that contacts the respective overlying insulating layer 32 and a lower annular segment that contacts the respective underlying insulating layer 32 may, or may not, be present within a ferroelectric material portion 54F. In case the entirety of each amorphous dielectric material portion 54A is converted into a ferroelectric material portion 54F, an inner sidewall of the upper annular segment and an inner sidewall of the lower annular segment may be vertically coincident with an inner sidewall of the respective one of the transition metal nitride spacers 56.

In an alternative configuration of the second, third or fourth exemplary structures of the second, third or fourth embodiments, the dielectric core 62 may be omitted, and the semiconductor channel 60 fills the entire central axial portion of the memory opening 49, similar to the configuration shown in FIG. 9F.

Referring to FIGS. 1 to 19E and according to various embodiments of the present disclosure, a three-dimensional ferroelectric memory device includes an alternating stack of insulating layers 32 and electrically conductive layers 46 located over a substrate (9, 10), where each of the electrically conductive layers 46 comprises a respective transition metal nitride liner 46A and a respective conductive fill material layer 46B. A vertical semiconductor channel 60 vertically extends through the alternating stack (32, 46), a transition metal nitride spacer 56 laterally surrounding the vertical semiconductor channel, and a ferroelectric material portion 54F laterally surrounding the transition metal nitride spacer 56. In one embodiment, the transition metal nitride spacer 56 may be a part of a vertical stack of transition metal nitride spacers 56 which laterally surround the vertical semiconductor channel 60 and are located at levels of the electrically conductive layers 46, and the ferroelectric material portion 54F may comprise one of a plurality of discrete ferroelectric material portions 54F that laterally surround the respective transition metal nitride spacers 56 and that are located at the levels of the electrically conductive layers 46.

In one embodiment, the discrete ferroelectric material portions 54F comprise hafnium oxide which has a predominant non-centrosymmetric orthorhombic phase and which is doped with at least one dopant selected from Al, Si, Gd, La, Y, Sr or Zr, the transition metal nitride spacers 56 comprise TiN or TaN spacers, and the transition metal nitride liner 46A comprises a TiN or TaN liner.

In one embodiment, a continuous dielectric material layer 54C comprises a vertical stack of the discrete ferroelectric material portions 54F located at levels of the electrically conductive layers 46 and a vertical stack of non-ferroelectric dielectric material portions 54N located at levels of the insulating layers 32. In one embodiment, the non-ferroelectric dielectric material portions 54N comprise hafnium oxide which has a predominant monoclinic, cubic or tetragonal phase and which is doped with at least one dopant selected from Al, Si, Gd, La, Y, Sr or Zr.

In one embodiment, an outer sidewall of the continuous dielectric material layer 54C has a laterally-undulating profile along a vertical direction, and includes laterally-protruding surfaces at each level of the electrically conductive layers 46.

In one embodiment, the discrete ferroelectric material portions 54F comprise vertical stacks of discrete ferroelectric material spacers 54F, and discrete ferroelectric material spacers within each vertical stack of ferroelectric material spacers are vertically spaced apart and have a respective vertical extent that is not greater than, and may be the same as, a vertical spacing between a vertically neighboring pair of insulating layers 32.

In one embodiment, each of the discrete ferroelectric material spacers 54F embeds a respective one of the transition metal nitride spacers 56 and comprises: a cylindrical ferroelectric material segment that contacts a respective one of the electrically conductive layers 46; an upper annular ferroelectric material segment that contacts the respective overlying insulating layer 32; and a lower annular segment that contacts the respective underlying insulating layer 32. An inner sidewall of the upper annular segment and an inner sidewall of the lower annular segment may be vertically coincident with an inner sidewall of the respective one of the transition metal nitride spacers 56.

In one embodiment, a gate dielectric layer 66 laterally surrounds a respective vertical semiconductor channel 60, and is laterally surrounded by a respective vertical stack of transition metal nitride spacers 56.

In one embodiment, the gate dielectric layer 66 comprises: a straight outer sidewall that extends through each layer of the alternating stack (32, 46) and contacting the respective vertical stack of transition metal nitride spacers 56; and a straight inner sidewall that extends through each layer of the alternating stack (32, 46) and contacting the respective vertical semiconductor channel 60.

In another embodiment, the gate dielectric layer 66 has a laterally undulating vertical cross-sectional profile, and laterally protruding segments of the gate dielectric layer 66 contact a respective one of the transition metal nitride spacers 56, and connecting segments of the gate dielectric layer 66 that connect a vertically neighboring pair of laterally protruding segments contact a respective one of the insulating layers 32.

In another embodiment, the gate dielectric layer 66 is omitted. In this embodiment, each of the discrete ferroelectric material portions 54F is in contact with a respective one of the transition metal nitride spacers 56, and with a respective one of the transition metal nitride liners 46A, and each of the transition metal nitride spacers 56 contacts a sidewall of the vertical semiconductor channel 60.

In one embodiment, the vertical semiconductor channel 60 has a solid cylindrical shape and the dielectric core 62 is omitted. In another embodiment, the vertical semiconductor channel 60 has a hollow cylindrical shape, and the dielectric core 62, optionally containing at least one void (i.e., air gap) 69 is surrounded by the vertical semiconductor channel 60.

The various embodiments of the present disclosure can provide a vertical stack of ferroelectric material portions 54F having a limited vertical extent that is about the same as, or does not exceed, the vertical extent of a respective electrically conductive layer 46. The ferroelectric properties of each ferroelectric material portion 54F are decoupled from the ferroelectric properties of neighboring ferroelectric material portions 54F. Thus, interference between neighboring ferroelectric memory cells may be minimized by the configurations of the ferroelectric memory devices of the embodiments present disclosure. An additional benefit of having lower cell to cell interference is that it allows the use of thinner isolation dielectric layers, e.g., insulating layers 32, for example. This reduces aspect ratios and makes integration of etch and deposition steps much easier and enables transition to future smaller nodes easier to achieve. Furthermore, by conducting the crystallization anneal after both sides of the continuous amorphous dielectric material layer 54L are in contact with a metal nitride material, such in contact with both the transition metal nitride spacer 56 and the transition metal nitride liner 46A, stronger ferroelectric characteristics may be obtained, which may provide a wider programming window, and leads to higher bit densities.

According to another aspect of the present disclosure, a ferroelectric memory device that reduces or eliminates program disturb is provided by utilizing one or more antiferroelectric (AFE) layers in conjunction with one or more ferroelectric (FE) layers to increase coercive voltage and provide rapid polarization switching without degrading the remnant ferroelectric polarization. An embodiment of the present disclosure utilizes transient negative capacitance of an alternating stack of one or more antiferroelectric layers and one or more ferroelectric layers and voltage dependent AC coupling.

The alternating stack of one or more antiferroelectric layers and one or more ferroelectric layers can generate a polarization-voltage curve having a greater hysteresis area than a single ferroelectric layer including the same amount of a ferroelectric material as the alternating stack. According to some embodiments of the present disclosure, the one or more antiferroelectric layers of embodiments of the present disclosure may have the same thickness as or may be thinner than the one or more ferroelectric layers within the alternating stack. For example, each antiferroelectric layer can have a thickness that is 10% to 100%, such as 10% to 20% of the thickness of each ferroelectric layer within the alternating stack. While the thickness of each antiferroelectric layer is illustrated with about a same thickness as each ferroelectric material layer in the figures described below, it is understood that the antiferroelectric layers may be thinner than the ferroelectric layers.

Various benefits of embodiments of the present disclosure can be realized by using multiple pairs of antiferroelectric material layers and ferroelectric material layers with the same total thickness as a stack of a single antiferroelectric material layer and a single ferroelectric material layer. The thinner ferroelectric material layers provide higher polarization per volume due to favorable grain orientations. Further optimization of the alternating stack of antiferroelectric material layers and ferroelectric material layers can be obtained by employing metallic barrier layers (i.e., metallic capping layers) provided between neighboring pairs of an antiferroelectric material layer and a ferroelectric material layer, or at both ends of the alternating stack. The metallic barrier layers may include TiN, TaN, Ta, Ti and/or Ru, and can enhance the ferroelectric behavior of the ferroelectric material layers.

The alternating stack may be included in three-dimensional or two-dimensional ferroelectric memory devices, as will be described below. A broad range of hysteresis curves can be engineered for specific applications by tuning the thicknesses, materials, composition, number of layers, and process (e.g., anneal) conditions of the alternating stack of antiferroelectric layers and ferroelectric material layers. As will be described below, the alternating stack of antiferroelectric layers and ferroelectric material layers can be implemented in various embodiments. The various configurations allow tailoring of hysteresis curve to suit different applications. The various configurations of the alternating stack of antiferroelectric layers and ferroelectric material layers are described in detail herebelow in specific exemplary device structures.

Referring to FIG. 20A, a memory opening 49 in a fifth exemplary structure according to a fifth embodiment of the present disclosure is illustrated. The fifth exemplary structure at this processing can be the same as the first exemplary structure at the processing steps of FIGS. 4A, 4B, and 5A. Generally, an alternating stack of insulating layers 32 and spacer material layers (such as the sacrificial material layers 42) can be formed over a substrate (9, 10). The spacer material layers may be formed as, or may be subsequently replaced with, electrically conductive layers 46. Memory openings 49 and support openings 19 can be formed through the alternating stack (32, 42) such that each of the memory openings 49 and the support openings 19 vertically extend through the alternating stack (32, 42).

Referring to FIG. 20B, a continuous layer stack including at least one ferroelectric material layer 154F and at least one antiferroelectric material layer 154A can be formed on the physically exposed surfaces of the memory openings 49 and the support openings 19. In one embodiment, the continuous layer stack can include at least two ferroelectric material layers 154F and at least one antiferroelectric material layers 154A. In one embodiment, the continuous layer stack can include a plurality of instances of a unit continuous layer stack, and the unit continuous layer stack can include a ferroelectric material layer 154F and an antiferroelectric material layer 154A. The number of instances of the unit continuous layer stack within the continuous layer stack (154F, 154A) can be in a range from 2 to 10, such as from 3 to 6. Generally, the continuous layer stack (154F, 154A) can include at least one ferroelectric material layer 154F and at least one antiferroelectric material layer 154A. In case at least two ferroelectric material layers 154F are present within the continuous layer stack (154F, 154A), the ferroelectric material layers 154F are laterally spaced from each other by the at least one antiferroelectric material layer 154A. The continuous layer stack (154F, 154A) can continuously extend across the fifth exemplary structure, and can include cylindrical layer stacks 154L located within a respective one of the memory openings 49.

Generally, each ferroelectric material layer 154F can include any material that may be employed for the continuous amorphous dielectric material layer 54L as described above. Each antiferroelectric material layer 154A can include any polycrystalline antiferroelectric material or any amorphous material that can be subsequently converted into a polycrystalline antiferroelectric material upon subsequent annealing.

In some embodiments, each ferroelectric material layer 154F and each antiferroelectric material layer 154A can include a respective hafnium-containing dielectric compound material layer that can be deposited in a polycrystalline state or deposited in an amorphous state then annealed into a polycrystalline state to form a respective ferroelectric material layer or a respective antiferroelectric material layer. In some embodiments, each ferroelectric material layer 154F and each antiferroelectric material layer 154A can include a respective dielectric oxide of hafnium and an additional metallic element or an additional semiconductor element that is incorporated at different atomic percentages into the at least one ferroelectric material layer 154F and the at least one antiferroelectric material layer 154A.

In one embodiment, each ferroelectric material layer 154F can have a material composition of $Hf_xZr_{1-x}O_2$, where $0.3<x<0.7$, and each antiferroelectric material layer 154A can have a material composition of $Hf_yZr_{1-y}O_2$, where $0.7<y<1$ or $0<y<0.3$. In another embodiment, each ferroelectric material layer 154F has a material composition of $Hf_xSi_{1-x}O_2$, where $0.94<x<0.97$, and each antiferroelectric material layer 152A has a material composition of $Hf_ySi_{1-y}O_2$, where $0<y<94$ or $1>y>0.97$. In yet another embodiment, each ferroelectric material layer 154F has a material composition of $Hf_xAl_{4(1-x)/3}O_2$, where $0.93<x<0.97$, and each of the antiferroelectric material portions has a material composition of $Hf_yAl_{4(1-y)/3}O_2$, where $0<y<0.93$ or $1>y>0.97$.

Each ferroelectric material layer 154F and each antiferroelectric material layer 154A can be formed by a conformal deposition process such as atomic layer deposition (ALD) or chemical vapor deposition (CVD). In one embodiment, at least one of the ferroelectric material layers 154F and each antiferroelectric material layer 154A can be formed by atomic layer deposition that forms a dielectric oxide of hafnium and an additional element such as Zr, Si, or Al, which can be incorporated at different atomic concentrations into the at least one ferroelectric material layer 154F and the at least one antiferroelectric material layer 154A. The atomic percentage of the additional element can be controlled by adjusting the duration of the exposure time for a precursor gas containing the additional element, or by selecting the flow rate and/or dilution of the precursor gas containing the additional element.

The total thickness of the at least one ferroelectric material layer 154F can be in a range from 3 nm to 20 nm, such as from 5 nm to 15 nm, although lesser and greater thicknesses can also be employed. The total thickness of the at least one antiferroelectric material layer 154A may be in a range from 10% to 100%, such as from 10% to 20%, of the total thickness of the at least one ferroelectric material layer 154F (e.g., a thickness of 0.5 nm to 10 nm, such as 1 nm to 3 nm). In one embodiment, the continuous layer stack (154F, 154A) can include N ferroelectric material layers 154F in which N is in a range from 2 to 10, and the thickness of each ferroelectric material layer 154F can be 1/N times the total thickness of the ferroelectric material layers 154F in the continuous layer stack (154F, 154A). In one embodiment, the continuous layer stack (154F, 154A) can include M ferroelectric material layer(s) 154A, in which M is in a range from N−1 to N+1, and the thickness of each antiferroelectric material layer 154A can be 1/M times the total thickness of the antiferroelectric material layers 154A. The thickness of the individual antiferroelectric material layers may be the same or different from each other, and the thickness of the individual ferroelectric material layers may be the same or different from each other. The total thickness of the antiferroelectric material layers is preferably a range from 10% to 100%, such as from 10% to 20%, of the total thickness of the ferroelectric material layers.

The continuous layer stack (154F, 154A) includes a plurality of cylindrical layer stacks 154L located within a respective one of the memory openings 49 or within a respective one of the support openings 19. Each cylindrical segment of a cylindrical layer stack 154L located at a level of a sacrificial material layer 42 constitutes a ferroelectric memory element. Thus, each ferroelectric memory element comprises a respective region of a respective cylindrical layer stack 154L. Each of the ferroelectric memory elements comprises a respective set of at least one ferroelectric material portion (which is a portion of a ferroelectric material layer 154F located at a level of a sacrificial material layer 42 around a memory opening 49) and at least one antiferroelectric material portion (which is a portion of an antiferroelectric material layer 154A located at a level of a sacrificial material layer 42 around a memory opening 49).

Referring to FIG. 20C, the processing steps of FIG. 5G can be performed to form a vertical semiconductor channel 60 within each memory opening 49 and within each support opening 19. Subsequently, the processing steps of FIG. 5H can be performed to form a dielectric core 62 within each memory opening 49 and within each support opening 19. A fifth exemplary memory opening fill structure is formed within each memory opening 49, and a support pillar structure is formed within each support opening 19.

Figure 20F:
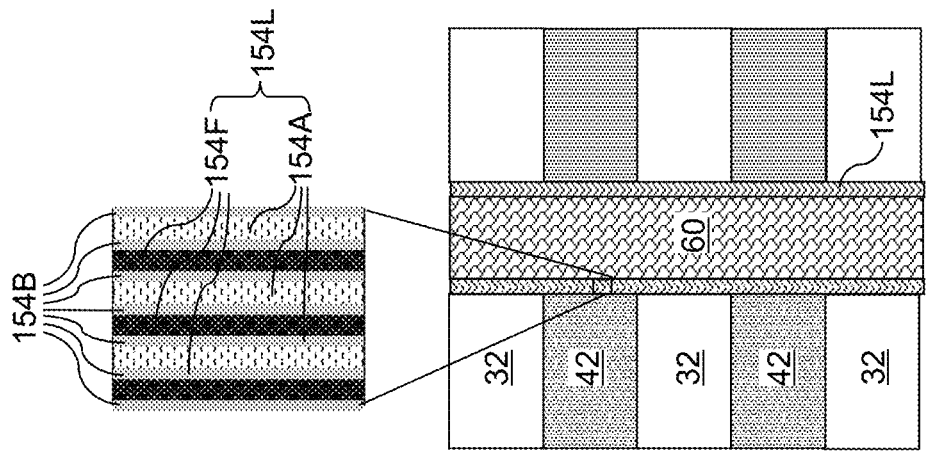
FIGS. 20D-20G are vertical cross-sectional views of a memory opening after formation of a respective alternative configuration of the fifth exemplary memory opening fill structure according to the fifth embodiment of the present disclosure.
Figure 20E:
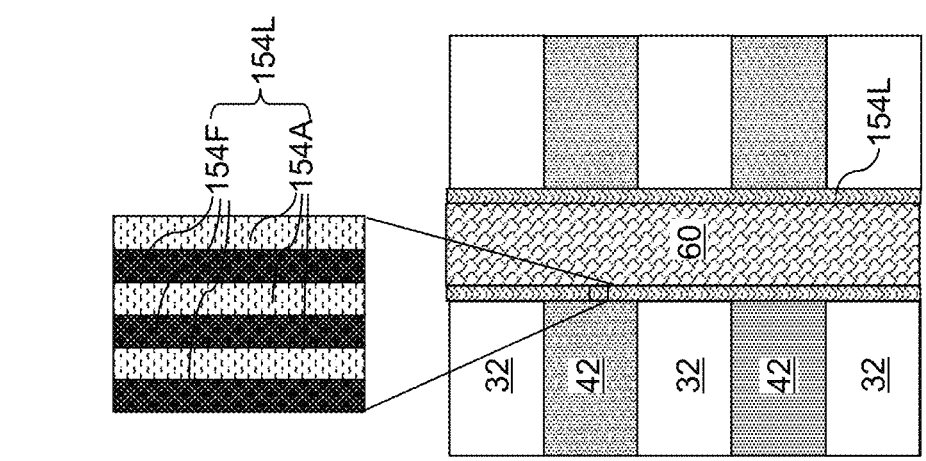
Figure 20D:
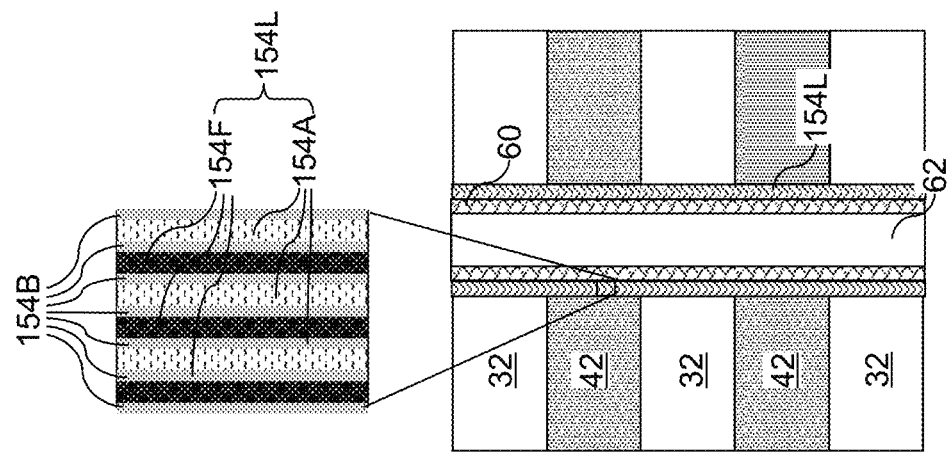

Referring to FIG. 20D, a first alternative configuration of the fifth exemplary memory opening fill structure for the fifth exemplary structure is illustrated. The first alternative configuration of the fifth exemplary memory opening structure can be derived from the fifth exemplary memory opening fill structure illustrated in FIG. 20C by modifying the continuous layer stack (154F, 154A) illustrated in FIG. 20B by inserting at least one metallic barrier layer 154B between neighboring ferroelectric material layer 154F and antiferroelectric material layer 154A. Each metallic barrier layer 154B comprises, and/or consists essentially of, a material selected from TiN, TaN, Ti, Ta, Ru or alloys thereof. Each metallic barrier layer 154B can be formed by a conformal deposition process such as chemical vapor deposition, and can have a thickness in a range from 0.3 nm to 1 nm, although lesser and greater thicknesses can also be employed. In one embodiment, the total number of the metallic barrier layer(s) 154B can be the same as the total number of the ferroelectric material layers 154F. In another embodiment, the total number of the metallic barrier layer(s) 154B can be greater than the total number of the ferroelectric material layers 154F by 1. In yet another embodiment, the total number of the metallic barrier layer(s) 154B can be less than the total number of the ferroelectric material layers 154F by 1.

Referring to FIG. 20E, a second alternative configuration of the fifth exemplary memory opening fill structure for the fifth exemplary structure is illustrated, which can be derived from the fifth exemplary memory opening fill structure of FIG. 21C by forming a vertical semiconductor channel 60 that fills the entirety of a remaining volume of the memory opening 49 after formation of the continuous layer stack (154F, 154A) of FIG. 21B. In this case, dielectric cores 62 are not formed.

Referring to FIG. 20F, a third alternative configuration of the fifth exemplary memory opening fill structure for the fifth exemplary structure is illustrated, which can be derived from the first alternative configuration of the fifth exemplary structure by forming a vertical semiconductor channel 60 that fills the entirety of a remaining volume of the memory opening 49 after formation of the continuous layer stack (154F, 154A, 154B) of FIG. 20D. In this case, dielectric cores 62 are not formed.

Figure 20G:
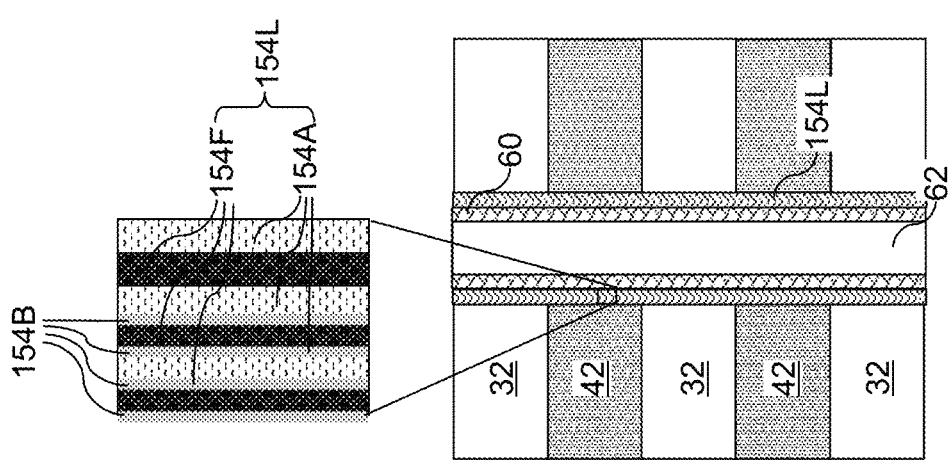

Referring to FIG. 20G, a fourth alternative configuration of the fifth exemplary memory opening fill structure for the fifth exemplary structure is illustrated, which can be derived from the first alternative configuration of the fifth exemplary structure by inserting at least one metallic barrier layer 154B between some but not all neighboring ferroelectric material layers 154F and antiferroelectric material layers 154A. Thus, some neighboring ferroelectric material layers 154F and antiferroelectric material layers 154A are separated by a metallic barrier layer 154B, while other neighboring ferroelectric material layers 154F and antiferroelectric material layers 154A directly contact each other and are not separated by a metallic barrier layer 154B. This permits the remnant polarization to be tuned to a broader range of values. While FIG. 20G illustrates a dielectric core 62, in another embodiment, the dielectric core may be omitted, similar to the configuration shown in FIG. 20F.

Figure 21:
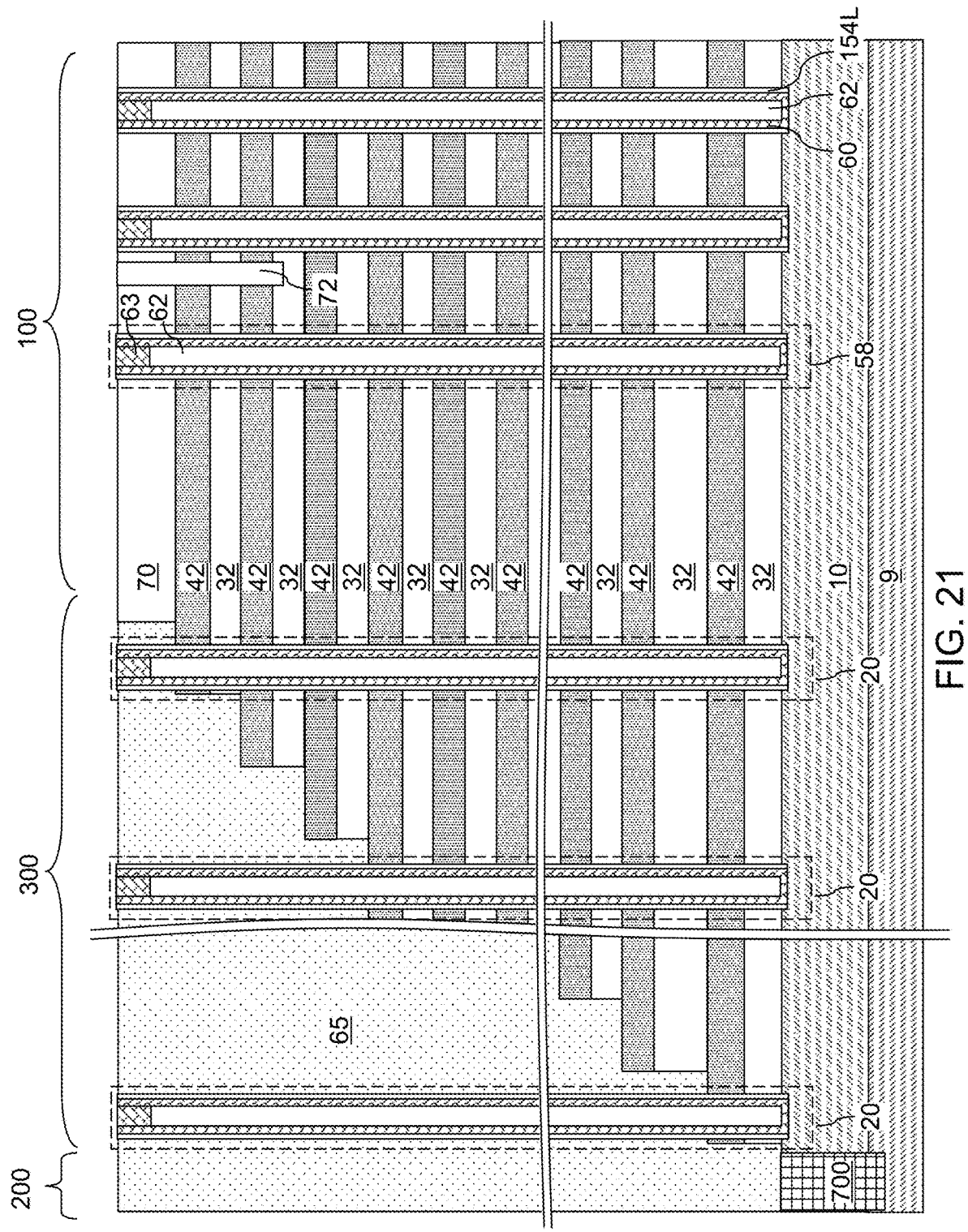
FIG. 21 is a vertical cross-sectional view of the exemplary structure after formation of the fifth exemplary memory opening fill structures in the memory openings according to the fourth embodiment of the present disclosure.

FIG. 21 illustrates the fifth exemplary structure after formation of memory opening fill structures 58 and support pillar structures 20. Each of the memory opening fill structures 58 may have any of the configurations of FIGS. 20C-20F.

Subsequently, the processing steps of FIGS. 7A, 7B, and 8 can be performed to form a contact level dielectric layer 73, backside trenches 79, and backside recesses 43. Removal of the sacrificial material layers 42 can be selective to the cylindrical layer stacks 154L.

Referring to FIG. 22A, a region of the fifth exemplary structure around a memory opening fill structure 58 is illustrated after formation of the backside recesses 43.

Referring to FIG. 22B, a transition metal nitride liner 46A may be deposited in the backside recesses 43 on the physically exposed surfaces of the cylindrical layer stacks 154L. The transition metal nitride liner 46A can include, and/or can consist essentially of, a conductive nitride material of at least one transition metal element. In one embodiment, the transition metal nitride liner 46A can include and/or can consist essentially of TiN and/or TaN. The transition metal nitride liner 46A may be deposited by a conformal deposition process such as a chemical vapor deposition process. The transition metal nitride liner 46A can have a thickness in a range from 2 nm to 40 nm, such as from 4 nm to 15 nm, although lesser and greater thicknesses can also be employed.

A crystallization anneal process may be performed to convert any amorphous material within the cylindrical layer stacks 154L into crystallized material portions. The temperature and the duration of the anneal process is selected such that all amorphous ferroelectric and/or antiferroelectric material portions within the cylindrical layer stacks 154L are converted into crystalline ferroelectric and/or antiferroelectric material portions. In one embodiment, the crystallization anneal process may be conducted at a temperature from 400 degrees Celsius to 1000 degrees Celsius, such as from 725 degrees Celsius to 800 degrees Celsius, for 1 second to 20 minutes, such as 1 second to 10 minutes. In one embodiment, the anneal may be a rapid thermal anneal having a duration of 20 to 60 seconds and a temperature from 725 degrees Celsius to 800 degrees Celsius.

Referring to FIG. 22C, a metal fill material is deposited in remaining volumes of the plurality of backside recesses 43, on the sidewalls of the at least one the backside trench 79, and over the top surface of the contact level dielectric layer 73 to form a conductive fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the conductive fill material layer 46B can consist essentially of at least one elemental metal. The at least one elemental metal of the conductive fill material layer 46B may be selected, for example, from tungsten, cobalt, ruthenium, titanium, and tantalum. In one embodiment, the conductive fill material layer 46B can consist essentially of a single elemental metal. In one embodiment, the conductive fill material layer 46B may be deposited employing a fluorine-containing precursor gas such as $WF_6$. In one embodiment, the conductive fill material layer 46B may be a tungsten layer including a residual level of fluorine atoms as impurities. The conductive fill material layer 46B is spaced from the insulating layers 32 and the memory opening fill structures 58 by the transition metal nitride liner 46A.

Each portion of the transition metal nitride liner 46A and the conductive fill material layer 46B that is located within a backside recess 43 constitutes an electrically conductive layer 46. A plurality of electrically conductive layers 46 may be formed in the plurality of backside recesses 43, and a continuous electrically conductive layer may be formed on the sidewalls of each backside trench 79 and over the contact level dielectric layer 73. Each electrically conductive layer 46 includes a portion of the transition metal nitride liner 46A and a portion of the conductive fill material layer 46B that are located between a vertically neighboring pair of dielectric material layers such as a pair of insulating layers 32. A continuous electrically conductive layer includes a continuous portion of the transition metal nitride liner 46A and a continuous portion of the conductive fill material layer 46B that are located in the backside trenches 79 or above the contact level dielectric layer 73. Each sacrificial material layer 42 may be replaced with an electrically conductive layer 46. A backside cavity is present in each backside trench 79.

Figure 22F:
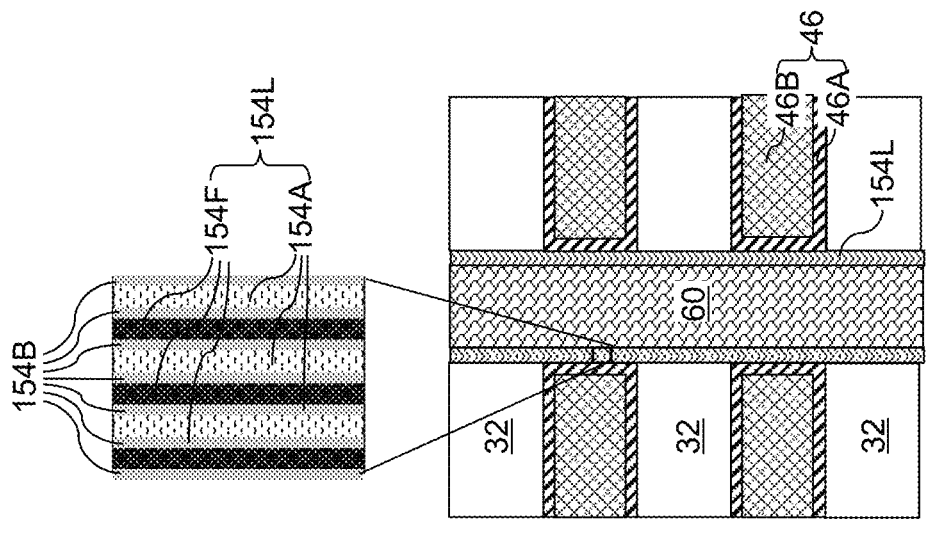
FIGS. 22D-22F are vertical cross-sectional views of alternative configurations of the fifth exemplary structure after replacement of the sacrificial material layers with electrically conductive layers according to the fifth embodiment of the present disclosure.
Figure 22E:
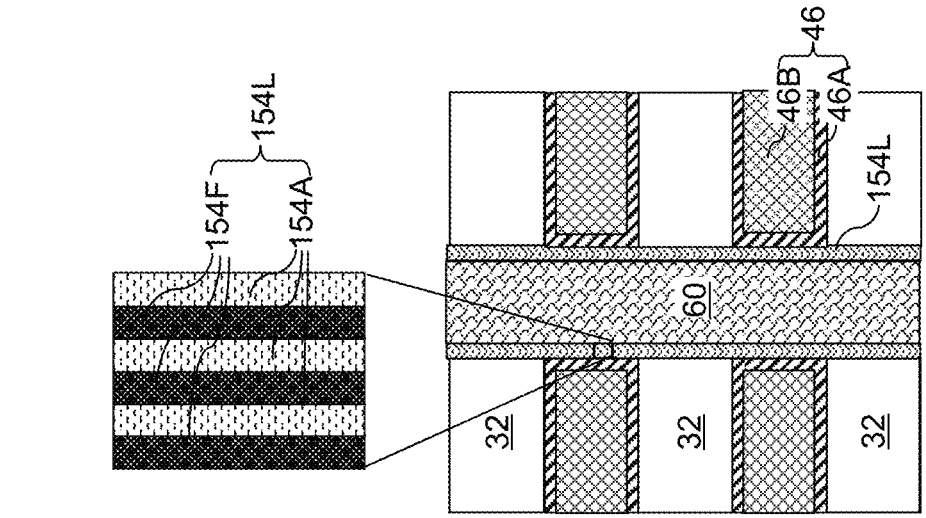
Figure 22D:
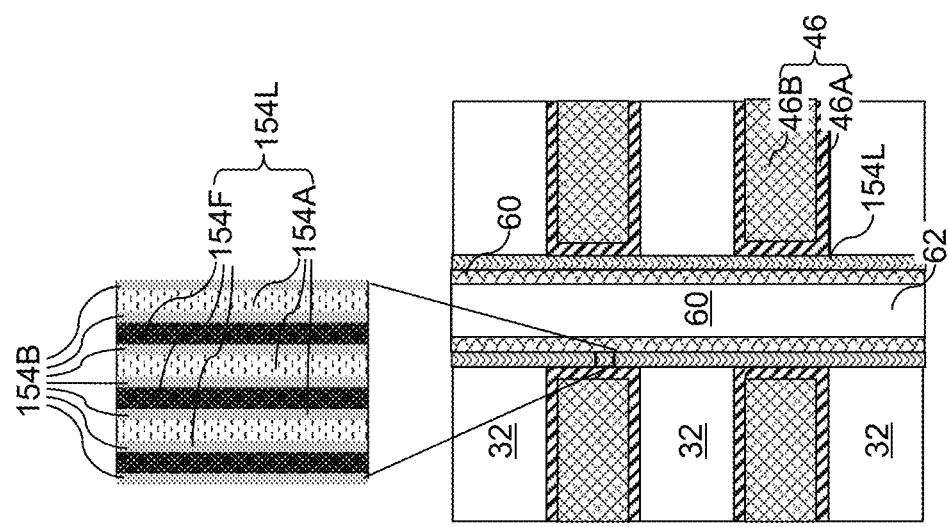

Referring to FIG. 22D, a first alternative configuration for the fifth exemplary structure is illustrated, which can be derived from the fifth exemplary structure of FIG. 22C by employing the memory opening fill structure of FIG. 20D in lieu of the memory opening fill structure of FIG. 20C.

Referring to FIG. 22E, a second alternative configuration for the fifth exemplary structure is illustrated, which can be derived from the fifth exemplary structure of FIG. 22C by employing the memory opening fill structure of FIG. 20E in lieu of the memory opening fill structure of FIG. 20C.

Referring to FIG. 22F, a third alternative configuration for the fifth exemplary structure is illustrated, which can be derived from the fifth exemplary structure of FIG. 22C by employing the memory opening fill structure of FIG. 20F in lieu of the memory opening fill structure of FIG. 20C.

Figure 23A:
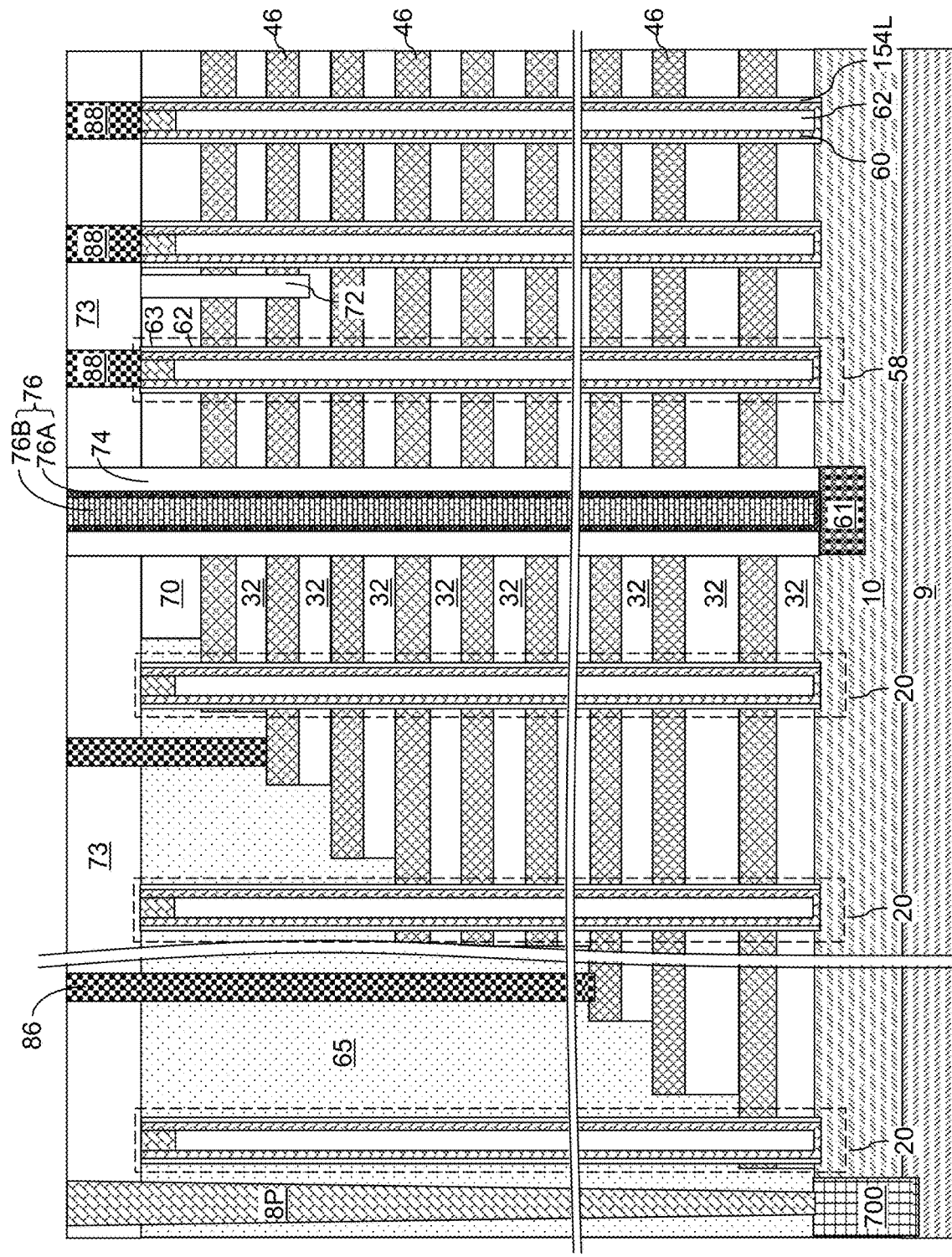
FIG. 23A is a schematic vertical cross-sectional view of the exemplary structure after formation of contact via structures according to the fifth embodiment of the present disclosure.
Figure 23B:
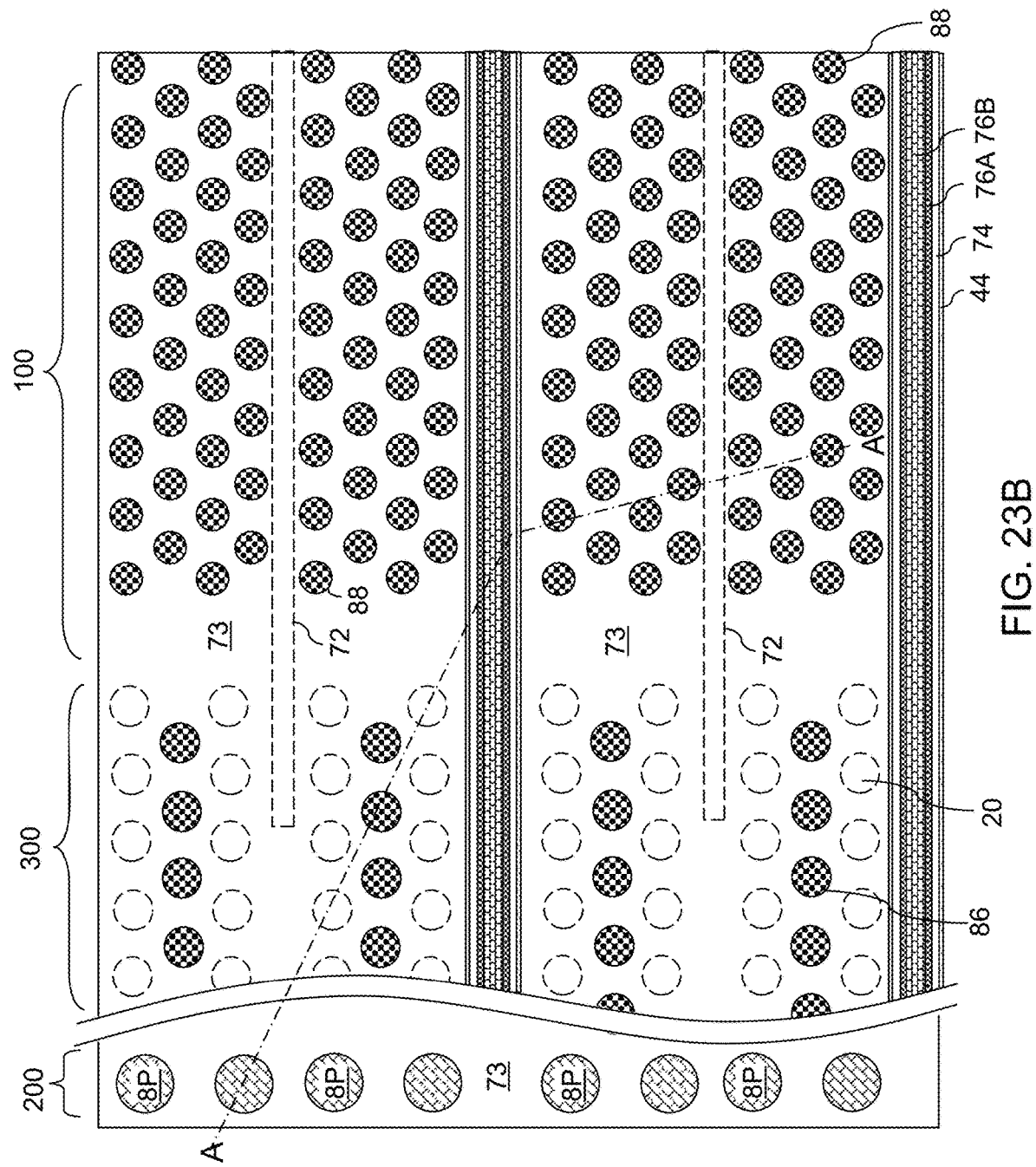
FIG. 23B is a top-down view of the exemplary structure of FIG. 23A. The vertical plane A-A' is the plane of the schematic vertical cross-sectional view of FIG. 23A.

Referring to FIGS. 23A and 23B, the processing steps of FIGS. 11A and 11B, 12, and 13A and 13B can be performed to form various contact via structures.

Referring to FIG. 24A, a memory opening 49 in a sixth exemplary structure according to a sixth embodiment of the present disclosure is illustrated. The sixth exemplary structure at this processing can be the same as the first exemplary structure at the processing steps of FIGS. 4A, 4B, and 5A. Generally, an alternating stack of insulating layers 32 and spacer material layers (such as the sacrificial material layers 42) can be formed over a substrate (9, 10). The spacer material layers may be formed as, or may be subsequently replaced with, electrically conductive layers 46. Memory openings 49 and support openings 19 can be formed through the alternating stack (32, 42) such that each of the memory openings 49 and the support openings 19 vertically extend through the alternating stack (32, 42).

Referring to FIG. 24B, the processing steps of FIG. 20C can be performed to form a vertical semiconductor channel 60 and a dielectric core 62. In other words, the processing steps of FIG. 20B are omitted during formation of the memory opening fill structures. Thus, each vertical semiconductor channel 60 can be formed directly on straight sidewalls of a respective memory opening 49, which include sidewalls of the insulating layers 32 and the sacrificial material layers 42.

Referring to FIG. 24C, an alternative configuration of the memory opening fill structure for the sixth exemplary structure can be derived from the memory opening fill structure of FIG. 24B by filling the entire volume of each memory opening 49 with a respective vertical semiconductor channel 60.

Subsequently, the processing steps of FIGS. 7A, 7B, and 8 can be performed to form a contact level dielectric layer 73, backside trenches 79, and backside recesses 43.

Figure 25C:
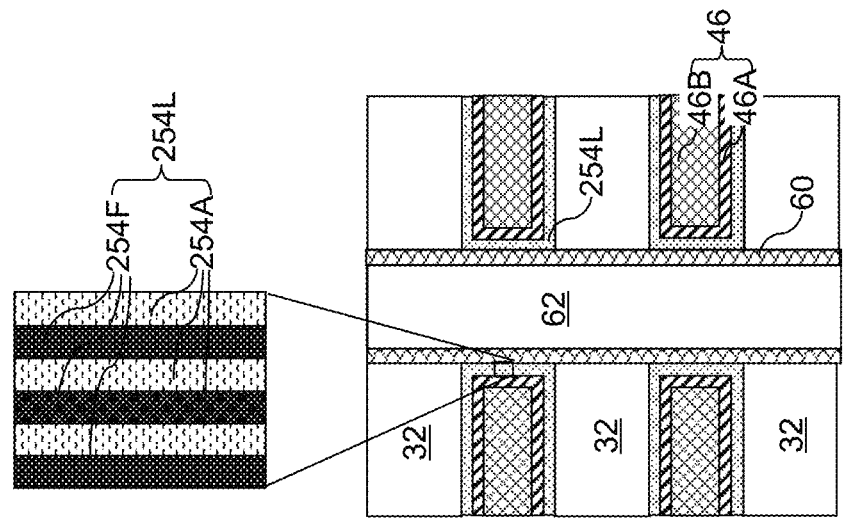
FIGS. 25A-25C are sequential vertical cross-sectional views of a region around a memory opening during replacement of the sacrificial material layers with dielectric layer stacks and electrically conductive layers according to the sixth embodiment of the present disclosure.
Figure 25B:
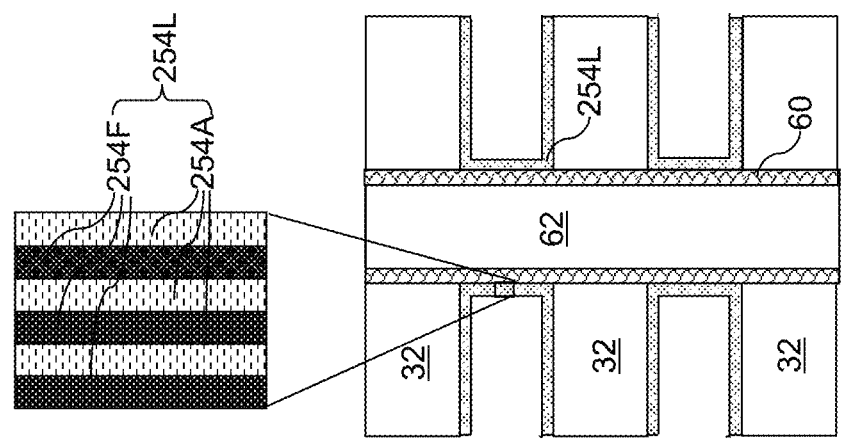
Figure 25A:
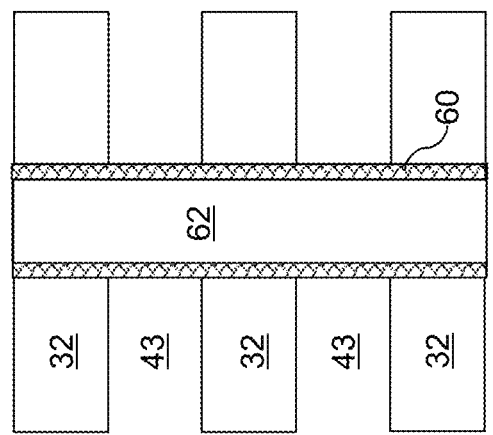

Referring to FIG. 25A, a region of the sixth exemplary structure around a memory opening fill structure 58 is illustrated after formation of the backside recesses 43.

Referring to FIG. 25B, a continuous layer stack including at least one ferroelectric material layer 254F and at least one antiferroelectric material layer 254A can be formed in the backside recesses 43, peripheral regions of the backside trenches 79, and over the contact level dielectric layer 73. In one embodiment, the continuous layer stack can include at least two ferroelectric material layer 254F and at least one antiferroelectric material layer 254A. In one embodiment, the continuous layer stack can include at least two ferroelectric material layer 254F and at least two antiferroelectric material layers 254A. In one embodiment, the continuous layer stack can include a plurality of instances of a unit continuous layer stack, and the unit continuous layer stack can include a ferroelectric material layer 254F and an antiferroelectric material layer 254A. The number of instances of the unit continuous layer stack within the continuous layer stack (254F, 254A) can be in a range from 2 to 10, such as from 3 to 6. Generally, the continuous layer stack (254F, 254A) can include at least one ferroelectric material layer 254F and at least one antiferroelectric material layer 254A. In case at least two ferroelectric material layers 254F are present within the continuous layer stack (254F, 254A), the ferroelectric material layers 254F are laterally spaced from each other by the at least one antiferroelectric material layer 254A. The continuous layer stack (254F, 254A) can continuously extend across the sixth exemplary structure, and can include dielectric layer stacks 254L located within a respective one of the backside recesses 43. Each dielectric layer stack 254L can be formed entirely within a respective one of the backside recesses 43.

Generally, each ferroelectric material layer 254F can include any material that may be employed for the ferroelectric material layer 154F as described above. Each antiferroelectric material layer 254A can include any material that may be employed for the antiferroelectric material layer 154A as described above. The thickness of layers 254F and 254A may be the same as those of respective layers 154F and 154A described above.

The continuous layer stack (254F, 254A) includes a plurality of dielectric layer stacks 254L located within a respective one of the backside recesses 43. Each cylindrical segment of a dielectric layer stack 254L laterally surround a respective one of the vertical semiconductor channels 60 constitutes a ferroelectric memory element. Thus, each ferroelectric memory element comprises a respective cylindrical segment of a respective dielectric layer stack 254L. Each of the ferroelectric memory elements comprises a respective set of at least one ferroelectric material portion (which is a cylindrical portion of a ferroelectric material layer 254F laterally surrounding a respective vertical semiconductor channel 60) and at least one antiferroelectric material portion (which is a cylindrical portion of an antiferroelectric material layer 254A laterally surrounding a respective vertical semiconductor channel 60).

Referring to FIG. 25C, a transition metal nitride liner 46A may be deposited in remaining volumes of the backside recesses 43 on the physically exposed surfaces of the dielectric layer stacks 254L. The transition metal nitride liner 46A can include, and/or can consist essentially of, a conductive nitride material of at least one transition metal element. In one embodiment, the transition metal nitride liner 46A can include, and/or can consist essentially of, TiN and/or TaN. The transition metal nitride liner 46A may be deposited by a conformal deposition process such as a chemical vapor deposition process. The transition metal nitride liner 46A can have a thickness in a range from 2 nm to 40 nm, such as from 4 nm to 15 nm, although lesser and greater thicknesses can also be employed.

A crystallization anneal process may be performed to convert any amorphous material within the dielectric layer stacks 254L into crystallized material portions. The temperature and the duration of the anneal process is selected such that all amorphous ferroelectric and/or antiferroelectric material portions within the dielectric layer stacks 254L are converted into crystalline ferroelectric and/or antiferroelectric material portions. In one embodiment, the crystallization anneal process may be conducted at a temperature from 400 degrees Celsius to 1000 degrees Celsius, such as from 725 degrees Celsius to 800 degrees Celsius, for 1 second to 20 minutes, such as 1 second to 10 minutes. In one embodiment, the anneal may be a rapid thermal anneal having a duration of 20 to 60 seconds and a temperature from 725 degrees Celsius to 800 degrees Celsius.

A metal fill material is deposited in remaining volumes of the plurality of backside recesses 43, on the sidewalls of the at least one the backside trench 79, and over the top surface of the contact level dielectric layer 73 to form a conductive fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the conductive fill material layer 46B can consist essentially of at least one elemental metal. The at least one elemental metal of the conductive fill material layer 46B may be selected, for example, from tungsten, cobalt, ruthenium, titanium, and tantalum. In one embodiment, the conductive fill material layer 46B can consist essentially of a single elemental metal. In one embodiment, the conductive fill material layer 46B may be deposited employing a fluorine-containing precursor gas such as $WF_6$. In one embodiment, the conductive fill material layer 46B may be a tungsten layer including a residual level of fluorine atoms as impurities. The conductive fill material layer 46B is spaced from the insulating layers 32 and the memory opening fill structures 58 by the transition metal nitride liner 46A.

Each portion of the transition metal nitride liner 46A and the conductive fill material layer 46B that is located within a backside recess 43 constitutes an electrically conductive layer 46. A plurality of electrically conductive layers 46 may be formed in the plurality of backside recesses 43, and a continuous electrically conductive layer may be formed on the sidewalls of each backside trench 79 and over the contact level dielectric layer 73. Each electrically conductive layer 46 includes a portion of the transition metal nitride liner 46A and a portion of the conductive fill material layer 46B that are located between a vertically neighboring pair of dielectric material layers such as a pair of insulating layers 32. A continuous electrically conductive layer includes a continuous portion of the transition metal nitride liner 46A and a continuous portion of the conductive fill material layer 46B that are located in the backside trenches 79 or above the contact level dielectric layer 73. Each sacrificial material layer 42 may be replaced with an electrically conductive layer 46. A backside cavity is present in each backside trench 79.

Figure 25F:
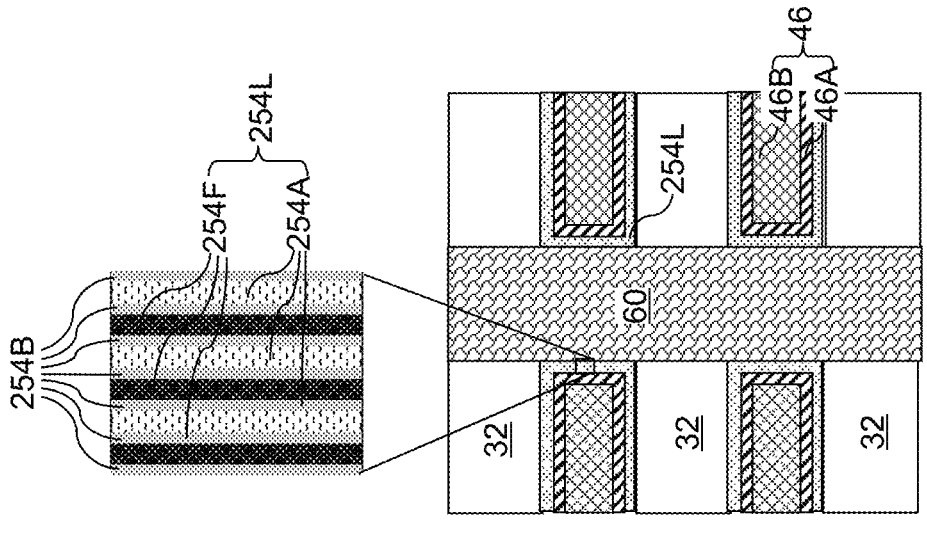
FIGS. 25D-25F are vertical cross-sectional views of alternative configurations of the sixth exemplary structure after replacement of the sacrificial material layers with dielectric layer stacks and electrically conductive layers according to the sixth embodiment of the present disclosure.
Figure 25E:
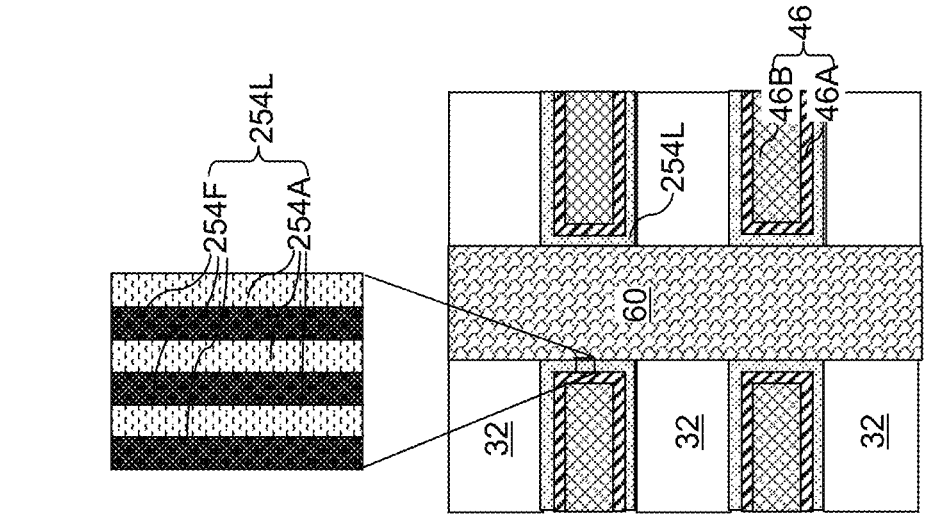
Figure 25D:
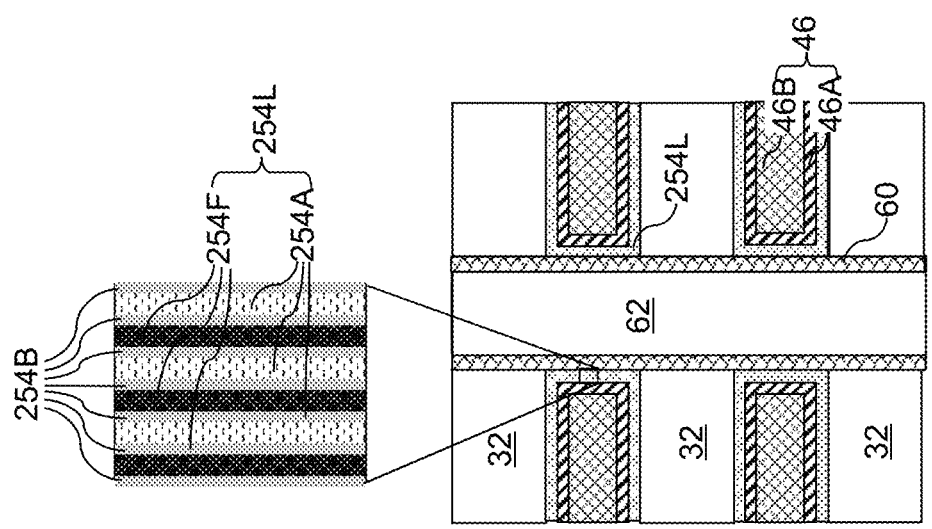

Referring to FIG. 25D, a first alternative configuration of the sixth exemplary memory opening fill structure for the sixth exemplary structure is illustrated. The first alternative configuration of the sixth exemplary memory opening structure can be derived from the sixth exemplary memory opening fill structure illustrated in FIG. 25C by modifying the dielectric layer stack 254L illustrated in FIG. 25B by inserting at least one metallic barrier layer 254B between neighboring pairs of a ferroelectric material layer 254F and an antiferroelectric material layer 254A. Each metallic barrier layer 254B comprises and/or consists essentially of a material selected from TiN, TaN, Ti, Ta, Ru or alloys thereof. Each metallic barrier layer 254B can be formed by a conformal deposition process such as chemical vapor deposition, and can have a thickness in a range from 0.3 nm to 1 nm, although lesser and greater thicknesses can also be employed. In one embodiment, the total number of the metallic barrier layer(s) 254B can be the same as the total number of the ferroelectric material layers 254F. In another embodiment, the total number of the metallic barrier layer(s) 254B can be greater than the total number of the ferroelectric material layers 254F by 1. In yet another embodiment, the total number of the metallic barrier layer(s) 254B can be less than the total number of the ferroelectric material layers 254F by 1.

Referring to FIG. 25E, a second alternative configuration for the sixth exemplary structure is illustrated, which can be derived from the sixth exemplary structure of FIG. 25C by employing the memory opening fill structure of FIG. 24C in lieu of the memory opening fill structure of FIG. 24B.

Referring to FIG. 25F, a third alternative configuration for the sixth exemplary structure is illustrated, which can be derived from the first alternative configuration of the sixth exemplary structure of FIG. 25D by employing the memory opening fill structure of FIG. 24C in lieu of the memory opening fill structure of FIG. 24B.

Subsequently, the processing steps of FIGS. 11A, 11B, 12, 13A, and 13B can be performed.

Referring to FIG. 26A, a seventh exemplary structure according to a seventh embodiment of the present disclosure is illustrated, which can be the same as the fifth exemplary structure illustrated in FIG. 22A. Each memory opening fill structure can include a cylindrical layer stack of at least one ferroelectric material layer 154F and at least one antiferroelectric material layer 154A.

Referring to FIG. 26B, the processing steps of FIG. 25B can be performed to form a continuous layer stack (254F, 254A) that includes at least one ferroelectric material layer 254F and at least one antiferroelectric material layer 254A. The continuous layer stack (254F, 254A) includes dielectric layer stacks 254L, which are portions of the continuous layer stack (254F, 254A) that are located within a respective one of the backside recesses 43.

Referring to FIG. 26C, the processing steps of FIG. 25C can be performed to form an electrically conductive layer 46 within each remaining volume of the backside recesses 43.

Figure 26D:
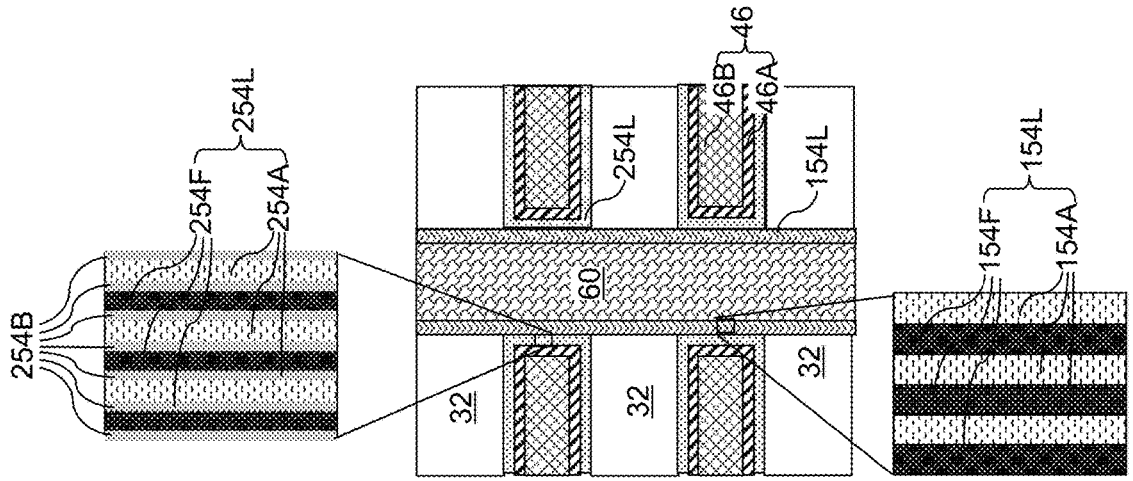
FIGS. 26D-26F are vertical cross-sectional views of alternative configurations of the sixth exemplary structure after replacement of the sacrificial material layers with dielectric layer stacks and electrically conductive layers according to the seventh embodiment of the present disclosure.

Referring to FIG. 26D, a first alternative embodiment of the seventh exemplary structure can be derived from the seventh exemplary structure of FIG. 26C by performing the processing steps of FIG. 25D in lieu of the processing steps of FIGS. 25B and 25C. In other words, the dielectric layer stack 254L includes at least one metallic barrier layer 254B between neighboring pairs of a ferroelectric material layer 254F and an antiferroelectric material layer 254A. Each metallic barrier layer 254B comprises, and/or consists essentially of, a material selected from TiN, TaN, Ti, Ta, Ru or alloys thereof. Each metallic barrier layer 254B can be formed by a conformal deposition process such as chemical vapor deposition, and can have a thickness in a range from 0.3 nm to 1 nm, although lesser and greater thicknesses can also be employed. In one embodiment, the total number of the metallic barrier layer(s) 254B can be the same as the total number of the ferroelectric material layers 254F. In another embodiment, the total number of the metallic barrier layer(s) 254B can be greater than the total number of the ferroelectric material layers 254F by 1. In yet another embodiment, the total number of the metallic barrier layer(s) 254B can be less than the total number of the ferroelectric material layers 254F by 1.

Figure 26E:
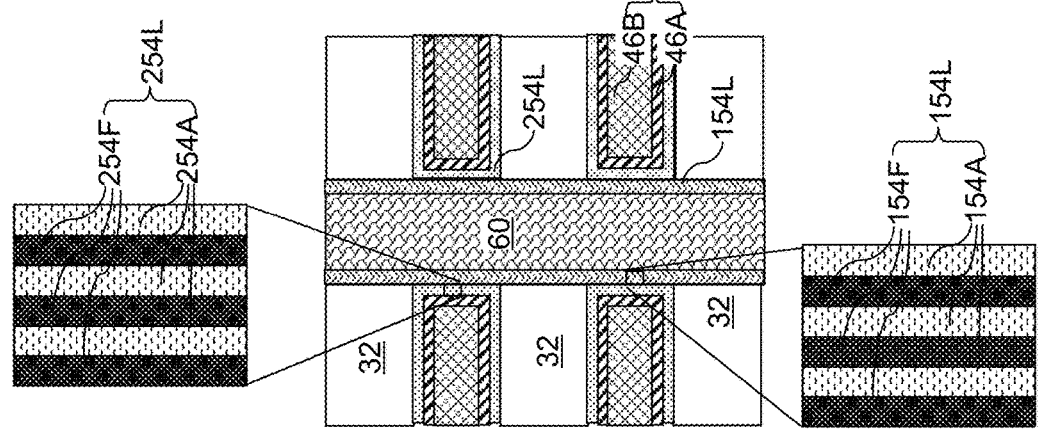

Referring to FIG. 26E, a second alternative configuration for the seventh exemplary structure is illustrated, which can be derived from the seventh exemplary structure of FIG. 25C by employing the memory opening fill structure of FIG. 20E in lieu of the memory opening fill structure of FIG. 20C.

Figure 26F:
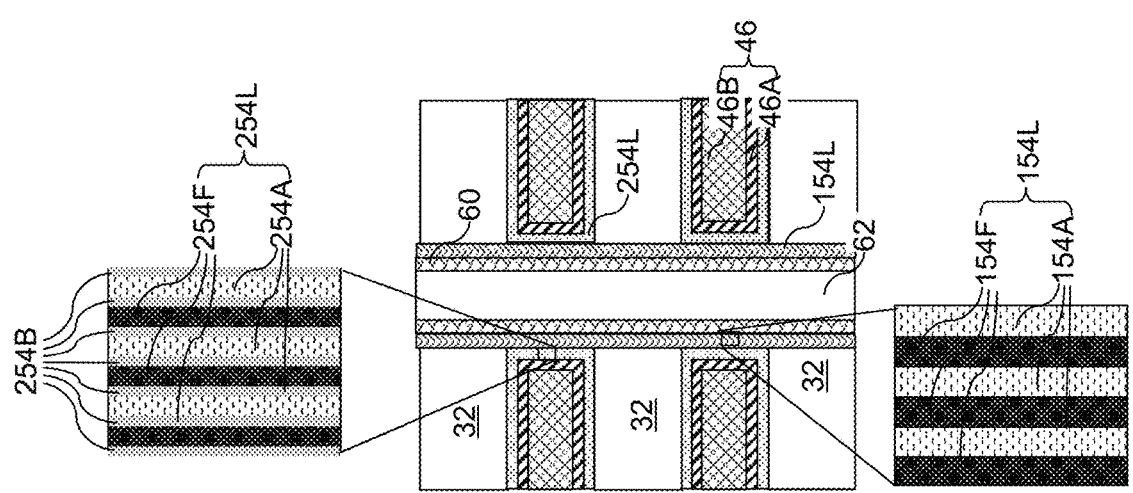

Referring to FIG. 26F, a third alternative configuration for the seventh exemplary structure is illustrated, which can be derived from the first alternative configuration of the seventh exemplary structure of FIG. 25D by employing the memory opening fill structure of FIG. 20E in lieu of the memory opening fill structure of FIG. 20C.

Subsequently, the processing steps of FIGS. 11A, 11B, 12, 13A, and 13B can be performed.

Referring to FIG. 27A, an eighth exemplary structure according to a eighth embodiment of the present disclosure is illustrated, which can be derived from the fifth exemplary structure illustrated in FIG. 22A by employing the memory opening fill structure of FIG. 22D in lieu of the memory opening fill structure of FIG. 20A. Each memory opening fill structure can include a cylindrical layer stack of at least one ferroelectric material layer 154F and at least one antiferroelectric material layer 154A.

Referring to FIG. 25B, the processing steps of FIG. 25B can be performed to form a continuous layer stack (254F, 254A) that includes at least one ferroelectric material layer 254F and at least one antiferroelectric material layer 254A. The continuous layer stack (254F, 254A) includes dielectric layer stacks 254L, which are portions of the continuous layer stack (254F, 254A) that are located within a respective one of the backside recesses 43.

Referring to FIG. 27C, the processing steps of FIG. 25C can be performed to form an electrically conductive layer 46 within each remaining volume of the backside recesses 43.

Figure 27F:
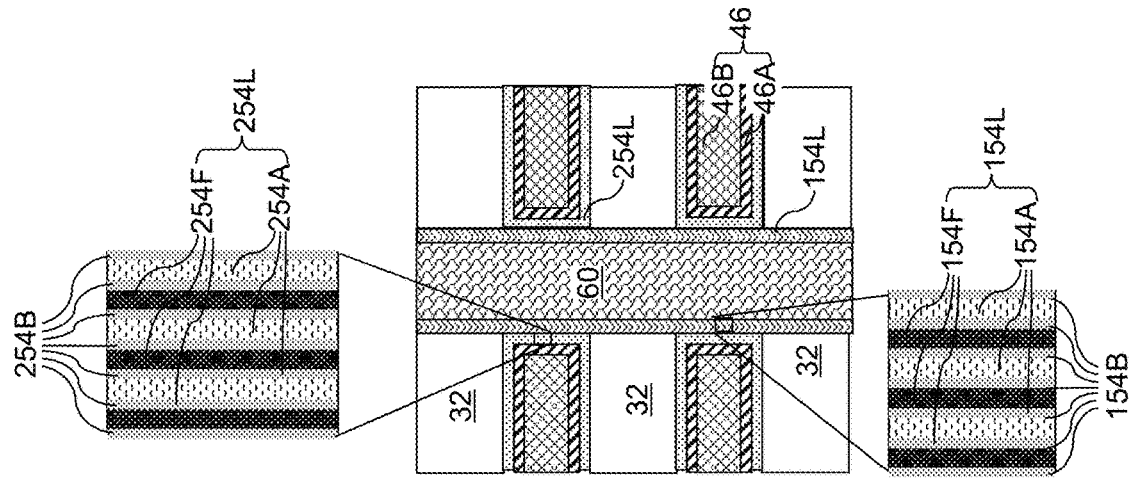
FIGS. 27D-27F are vertical cross-sectional views of alternative configurations of the sixth exemplary structure after replacement of the sacrificial material layers with dielectric layer stacks and electrically conductive layers according to the eighth embodiment of the present disclosure.
Figure 27E:
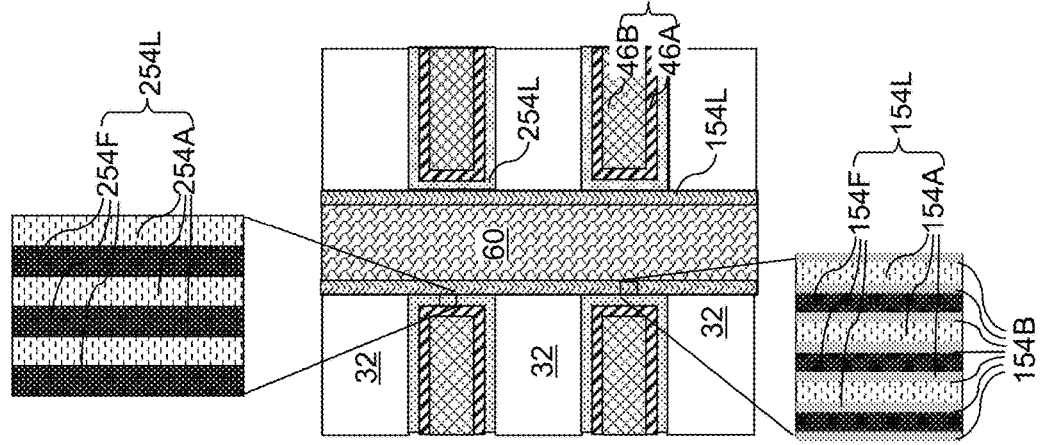
Figure 27D:
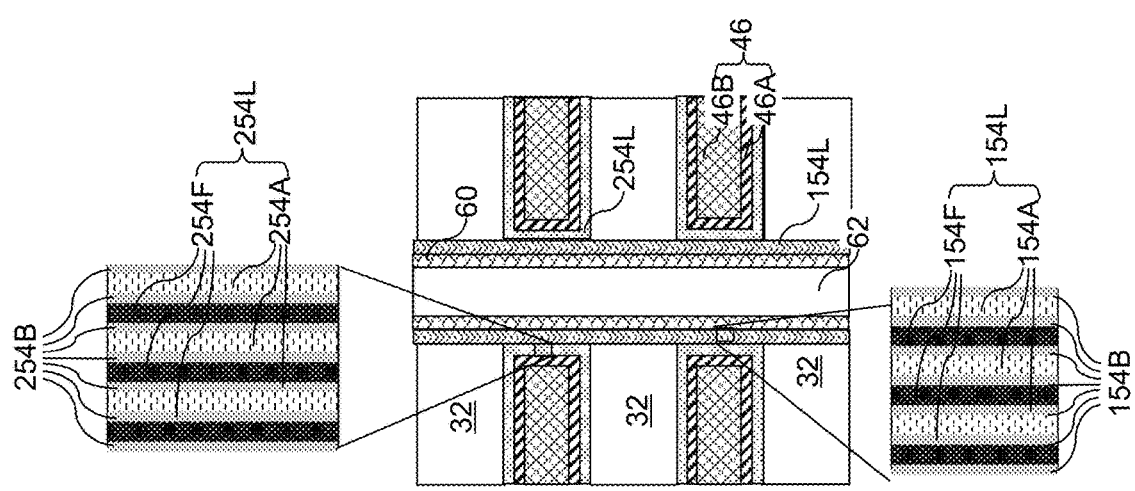

Referring to FIG. 27D, a first alternative embodiment of the eighth exemplary structure can be derived from the eighth exemplary structure of FIG. 27C by performing the processing steps of FIG. 25D in lieu of the processing steps of FIGS. 25B and 25C. In other words, the dielectric layer stack 254L includes at least one metallic barrier layer 254B between neighboring pairs of a ferroelectric material layer 254F and an antiferroelectric material layer 254A. Each metallic barrier layer 254B comprises, and/or consists essentially of, a material selected from TiN, TaN, Ti, Ta, Ru or alloys thereof.

Referring to FIG. 27E, a second alternative configuration for the eighth exemplary structure is illustrated, which can be derived from the eighth exemplary structure of FIG. 27C by employing the memory opening fill structure of FIG. 20F in lieu of the memory opening fill structure of FIG. 20D.

Referring to FIG. 27F, a third alternative configuration for the eighth exemplary structure is illustrated, which can be derived from the first alternative configuration of the eighth exemplary structure of FIG. 27D by employing the memory opening fill structure of FIG. 20F in lieu of the memory opening fill structure of FIG. 20D.

Subsequently, the processing steps of FIGS. 11A, 11B, 12, 13A, and 13B can be performed.

Figure 28A:
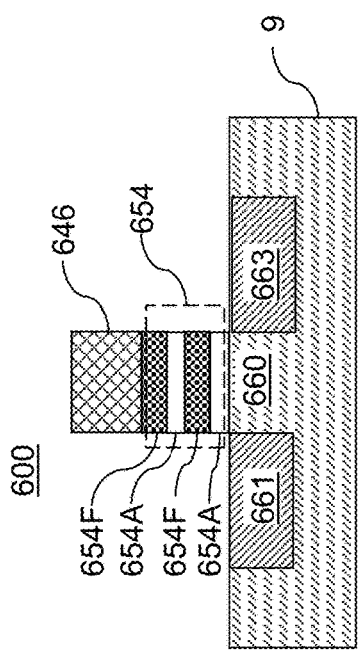
FIGS. 28A-28B are vertical cross-sectional views of a two dimensional exemplary structure according to ninth and tenth embodiments of the present disclosure.

FIG. 28A illustrates a two dimensional memory device according to a ninth embodiment of the present disclosure. In the ninth embodiment, the memory device is a ferroelectric memory transistor 600 containing at least one ferroelectric layer 654F and at least one antiferroelectric layer 654A between the semiconductor channel and the gate electrode. In this embodiment, the transistor 600 contains a horizontal semiconductor channel 660 in or over a semiconductor substrate 9, such as a silicon wafer. For example, the horizontal channel 660 may be a region in the top portion of the silicon wafer, a doped well in the silicon wafer or an epitaxial layer in the silicon wafer. The channel 660 is located between a source region 661 and a drain region 663, which are doped regions in the semiconductor substrate 9. A gate electrode 646 is located above the channel 660. A ferroelectric memory cell 654 is located between the gate electrode 646 and the channel 600. The ferroelectric memory cell 654 comprises a vertical stack including, from one side to another, at least one ferroelectric material layer 654F (e.g., two layers 654F), and at least one antiferroelectric material layer 654A (e.g., two layers 654A). The materials of the vertical stack may be the same as those described for the fifth through eighths embodiments. The metallic barrier portion(s) 154B or 254B described above with respect to the prior embodiments may be included or omitted in this ninth embodiment.

Figure 28B:
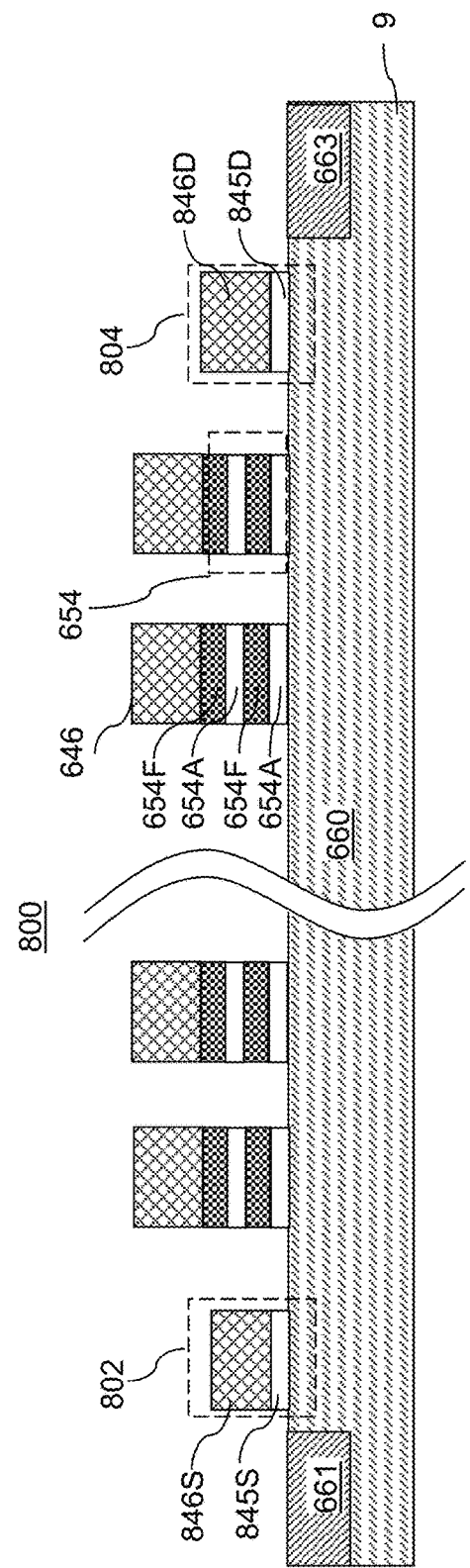

FIG. 28B illustrates a two dimensional memory device according to a tenth embodiment of the present disclosure. In this embodiment, the memory device 800 is a horizontal (i.e., two-dimensional) NAND memory string. The memory device 800 is similar to the transistor 600 of the ninth embodiment, except that it contains a plurality of gate electrodes 646 and a plurality of ferroelectric memory cells 654 between the source and drain regions (661, 663). The memory device 800 may also include a source select transistor 802 containing a source select gate electrode 846S and a gate dielectric 845S adjacent to the source region 661 and a drain select transistor 804 containing a drain select gate electrode 846D and a gate dielectric 845D adjacent to the drain region 663. The metallic barrier portion(s) 154B or 254B described above with respect to the prior embodiments may be included or omitted in this tenth embodiment.

Figure 29:
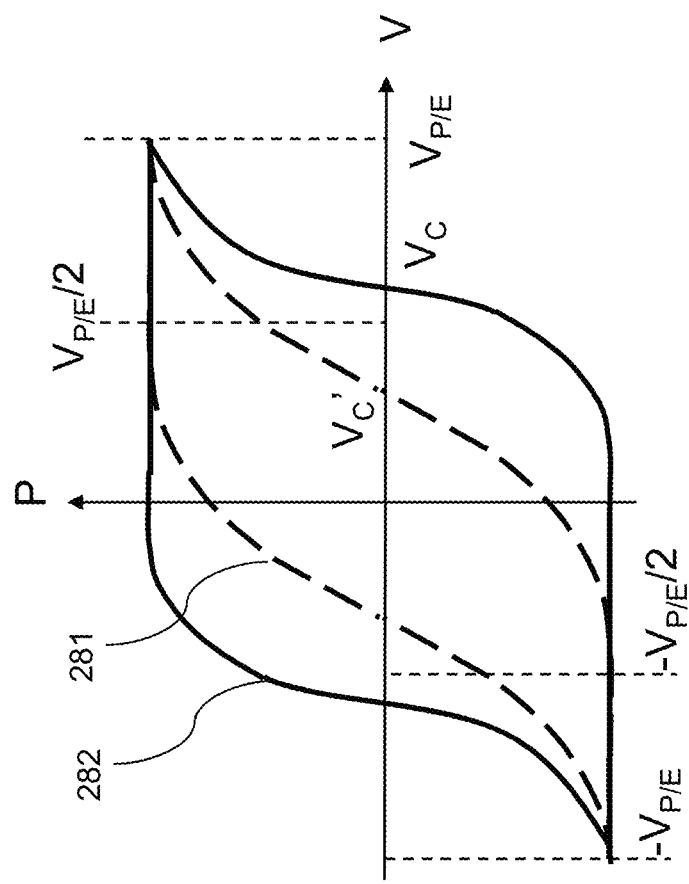
FIG. 29 is a schematic illustration of hysteresis curve of electrical polarization of a ferroelectric memory element of various embodiments of the present disclosure and of a comparative exemplary ferroelectric memory element.

Referring to FIG. 29, a first hysteresis curve 281 and a second hysteresis curve 282 for electrical polarization P are illustrated as a function of applied voltage V which generates an electric field. The first hysteresis curve 281 represents the hysteresis curve for a single ferroelectric material layer of a comparative memory device, and the second hysteresis curve 282 represents the hysteresis curve for an alternating stack of at least one ferroelectric material layer (154F, 254F and/or 654F) and at least one antiferroelectric material layer (154A, 254A and/or 654A) of the embodiments of the present disclosure. Generally, the program/erase disturb voltage across a ferroelectric memory element in an array configuration can be one half of the programming/erase voltage $V_{PE}$. In the comparative memory device containing a single ferroelectric material layer, one half of the programming/erase voltage $V_{PE}$ voltage is sufficient to undesirably trigger switching of the polarity of a ferroelectric memory element as illustrated by the first hysteresis curve 281. However, a ferroelectric memory element employing the alternating stack of at least one ferroelectric material layer (154F, 254F and/or 654F) and at least one antiferroelectric material layers (154A, 254A and/or 654A) of the embodiments of the present disclosure does not reverse the polarity of the polarization upon application of the disturb voltage which equals to one half of the programming/erase voltage $V_{PE}$. In other words, the coercive voltage Vc' for the comparative memory device may be than one half of the programming/erase voltage $V_{PE}$, and the coercive voltage Vc for ferroelectric memory element employing the alternating stack of at least one ferroelectric material layer (154F, 254F and/or 654F) and at least one antiferroelectric material layers (154A, 254A and/or 654A) of the embodiments of the present disclosure may be greater than one half of the programming/erase voltage $V_{PE}$.

Referring to FIGS. 20A to 29 and according to the fifth through tenth embodiments of the present disclosure, a ferroelectric memory device includes a semiconductor channel (60, 660), a gate electrode (46, 646), and a ferroelectric memory element (154L, 254L, 654) located between the semiconductor channel and the gate electrode. The ferroelectric memory element includes at least one ferroelectric material portion (154F, 254F, 654F) and at least one antiferroelectric material portion (154A, 254A, 654A).

In the fifth through eighth embodiments illustrated in FIGS. 20A to 27F, the ferroelectric memory device comprises a three-dimensional ferroelectric memory device which includes an alternating stack of insulating layers 32 and electrically conductive layers 46 located over a substrate (9, 10), the gate electrode 46 comprises one of the electrically conductive layers 46. A memory opening 49 vertically extends through the alternating stack (32, 46), wherein the semiconductor channel 60 comprises a vertical semiconductor channel 60 located within the memory opening 49. The ferroelectric memory element comprises one of ferroelectric memory elements (e.g., layer stack 154L, 254L) located at levels of the electrically conductive layers 46, wherein each of the ferroelectric memory elements comprises a respective set of at least one ferroelectric material portion (each of which can be a cylindrical segment of a ferroelectric material layer 154F and/or 254F) and at least one antiferroelectric material portion (each of which can be a cylindrical segment of an antiferroelectric material layer 154A and/or 254A).

In one embodiment, the at least one ferroelectric material portion comprises at least two ferroelectric material portions that are laterally spaced from each other by the at least one antiferroelectric material portion within the ferroelectric memory element.

In one embodiment, the ferroelectric memory device further comprises a cylindrical layer stack 154L including at least one ferroelectric material layer 154F and at least one antiferroelectric material layer 154A and located within the memory opening 49, wherein each of the ferroelectric memory elements comprises a respective segment of the cylindrical layer stack 154L. In one embodiment, the entirety of an outer sidewall of the vertical semiconductor channel 60 contacts an inner sidewall of the cylindrical layer stack 154L.

In one embodiment, ferroelectric memory device comprises dielectric layer stacks 254L located outside the memory opening 49 at each level of the electrically conductive layers 46, wherein each of the dielectric layer stacks 254L includes at least one ferroelectric material layer 254F and at least one antiferroelectric material layer 254A, and wherein each of the ferroelectric memory elements comprises a cylindrical segment of a respective one of the dielectric layer stacks 254L that laterally surrounds the memory opening 49.

In one embodiment, each of at least one ferroelectric material layer 254F and at least one antiferroelectric material layer 254A can be formed within a respective one of the backside recesses 43, and can include a respective cylindrical segment that is a portion of a respective one of the ferroelectric memory elements, a respective upper horizontally-extending portion adjoined to an upper end of the respective cylindrical segment, and a respective lower horizontally-extending portion adjoined to a lower end of the respective cylindrical segment.

In one embodiment, the ferroelectric memory device can comprise a cylindrical layer stack 154L including at least one additional ferroelectric material layer 154F and at least one additional antiferroelectric material layer 154A and located within the memory opening 49, wherein each of the ferroelectric memory elements further comprises a respective segment of the cylindrical layer stack 154L.

In one embodiment, the ferroelectric memory device comprises: additional memory openings 49 vertically extending through the alternating stack (32, 46); additional vertical semiconductor channels 60 located within a respective one of the additional memory openings 49; and additional ferroelectric memory elements located at levels of the electrically conductive layers 46 around or within the additional memory openings 49, wherein each of the additional ferroelectric memory elements comprises a respective additional set of at least one ferroelectric material portion and at least one antiferroelectric material portion.

In one embodiment, each of the ferroelectric memory elements comprises at least one metallic barrier layer (154B and/or 254B) located between at least one neighboring pair of a ferroelectric material portion and an antiferroelectric material portion within a respective ferroelectric memory element. In one embodiment, the at least one metallic barrier layer (154B and/or 254B) comprises a material selected from TiN, TaN, Ti, Ta, Ru or alloys thereof.

In one embodiment, the at least one ferroelectric material portion has a material composition of $Hf_xZr_{1-x}O_2$, where $0.3<x<0.7$; and the at least one antiferroelectric material portion has a material composition of $Hf_yZr_{1-y}O_2$, where $0<y<0.3$. In another embodiment, the at least one ferroelectric material portion has a material composition of $Hf_xSi_{1-x}O_2$, where $0.94<x<0.97$; and the at least one antiferroelectric material portion has a material composition of $Hf_ySi_{1-y}O_2$, where $0<y<94$. In another embodiment, the at least one ferroelectric material portion has a material composition of $Hf_xAl_{4(1-x)/3}O_2$, where $0.93<x<0.97$; and the at least one antiferroelectric material portion has a material composition of $Hf_yAl_{4(1-y)/3}O_2$, and where $0<y<0.93$.

In one embodiment, the respective set of at least one ferroelectric material portion and at least one antiferroelectric material portion comprises an alternating sequence of at least two ferroelectric material portions and at least two antiferroelectric material portions.

The various embodiments of the present disclosure that employ more than two ferroelectric material layers (154F, 254F, 654F) within a ferroelectric memory element provides the advantage of enhanced ferroelectric properties because thinner ferroelectric material layers exhibit stronger ferroelectric behavior compared to a single ferroelectric material layer having the same total thickness due to favorable grain structure within the thinner ferroelectric material layers.

Figure 30:
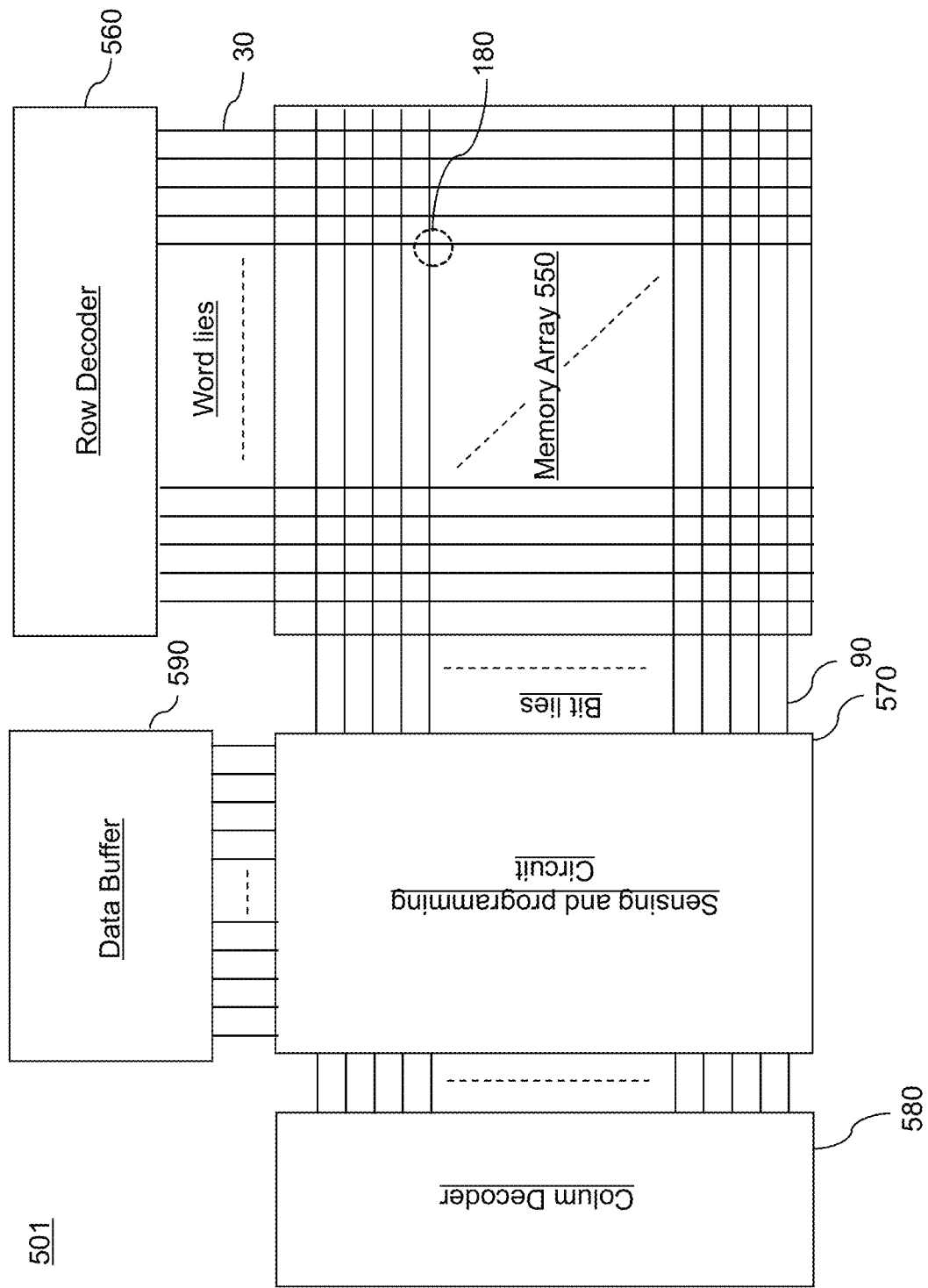
FIG. 30 is a schematic diagram of a random access array of antiferroelectric tunnel junction devices according to an eleventh embodiment of the present disclosure.

FIG. 30 is a schematic diagram of a random access memory device 501 of antiferroelectric tunnel junction cells 180 according to an embodiment of the present disclosure. As used herein, a "random access memory device" refers to a memory device including memory cells that allow random access, i.e., access to any selected memory cell upon a command for reading the contents of the selected memory cell.

The random access memory device 501 of the embodiments of the present disclosure may comprise a two-dimensional array of antiferroelectric memory devices or a three-dimensional array of antiferroelectric memory devices. The random access memory device 501 includes a memory array region 550 containing an array of the respective antiferroelectric devices, such as antiferroelectric tunnel junction cells 180 located at intersections of word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). For example, the first electrically conductive lines 30 may be electrically connected to, and/or may comprise, bottom electrodes of a respective row of antiferroelectric tunnel junction cells 180 in the memory array region 550, while the second electrically conductive lines 90 may be electrically connected to, and/or may comprise, top electrodes of a respective column of antiferroelectric tunnel junction cells 180 in the memory array region 550.

The random access memory device 501 may also contain a row decoder 560 connected to the word lines, a sensing and programming circuit 570 (which may include sense amplifiers, programming transistors, and control circuits) connected to the bit lines, a column decoder 580 connected to the bit lines, and a data buffer 590 connected to the sense circuitry. The sensing and programming circuit 570 can be configured to individually program each of the antiferroelectric tunnel junction cells 180 by applying electrical pulses of opposite polarity types, i.e., a first electrical pulse that applies a positive bias to a respective first electrically conductive line 30 relative to a respective second electrically conductive line 90, and a second electrical pulse that applies a negative bias to the respective first electrically conductive line 30 relative to the respective second electrically conductive line 90. Further, the sensing and programming circuit 570 can be configured to measure the tunneling resistance of each of the antiferroelectric tunnel junction cells 180 by applying a bias voltage of one polarity at a lower magnitude than the magnitudes of the programming pulses so that the electrical state (i.e., the remanent electrical polarization and thus, the tunneling resistance) of each antiferroelectric tunnel junction cell 180 can be measured. The antiferroelectric tunnel junction cells 180 are provided in an array configuration that forms the random access memory device 501. In one embodiment, the antiferroelectric tunnel junction cells 180 may be provided as a rectangular array. As such, each of the antiferroelectric tunnel junction cells 180 can be a two-terminal device including a respective first electrode and a respective second electrode. It should be noted that the location and interconnection of elements are schematic, and the elements may be arranged in a different configuration. Further, a antiferroelectric tunnel junction cell 180 may be manufactured as a discrete device, i.e., a single isolated device. The random access configuration illustrated in the random access memory device 501 is only exemplary, and the antiferroelectric tunnel junction cells 180 of the embodiments of the present disclosure can be connected in different interconnection configurations.

Figure 31A:
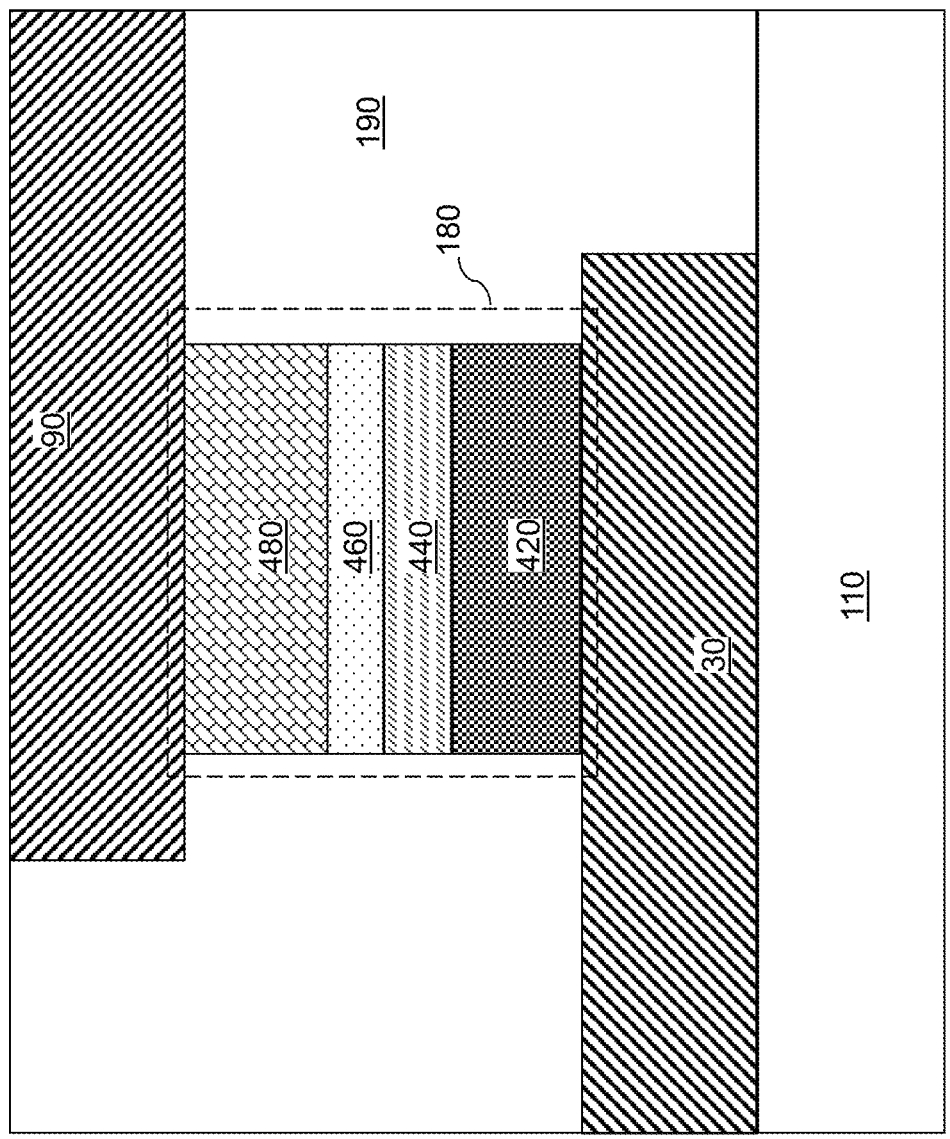
FIG. 31A is a vertical cross-sectional view of a seventh exemplary structure according to the twelfth embodiment of the present disclosure.

Referring to FIGS. 31A and 31B, configurations of a seventh exemplary structure including an antiferroelectric tunnel junction cell 180 are illustrated. The configuration of FIG. 31A and the configuration of FIG. 31B are alternative configurations that may be derived from each other by reversing the order of material deposition during formation of an antiferroelectric tunnel junction cell 180, which is a antiferroelectric memory device.

The seventh exemplary structure includes substrate 110. The substrate may include an optional dielectric material layer such as undoped silicate glass, a doped silicate glass, organosilicate glass, silicon nitride, a dielectric metal oxide, or a combination thereof. In one embodiment, the substrate 110 comprises an insulating substrate, such as a ceramic or a glass substrate. In another embodiment, the dielectric material layer can be provided over a semiconductor substrate 110, such as a silicon substrate (not shown) with semiconductor devices (not shown) such as field effect transistors or other driver (i.e., peripheral) devices thereupon. In this case, the dielectric material layer may include a plurality of interconnect-level dielectric material layers embedding metal interconnect structures therein. The metal interconnect structures can provide electrical connection between the semiconductor devices and the first electrically conductive lines 30 and the second electrically conductive lines 90 that are formed above the dielectric material layer. In this case, structural elements that are formed above the dielectric material layer may be embedded within a dielectric matrix (not expressly shown) that embeds the first electrically conductive lines 30 and the second electrically conductive lines 90. Alternatively, the first electrically conductive lines 30 may be formed directly on a silicon substrate (e.g., silicon wafer) 110.

The first electrically conductive lines 30 may be formed over the top surface of the substrate 110 by depositing and patterning at least one metallic layer and patterning the at least one metallic layer into line-shaped structures that laterally extend along a first horizontal direction. In one embodiment, the at least one metallic layer may include a stack of a metallic barrier layer including a conductive metallic nitride and a high-electrical-conductivity metal layer such a copper layer or a tungsten layer. Alternatively, the first electrically conductive lines 30 may comprise a heavily doped semiconductor material, such as heavily doped polysilicon. Alternatively, line cavities may be formed in an upper portion of the dielectric material layer, and the first electrically conductive lines 30 may be formed by a damascene method in which at least one metallic material is deposited in the line cavities, and excess portions of the at least one metallic material is removed from above the horizontal plane including the top surface of the dielectric material layer. Each portion of a first electrically conductive line 30 that contacts an overlying antiferroelectric tunnel junction cell 180 comprises a first electrode of the antiferroelectric tunnel junction cell 180, which is a antiferroelectric memory device.

A continuous layer stack can be deposited over the first electrically conductive lines 30. The continuous layer stack includes, from bottom to top or from top to bottom, an optional first continuous electrically conductive liner, a stack of a continuous doped semiconductor layer and a continuous antiferroelectric layer, and an optional second continuous electrically conductive liner. The continuous doped semiconductor layer may be formed below the continuous antiferroelectric layer, or may be formed above the continuous antiferroelectric layer.

The continuous antiferroelectric layer includes, and/or consists essentially of, an antiferroelectric material such as zirconium oxide ($ZrO_2$), hafnium zirconium oxide ($Hf_x Zr_{1-x} O_2$) (e.g., $Hf_y Zr_{1-y} O_2$, where $0.7 < y < 1$ or $0 < y < 0.3$), hafnium silicon oxide (e.g., $Hf_y Si_{1-y} O_2$, where $0 < y < 94$ or $1 > y > 0.97$), hafnium aluminum oxide (e.g., $Hf_y Al_{4(1-y)/3} O_2$, where $0 < y < 0.93$ or $1 > y > 0.97$), lead zirconate ($PbZrO_3$), ammonium dihydrogen phosphate ($NH_4H_2PO_4$), sodium niobate ($NaNbO_3$), lead lanthanum zirconate titanate (PLZT), silver niobate ($AgNbO_3$), silver calcium niobate ($Ag_{1-2x} Ca_x NbO_3$), or any other antiferroelectric material known in the art. The continuous antiferroelectric layer can be deposited by physical vapor deposition, chemical vapor deposition, or any other suitable deposition process known in the art. The thickness of the continuous antiferroelectric layer may be in a range from 0.5 nm to 5 nm, such as from 1 nm to 2 nm, although lesser and greater thicknesses may also be employed.

The continuous doped semiconductor layer includes an electrically doped semiconductor material, which may be a p-doped semiconductor material or an n-doped semiconductor material. The continuous doped semiconductor material layer contacts the continuous antiferroelectric layer. The material of the continuous doped semiconductor layer is employed as a symmetry-breaking material that generates intrinsic electrical field across the continuous antiferroelectric layer. In one embodiment, the continuous doped semiconductor layer comprises a semiconductor material selected from an elemental semiconductor material, an alloy of at least two elemental semiconductor materials, a III-V compound semiconductor material, a II-V compound semiconductor material, a metal oxide semiconductor material, or an organic semiconductor material. For example, the semiconductor material may comprise silicon, germanium, gallium arsenide, gallium nitride, niobium doped strontium titanate, etc. In one embodiment, the continuous doped semiconductor layer can include a heavily doped semiconductor material having electrical conductivity type greater than $1.0 \times 10^5$ S/m. The thickness of the continuous doped semiconductor layer may be in a range from 0.5 nm to 5 nm, such as from 1 nm to 2 nm, although lesser and greater thicknesses may also be employed.

The first continuous electrically conductive liner, if present, may include a conductive metallic material such as TiN, TaN, and/or WN. The thickness of the first continuous electrically conductive liner may be in a range from 1 nm to 20 nm, such as from 2 nm to 10 nm, although lesser and grater thicknesses may also be employed.

The second continuous electrically conductive liner, if present, may include a conductive metallic material such as TiN, TaN, and/or WN. The thickness of the second continuous electrically conductive liner may be in a range from 1 nm to 20 nm, such as from 2 nm to 10 nm, although lesser and grater thicknesses may also be employed.

A photoresist layer (not shown) can be applied over the continuous layer stack, and can be lithographically patterned to form a two-dimensional array of discrete patterned photoresist material portions. An etch process, such as an anisotropic etch process, can be performed to transfer the pattern in the two-dimensional array of decree patterned photoresist material portions through the continuous layer stack. The continuous layer stack can be patterned into a two-dimensional array of pillar structures. Each of the pillar structures may include an antiferroelectric tunnel junction cell 180.

Each patterned portion of the an optional first continuous electrically conductive liner comprises a first electrically conductive liner 420. Each patterned portion of the continuous doped semiconductor layer comprises a doped semiconductor layer 440. Each patterned portion of the continuous antiferroelectric layer comprises an antiferroelectric layer 460. Each patterned portion of the second continuous electrically conductive liner comprises a second electrically conductive liner 480.

A dielectric matrix layer 190 may be deposited over, and around, the array of antiferroelectric tunnel junction cells 180. The dielectric matrix layer 190 includes a dielectric material such as silicon nitride, silicon oxide, organosilicate glass, and/or a dielectric metal oxide. In one embodiment, the dielectric matrix layer 190 may include a dielectric diffusion barrier liner (such as a silicon nitride liner) and a dielectric fill material (such as silicon oxide). The dielectric matrix layer 190 may be planarized to provide a horizontal top surface above a horizontal plane including the top surfaces of the antiferroelectric tunnel junction cells 180. For example, chemical mechanical planarization (CMP) may be employed to planarize the top surface of the dielectric matrix layer 190.

Line cavities that laterally extend along a second horizontal direction can be formed in an upper portion of the dielectric matrix layer 190. The second horizontal direction is different from the first horizontal direction, and may be perpendicular to the first horizontal direction. At least one conductive material can be deposited in the line cavities, and excess portions of the at least one conductive material can be removed from above the horizontal plane including the top surface of the dielectric matrix layer 190. Each remaining portion of the at least one conductive material filling the line cavities comprises a second electrically conductive line 90. Each second electrically conductive line 90 can comprise at least one second electrode of the two-dimensional array of antiferroelectric tunnel junction cells 180.

Each contiguous set of a portion of a first electrically conductive line 30, an optional first electrically conductive liner 420, a doped semiconductor layer 440, an antiferroelectric layer 460, an optional second electrically conductive liner 480, and a portion of a second electrically conductive layer 90 constitutes an antiferroelectric tunnel junction cell 180. The optional first electrically conductive liner 420, if present, comprise a first electrode. In case the first electrically conductive liner 420 is not present, a portion of the first electrically conductive line 30 contacting one of the doped semiconductor layer 440 and the antiferroelectric layer 460 comprises the first electrode. The optional second electrically conductive liner 480, if present, comprises a second electrode. In case the second electrically conductive liner 480 is not present, a portion of the second electrically conductive line 90 contacting one of the doped semiconductor layer 440 and the antiferroelectric layer 460 comprises the second electrode.

In one embodiment, each first electrically conductive line 30 can contact a respective row of antiferroelectric tunnel junction cells 180, and each second electrically conductive line 90 can contact a respective column of antiferroelectric tunnel junction cells 180. In this case, each first electrically conductive line 30 can comprise a row of first electrodes, and each second electrically conductive line 90 can comprise a column of second electrodes.

In FIG. 31A, the doped semiconductor layer 440 is located below the antiferroelectric layer 460. In one alternative embodiment, the doped semiconductor layer 440 may be heavily doped with p-type dopants, and the second electrically conductive liner 480 may include a bottommost layer containing a heavily n-doped semiconductor material. Alternatively, the doped semiconductor layer 440 may be heavily doped with n-type dopants, and the second electrically conductive liner 480 may include a bottommost layer containing a heavily p-doped semiconductor material.

In FIG. 31B, the doped semiconductor layer 440 is located above the antiferroelectric layer 460. In one alternative embodiment, the doped semiconductor layer 440 may be heavily doped with p-type dopants, and the first electrically conductive liner 420 may include a topmost layer containing a heavily n-doped semiconductor material. Alternatively, the doped semiconductor layer 440 may be heavily doped with n-type dopants, and the first electrically conductive liner 420 may include a topmost layer containing a heavily p-doped semiconductor material.

Figure 31C:
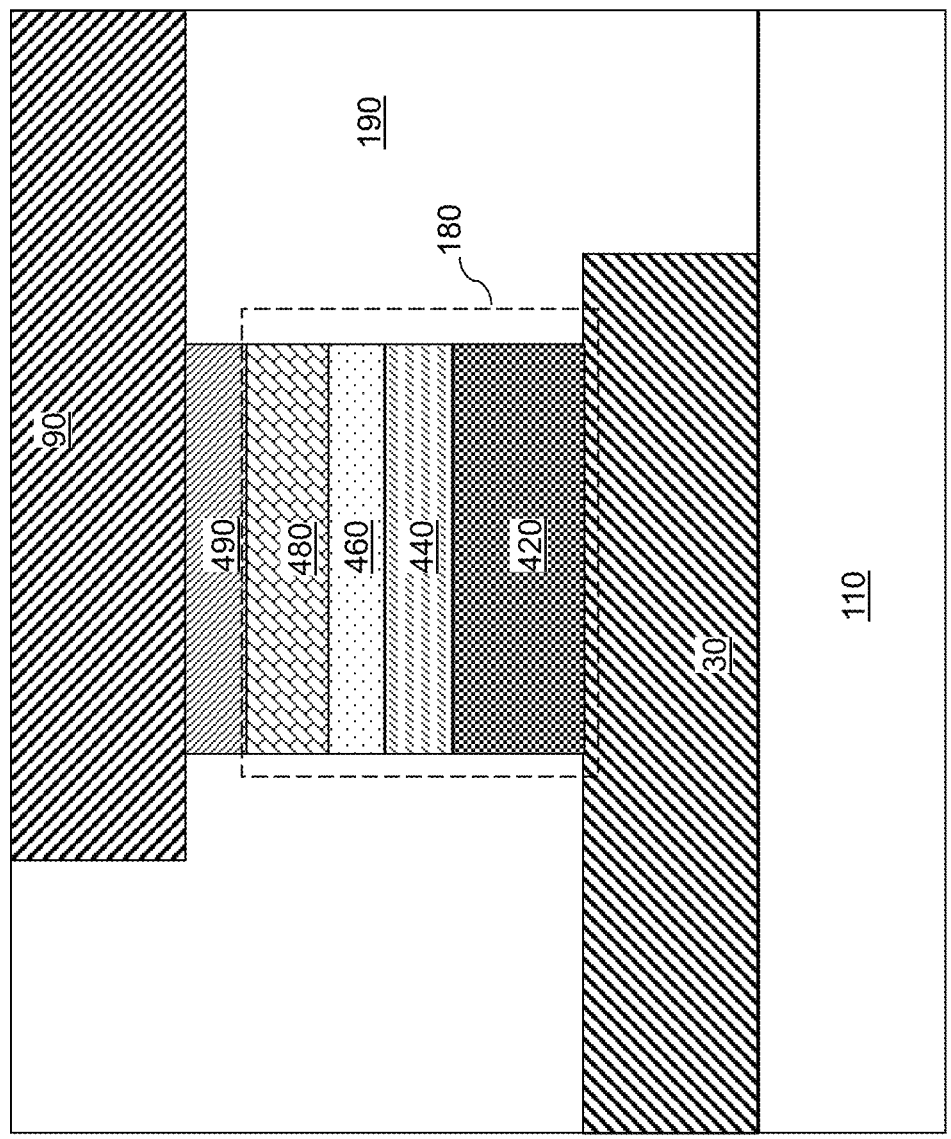
FIGS. 31C and 31D are a vertical cross-sectional view of alternative configurations of the seventh exemplary structure of FIGS. 31A and 31B, respectively, according to the twelfth embodiment of the present disclosure.
Figure 31D:
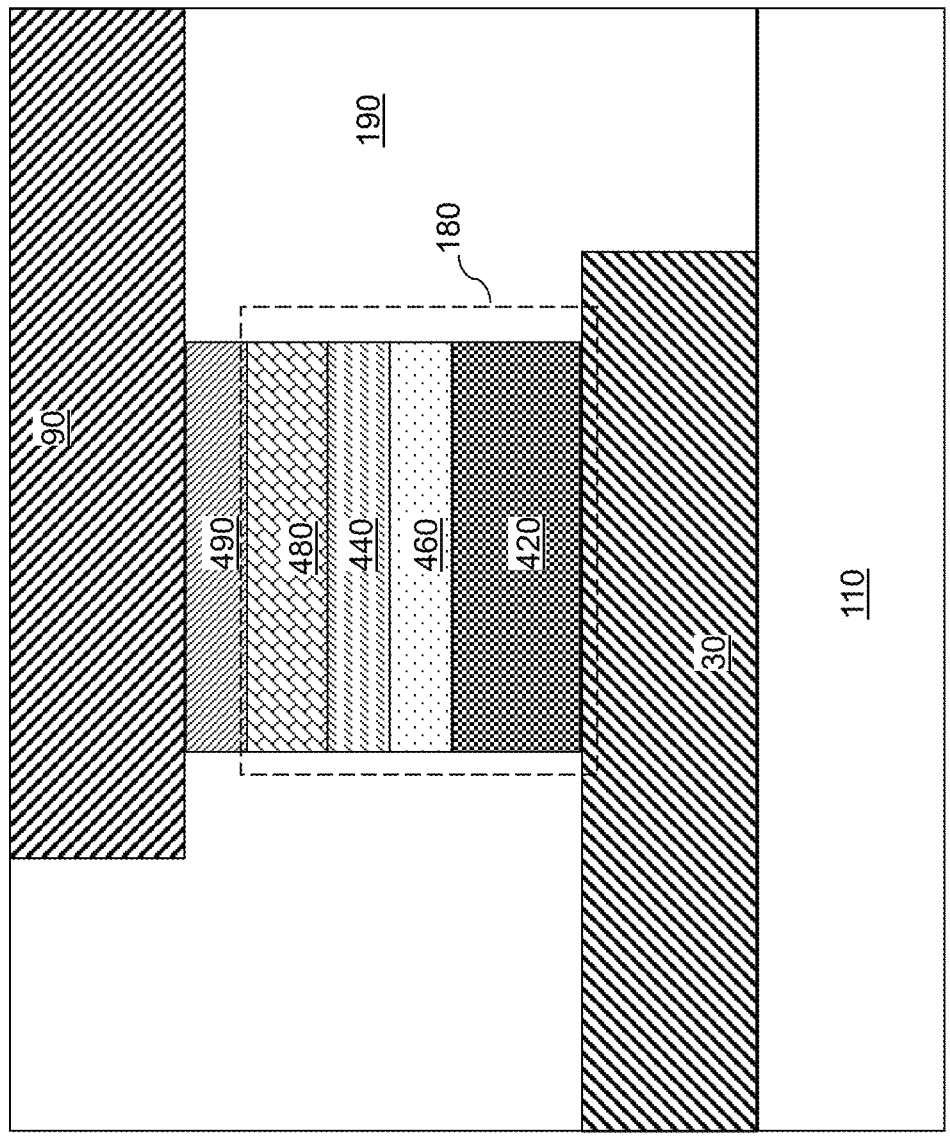

FIGS. 31C and 31D are a vertical cross-sectional view of alternative configurations of the seventh exemplary structure of FIGS. 31A and 31B, respectively, according to the twelfth embodiment of the present disclosure. The structures of FIGS. 31C and 31D include an additional steering element 490 in the stack between the first and second electrically conductive lines (30, 90). The steering element (e.g., selector element) 490 may comprise a diode or an Ovonic Threshold Switch (OTS). The steering element 490 may be located between the second electrically conductive line 90 and the stack of the doped semiconductor layer 440 and antiferroelectric layer 460 (e.g., between line 90 and liner 480). Alternatively, the steering element 490 may be located between the first electrically conductive line 30 and the stack of the doped semiconductor layer 440 and antiferroelectric layer 460

As used herein, an "ovonic threshold switch" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistivity state, and can remain non-crystalline (for example, remain amorphous) in a low resistivity state during application of a voltage above its threshold voltage across the OTS material. The OTS material can revert back to the high resistivity state when the high voltage above its threshold voltage is lowered below a critical holding voltage. Throughout the resistivity state changes, the ovonic threshold switch material can remain non-crystalline (e.g., amorphous).

In one embodiment, the ovonic threshold switch material can comprise a chalcogenide material which exhibits hysteresis in both the write and read current polarities. The chalcogenide material may be a GeTe compound or a Ge—Se compound doped with a dopant selected from As, N, and C, such as a Ge—Se—As compound semiconductor material. The ovonic threshold switch material layer can contain any ovonic threshold switch material. In one embodiment, the ovonic threshold switch material layer can include a compound of at least one Group 14 elements and at least one Group 16 element. In one embodiment, the ovonic threshold switch material layer can include, and/or can consist essentially of, a material selected from a GeSeAs alloy, a GeTeAs, a GeSeTeSe alloy, a GeSe alloy, a SeAs alloy, a GeTe alloy, and a SiTe alloy.

Referring to FIGS. 32A and 32B, energy band diagrams of layers within the seventh exemplary structure of FIG. 31A according to the twelfth embodiment of the present disclosure is illustrated. Similar band diagrams can be envisaged for the structures of FIGS. 31B-31D. In FIG. 32A, the doped semiconductor layer 440 is heavily (e.g., degenerately) doped p-type such that its Fermi level ($E_F$) is located in the valence band ($E_V$). In FIG. 32B, the doped semiconductor layer 440 is heavily (e.g., degenerately) doped n-type such that its Fermi level ($E_F$) is located in the conduction band ($E_C$). In alternative embodiments, non-degenerately doped semiconductor materials may be used.

Figure 33:
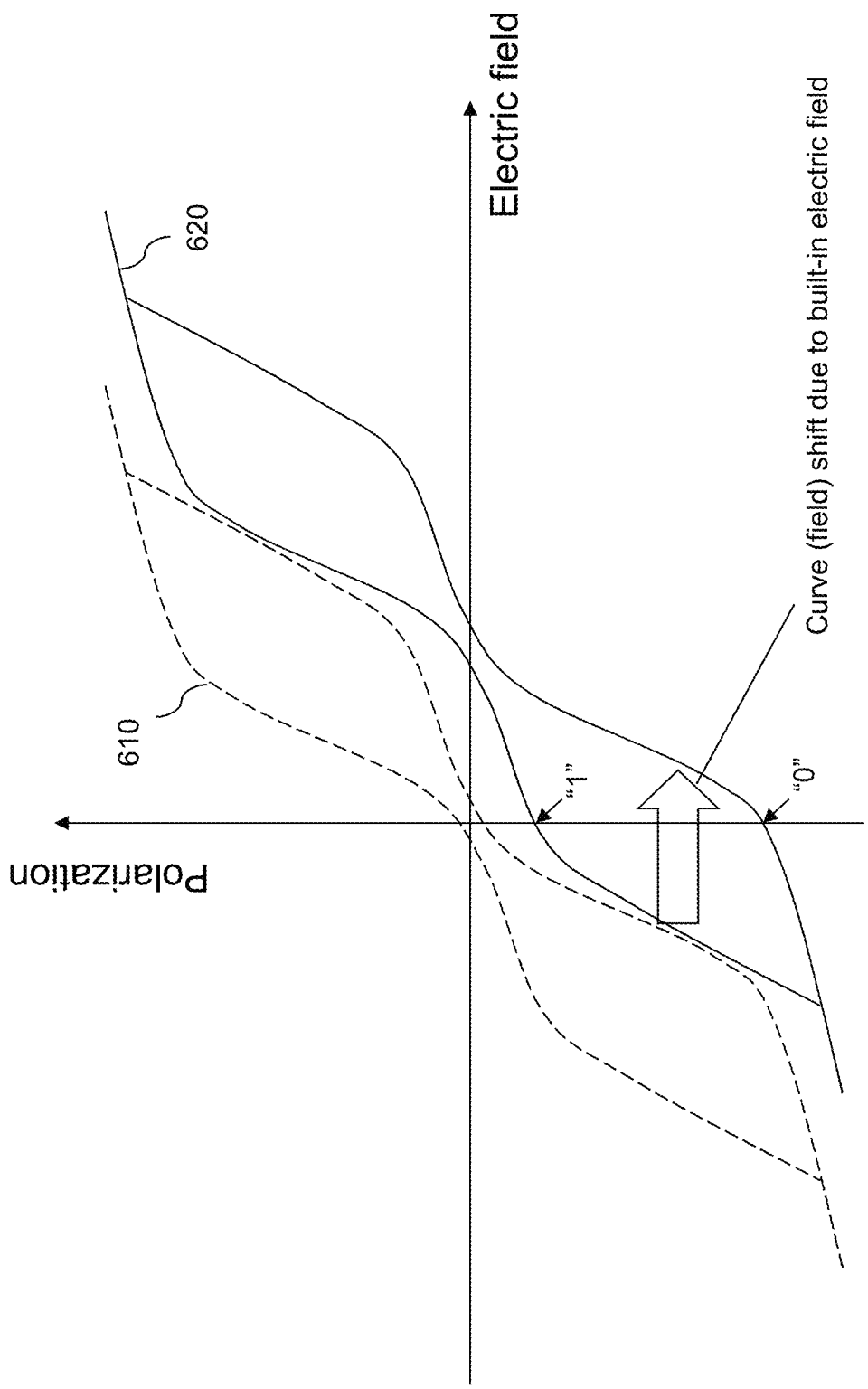
FIG. 33 is a hysteresis curve for electrical polarization of an antiferroelectric layer within the seventh exemplary structure as a function of applied electrical field according to the twelfth embodiment of the present disclosure.

The doped semiconductor layer 440 creates an electric field (e.g., built-in potential difference) due to the concentration of charge carriers (e.g., holes or electrons) at the interface between the doped semiconductor layer 440 and the antiferroelectric layer 460. This electric field creates an asymmetry in the energy level of the antiferroelectric layer 460 (as shown by the diagonal solid line compared to the dashed line in the absence of the electric field). The asymmetry in the energy level of the antiferroelectric layer 460 leads to an asymmetry and shift in the polarization-electric field loop of the antiferroelectric layer 460 which is shown in FIG. 33. This shift in the polarization-electric field loop with a non-zero polarization of the antiferroelectric layer 460 creates two non-volatile memory states (i.e., 0 and 1) in the antiferroelectric layer 460.

Referring to FIG. 33, a hysteresis curve 620 for electrical polarization of the antiferroelectric layer 460 within the seventh exemplary structure as a function of applied electrical field is illustrated. Curve 610 is a hypothetical hysteresis curve of a hypothetical antiferroelectric layer 460 when contacted on both sides by the same conductive material layers having the same material composition, i.e., when the internal electrical field generated by the conductive material layers is zero. The curve 610 has a 180 degree rotational symmetry about the origin.

The hysteresis curve 620 is shifted relative the hysteresis curve 610 due to the internal electrical field between the doped semiconductor layer 440 and the antiferroelectric layer 460. In one embodiment, the lateral shift in the hysteresis curve 620 has a magnitude such that the two remanent electrical polarizations (i.e., the "0" and "1" non-volatile memory states) of the hysteresis curve 620 have the same polarity.

In one embodiment, the antiferroelectric layer 460 has two remanent electrical polarization states at zero external voltage bias across the first electrode and the second electrode. A first electrical polarization state of the antiferroelectric layer 460 has a first net non-zero electrical polarization pointing toward the first electrode or the second electrode (as a first remanent electrical polarization), and a second electrical polarization state of the antiferroelectric layer 460 has a second net non-zero electrical polarization having a greater magnitude than the first net non-zero electrical polarization and having a same direction as the first net non-zero electrical polarization. In one embodiment, the ratio of the second net non-zero electrical polarization to the first net non-zero electrical polarization is in a range from 2 to 100.

In one embodiment, a ferroelectric memory device including an array of ferroelectric memory cells 180, first electrically conductive lines 30, and second electrically conductive lines 90. In one embodiment, a non-zero electrical field is present across each of the antiferroelectric layers 460 under a zero electrical bias condition between a most proximal one of the first electrically conductive lines 30 and a most proximal one of the second electrically conductive lines 90.

In one embodiment, a sensing circuit can be provided, which can be configured to apply a sensing bias voltage across the first electrode and the second electrode of a selected antiferroelectric memory cell 180 and to measure the tunneling resistance of the antiferroelectric layer 460 of the selected antiferroelectric memory cell 180. In one embodiment, a programming circuit can be provided, which can be configured to apply a programming pulse to the second electrode relative to the first electrode.

Figure 34B:
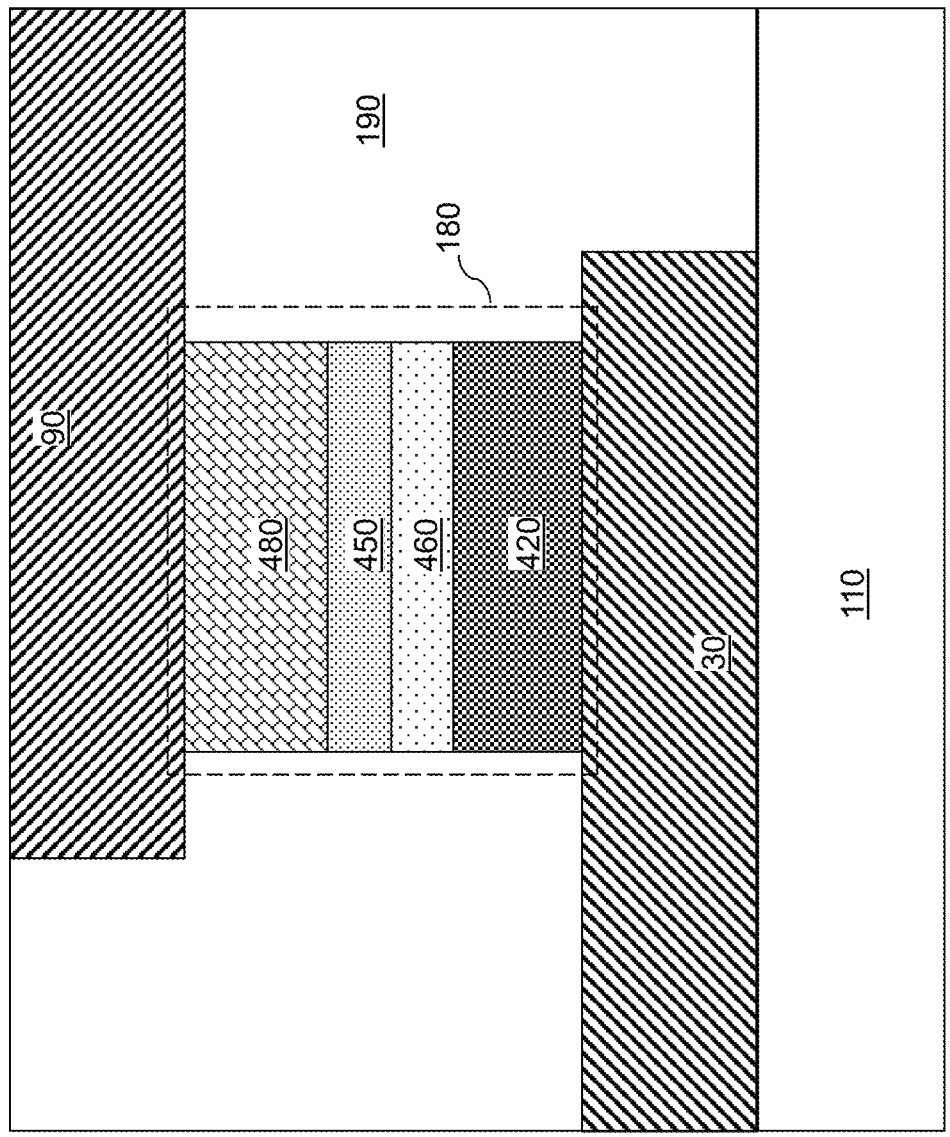
FIG. 34B is a vertical cross-sectional view of an alternative configuration of the eighth exemplary structure according to the thirteenth embodiment of the present disclosure.
Figure 34C:
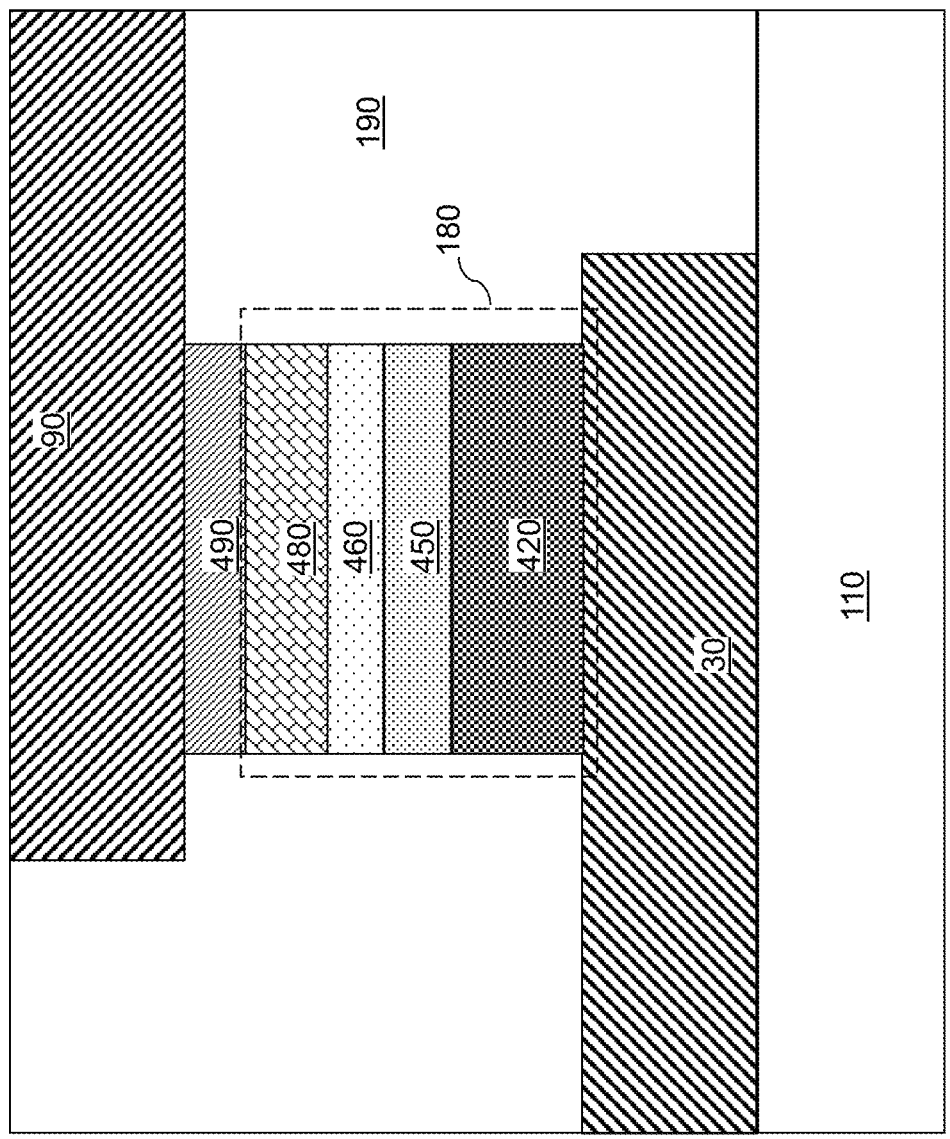
FIGS. 34C and 34D are a vertical cross-sectional view of alternative configurations of the eighth exemplary structure of FIGS. 34A and 34B, respectively, according to the thirteenth embodiment of the present disclosure.
Figure 34D:
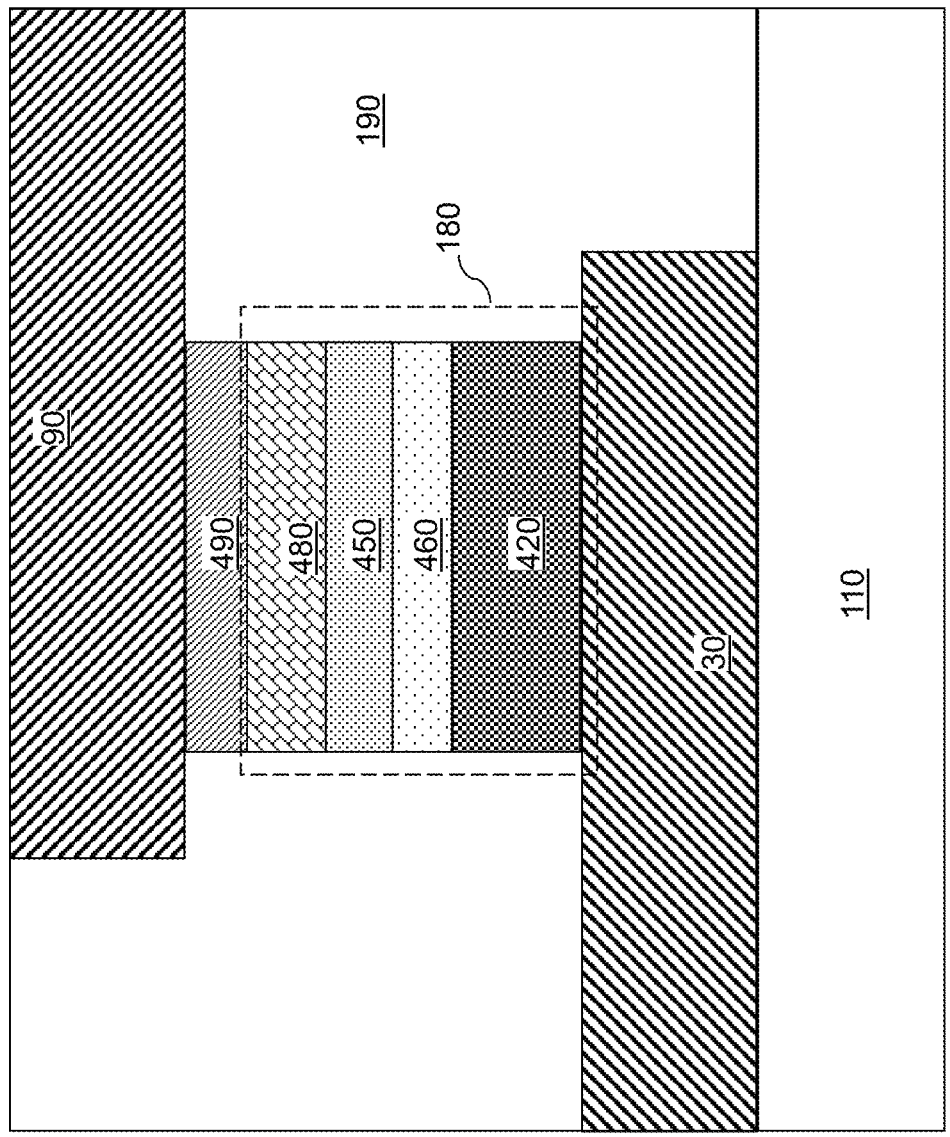

Referring to FIGS. 34A to 34D, configurations of an eighth exemplary structure including an antiferroelectric tunnel junction cell 180 are illustrated. The configuration of FIG. 34A and the configuration of FIG. 34B are alternative configurations that may be derived from each other by reversing the order of material deposition during formation of an antiferroelectric tunnel junction cell 180, which is a antiferroelectric memory device. FIGS. 34C and 34D illustrate the structures of FIGS. 34A and 34B, respectively, in series with an additional steering element 490.

Specifically, the configurations of the eighth exemplary structure of FIGS. 34A to 34D can be derived from the configurations of the seventh exemplary structure of FIGS. 31A to 31D, respectively by employing a ferroelectric layer 450 instead of a doped semiconductor layer 440 as a symmetry-breaking material layer, i.e., a layer that breaks the electrical symmetry around the antiferroelectric layer 460. In this case, the ferroelectric layer 450 can be programmed prior to operation of the eighth exemplary structure by applying an electric field between the first electrode and the second electrode so that fixed dielectric polarization is present within the ferroelectric layer 450 during operation of the eighth exemplary structure. The coercive electrical field of the ferroelectric layer 450 can be greater than the coercive electrical field of the antiferroelectric layer 460 by a factor in a range from 1.2 to 100, such as from 1.4 to 10 and/or from 1.6 to 4.

Figure 35:
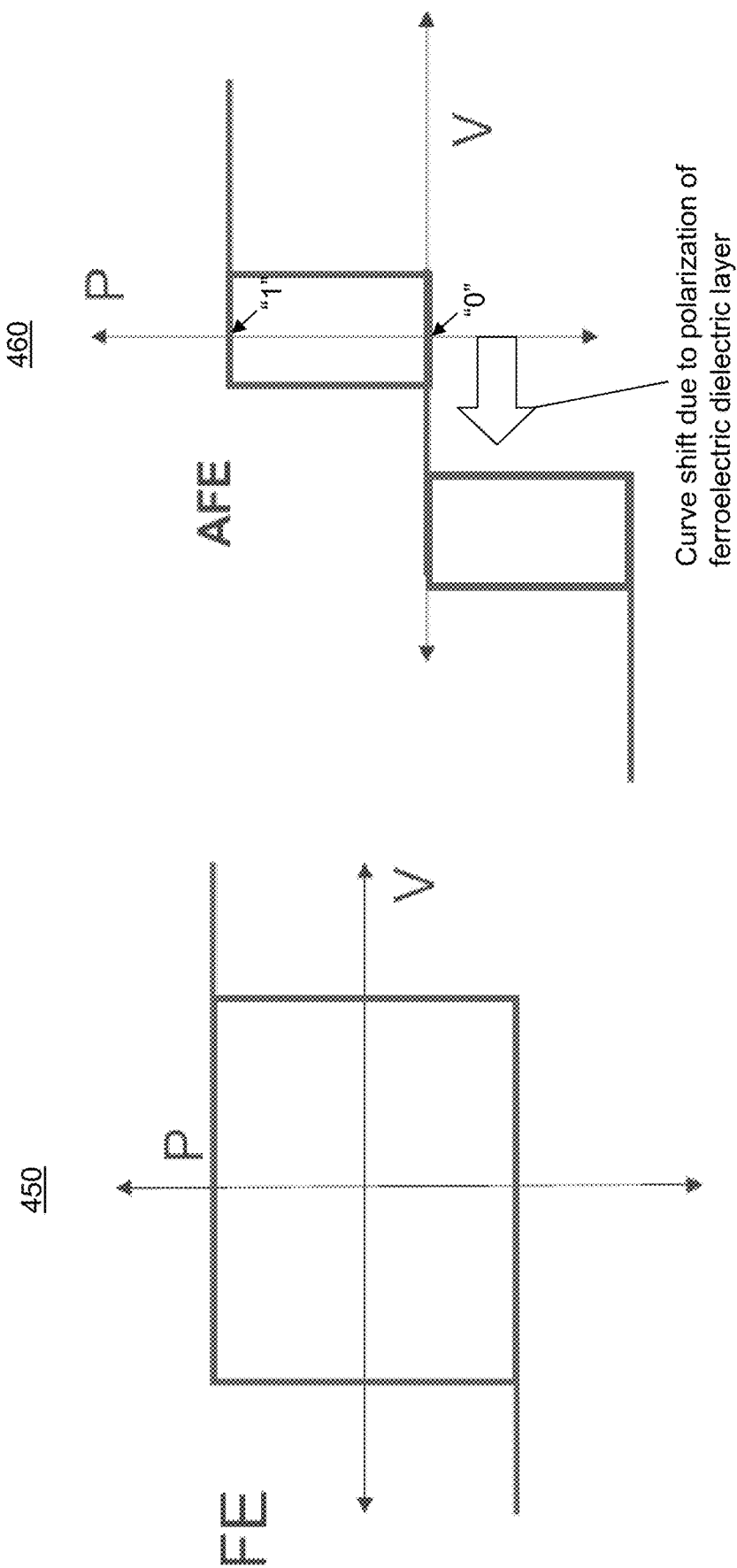
FIG. 35 is a polarization versus voltage diagram of the eighth exemplary structure according to the thirteenth embodiment of the present disclosure.

In one embodiment, the ferroelectric layer 450 has a greater ferroelectric coercive field than a maximum coercive field of the antiferroelectric layer 460. In one embodiment, the antiferroelectric layer 460 has an asymmetric coercive field that depends on an external voltage across the first electrode and the second electrode. The polarization of the ferroelectric layer 450 creates a built-in field at the interface between the ferroelectric layer 450 and the antiferroelectric layer 460. The built-in field leads to an asymmetry and shift in the polarization-electric field (i.e., P-V) loop of the antiferroelectric layer 460 which is shown in FIG. 35. This shift in the polarization-electric field loop with a zero and non-zero polarizations of the antiferroelectric layer 460 creates two non-volatile memory states (i.e., 0 and 1) in the antiferroelectric layer 460.

FIG. 35 illustrates polarization versus voltage diagrams of the ferroelectric layer 450 (left side) and the antiferroelectric layer 460 along with a thin ferroelectric layer at one of the interfaces of antiferroelectric layer and an electrode (right side). Without wishing to be bound by a particular theory, it is believed that antiferroelectricity in some antiferroelectric materials, such as zirconium oxide, originates from a field induced phase transformation between the non-polar (e.g., tetragonal) and polar (e.g., orthorhombic) phases of the antiferroelectric material. When an external electric field (e.g., voltage) is applied across the antiferroelectric layer 460, the polar phase is reversibly induced, resulting in induction of spontaneous polarization (e.g., a switch from the "0" memory state to the "1" memory state). The external electric field (e.g., activation energy) required to switch the polarization state in the antiferroelectric layer (e.g., zirconium oxide) 460 is typically smaller than the electric field required to switch the polarization of the ferroelectric layer (e.g., hafnium zirconium oxide) 450.

In this embodiment, the ferroelectric polarization of the ferroelectric layer 450 can be programmed prior to use of the antiferroelectric memory cell 180 by applying a first voltage across the ferroelectric layer 450 and the antiferroelectric layer 460 to switch the polarization of the ferroelectric layer 450 in a desired direction (e.g., up or down in FIGS. 34A-34D). The first voltage is greater than a critical voltage required to switch the polarization of the ferroelectric layer 450 in a desired direction. This polarization creates the built-in field at the interface between the ferroelectric layer 450 and the antiferroelectric layer 460. The built-in field leads to an asymmetry and shift in the polarization-electric field loop of the antiferroelectric layer 460. A second voltage smaller than the first voltage can then be applied across the ferroelectric layer 450 and the antiferroelectric layer 460. The second voltage is less than the critical voltage required to switch the polarization of the ferroelectric layer 450 but greater than a critical voltage required to switch the polarization of the antiferroelectric layer 460. Thus, the second voltage can be used to reversibly switch the polarization of the antiferroelectric layer 460 and thus to reversibly switch the antiferroelectric memory cell 180 between the "0" and "1" non-volatile memory states based on the direction (i.e., polarity) of the second voltage.

In one embodiment, the antiferroelectric layer 460 has two electrical polarization states at zero external voltage bias across the first electrode and the second electrode. A first electrical polarization state of the antiferroelectric layer 460 has a first net non-zero electrical polarization pointing toward the first electrode or the second electrode (as a first remanent electrical polarization), and a second electrical polarization state of the antiferroelectric layer 460 has a second net non-zero electrical polarization having a greater magnitude than the first net non-zero electrical polarization and having a same direction as the first net non-zero electrical polarization. In one embodiment, the ratio of the second net non-zero electrical polarization to the first net non-zero electrical polarization is in a range from 2 to 100.

In one embodiment, a ferroelectric memory device including an array of ferroelectric memory cells 180, first electrically conductive lines 30, and second electrically conductive lines 90. In one embodiment, a non-zero electrical field is present across each of the antiferroelectric layers 460 under a zero electrical bias condition between a most proximal one of the first electrically conductive lines 30 and a most proximal one of the second electrically conductive lines 90.

Referring to FIGS. 36A and 36B, a ninth exemplary structure according to an embodiment of the present disclosure is illustrated. The ninth exemplary structure can be provided by depositing a continuous layer stack including a first continuous electrically conductive layer 30L, a first continuous electrically conductive liner 420L, a stack of a continuous symmetry-breaking material layer (440L/450L) and a continuous antiferroelectric layer 460L, and an optional second continuous electrically conductive liner 480L. A continuous OTS layer may optionally be deposited as well if it is desired to include the OTS steering element 190 of FIG. 31C, 31D, 34C or 34D in the memory cell 180. The first continuous electrically conductive layer 30L may have the same thickness and the same material composition as the first electrically conductive lines 30 of the seventh or eighth exemplary structure. The first continuous electrically conductive liner 420L may have the same thickness and the same material composition as the first electrically conductive liners 420 of the seventh or eighth exemplary structure. The continuous symmetry-breaking material layer (440L/450L) may have the same composition and the same thickness as the doped semiconductor layer 440 of the seventh exemplary structure, or may have the same composition and the same thickness as the ferroelectric layer 450 of the eighth exemplary structure. The continuous antiferroelectric layer 460L may have the same composition and the same thickness as the ferroelectric layer 450 of the seventh or eighth exemplary structure. The second continuous electrically conductive liner 480L may have the same composition and the same thickness as the second electrically conductive liner 480 of the seventh or eighth exemplary structure.

Generally, the continuous symmetry-breaking material layer (440L/450L) comprises a continuous doped semiconductor layer or a continuous ferroelectric layer, and is formed above, or below, the continuous antiferroelectric layer 460L, and in contact with the continuous antiferroelectric layer 460L. In one embodiment, continuous symmetry-breaking material layer (440L/450L) comprises a continuous doped semiconductor layer 440L. In another embodiment, the continuous symmetry-breaking material layer (440L/450L) comprises a continuous ferroelectric layer 450L.

Figure 37C:
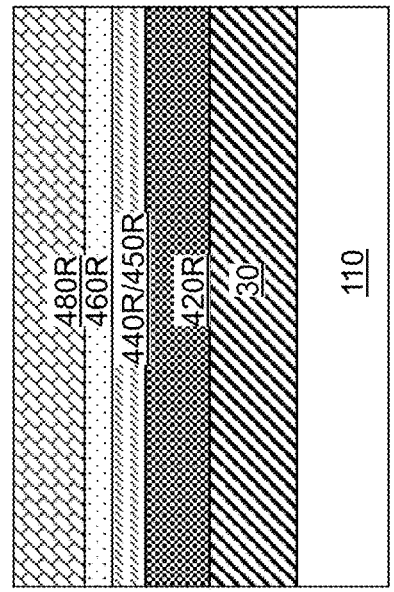
FIG. 37C is vertical cross-sectional view of the ninth exemplary structure along the vertical plane C-C' of FIG. 37A.
Figure 37A:
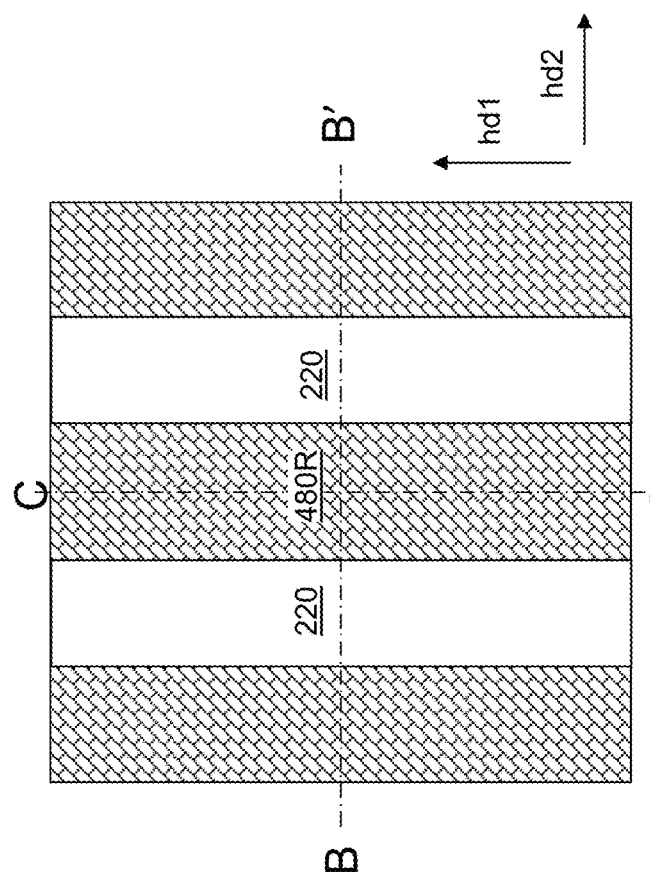
FIG. 37A is a vertical cross-sectional view of the ninth exemplary structure after formation of first dielectric rails according to the fourteenth embodiment of the present disclosure.
Figure 37B:
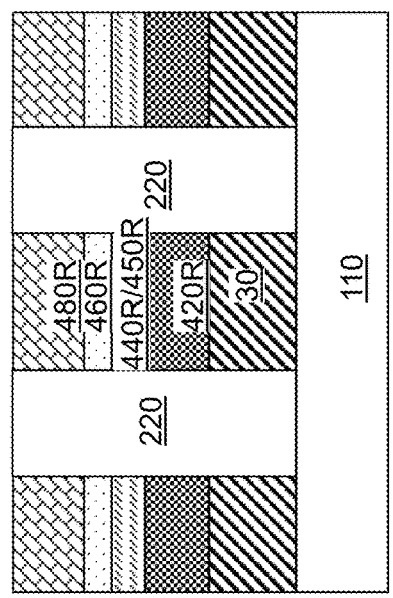
FIG. 37B is vertical cross-sectional view of the ninth exemplary structure along the vertical plane B-B' of FIG. 37A.

Referring to FIGS. 37A-37C, a photoresist layer (not shown) can be applied over the second continuous electrically conductive liner 480L, and can be lithographically pattered to form line trenches that laterally extend along a first horizontal direction hd1. An anisotropic etch process can be performed to transfer the pattern in the photoresist layer through the continuous layer stack of the first continuous electrically conductive layer 30L, the first continuous electrically conductive liner 420L, the stack of the continuous symmetry-breaking material layer (440L/450L) and the continuous antiferroelectric layer 460L, and the optional second continuous electrically conductive liner 480L. First line trenches are formed in volumes from which the materials of the continuous layer stack are removed. Remaining portions of the continuous layer stack include rail stack structures (30, 420R, 440R/450R, 460R, 480R) that are laterally spaced apart among one another by the first line trenches. Each rail stack structure (30, 420R, 440R/450R, 460R, 480R) includes a first electrically conductive strip 420R that is a patterned portion of the first continuous electrically conductive liner 420L, a symmetry-breaking material rail (440R/450R) that is a patterned portion of the stack of the continuous symmetry-breaking material layer (440L/450L), an antiferroelectric rail 460R that is a patterned portion of the continuous antiferroelectric layer 460L, and a second electrically conductive strip 480R that is a patterned portion of the second continuous electrically conductive liner 480L.

The photoresist layer can be subsequently removed, for example, by ashing. At least one dielectric fill material such as silicon oxide can be deposited in the first line trenches. Excess portions of the at least one dielectric material can be removed from above the horizontal plane including the top surfaces of the rail stack structures (30, 420R, 440R/450R, 460R, 480R). Each remaining portion of the at least one dielectric fill material filling a respective first line trench constitutes a first dielectric rail 220. Generally, the first dielectric rails 220 are formed between each neighboring stacks of a respective one of the first electrically conductive lines 30, a respective one of the symmetry-breaking material rails (440R/450R), and a respective one of the antiferroelectric rails 460R.

Figure 38C:
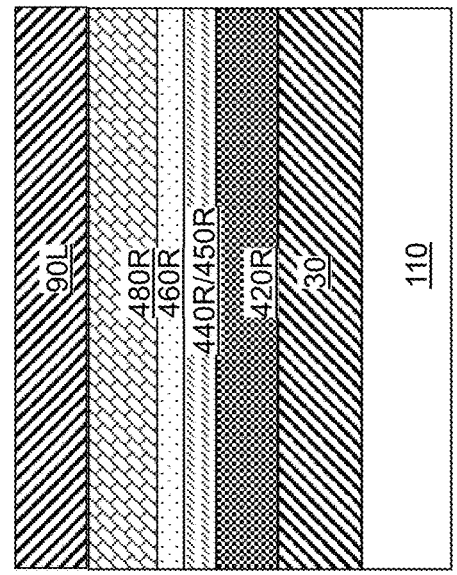
FIG. 38C is vertical cross-sectional view of the ninth exemplary structure along the vertical plane C-C' of FIG. 38A.
Figure 38A:
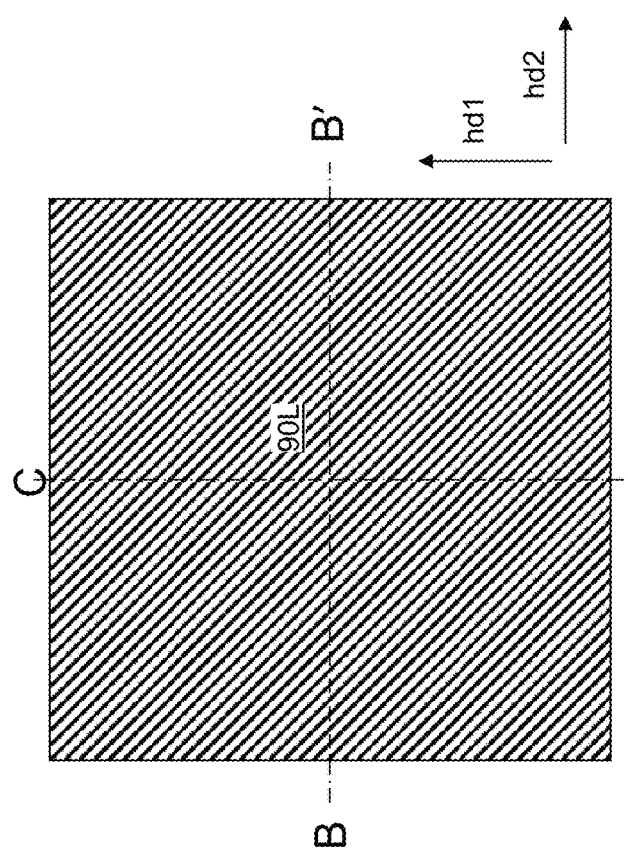
FIG. 38A is a vertical cross-sectional view of the ninth exemplary structure after formation of a second continuous electrically conductive layer according to the fourteenth embodiment of the present disclosure.
Figure 38B:
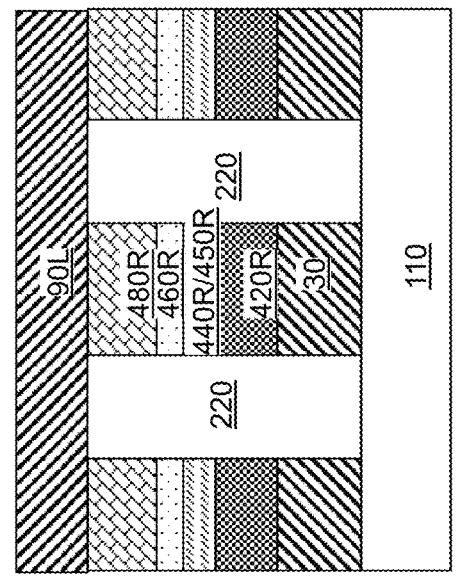
FIG. 38B is vertical cross-sectional view of the ninth exemplary structure along the vertical plane B-B' of FIG. 38A.

Referring to FIGS. 38A-38C, a second continuous electrically conductive layer 90L can be deposited over the rail stack structures (30, 420R, 440R/450R, 460R, 480R). The second continuous electrically conductive layer 90L can have the same material composition and the same thickness as the second electrically conductive lines 90 of the seventh or eighth exemplary structure.

Referring to FIGS. 39A-39C, the second continuous electrically conductive layer 90L, the second electrically conductive strips 480R, the antiferroelectric rails 460R, the symmetry-breaking material rails (440R/450R), the first electrically conductive strips 420R, and upper portions of the first dielectric rails 220 can be patterned by forming second line trenches that laterally extend along the second horizontal direction hd2. For example, a photoresist layer (not shown) can be applied over the top surfaces of the rail stack structures (30, 420R, 440R/450R, 460R, 480R) and the first dielectric rails 220, and can be lithographically patterned to form line-shaped openings that laterally extend along the second horizontal direction hd2. An anisotropic etch process can be performed to form second line trenches within areas that underlie the line-shaped openings in the photoresist layer. The second continuous electrically conductive layer 90L is divided into second electrically conductive lines 90. The second electrically conductive strips 480R are divided into second electrically conductive liners 480. The antiferroelectric rails 460R are divided into antiferroelectric layers 460. The symmetry-breaking material rails (440R/450R) are divided into symmetry-breaking material layers (440/450), which may include doped semiconductor layers 440 or ferroelectric layers 450. The first electrically conductive strips 420R are divided into first electrically conductive liners 420. Each contiguous set of a second electrically conductive liner 480, a antiferroelectric layer 460, a symmetry-breaking material layer (440/450), and a first electrically conductive liner 420 constitutes a composite pillar structure having vertically coincident sidewalls. The photoresist layer can be subsequently removed, for example, by ashing.

At least one dielectric material (such as silicon oxide) can be deposited in the second line trenches. Excess portions of the at least one dielectric material can be removed from above the horizontal plane including the top surfaces of the second electrically conductive lines 90. Remaining portions of the at least one dielectric material comprise second dielectric rails 240 that laterally extend along the second horizontal direction hd2.

Referring to FIGS. 40A-40C, an alternative configuration of the ninth exemplary structure according to an embodiment of the present disclosure is illustrated. The alternative configuration of the ninth exemplary structure can be derived from the ninth exemplary structure by exchanging the positions of the antiferroelectric layer 460 and the symmetry-breaking material layer (440/450) within each composite pillar structure.

Generally, an antiferroelectric memory device can include at least one antiferroelectric memory cell. Each of the at least one antiferroelectric memory cell can comprise a first electrode comprising a first metallic material (such as a portion of a first electrically conductive line 30 and/or an optional first electrically conductive liner 420); a symmetry-breaking material layer (440/450) located on the first electrode; an antiferroelectric layer 460 located on the symmetry-breaking material layer (440/450); and a second electrode (such as a portion of a second electrically conductive line 90 and/or an optional second electrically conductive liner 480) located on the antiferroelectric layer 460. In one embodiment, the second electrode (such as a portion of a second electrically conductive line 90 and/or an optional second electrically conductive liner 480) comprises a metallic material.

Figure 41A:
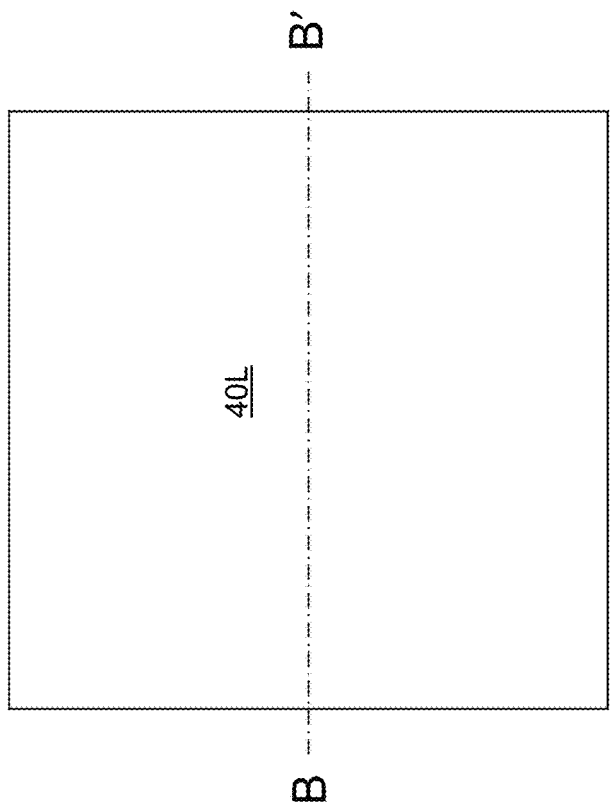
FIG. 41A is a top-down view of a tenth exemplary structure after formation of a continuous layer stack including first continuous electrically conductive layers and continuous insulating layers according to the sixteenth embodiment of the present disclosure.
Figure 41B:
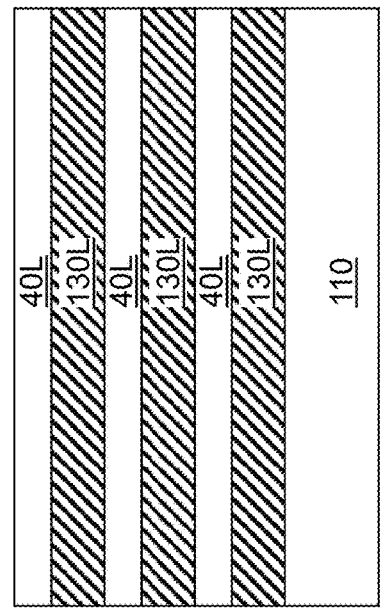
FIG. 41B is a vertical cross-sectional view of the tenth exemplary structure along the vertical plane B-B' of FIG. 41A.

Referring to FIGS. 41A and 41B, a tenth exemplary structure according to an embodiment of the present disclosure is illustrated. The tenth exemplary structure includes a vertically alternating sequence of first continuous electrically conductive layers 130L and continuous insulating layers 40L that is formed over a dielectric material layer 110. The first continuous electrically conductive layers 130L may include the same material as the first electrically conductive lines 30 described above, or may include the same material as any of the first electrically conductive liners 420 described above. Thus, the first continuous electrically conductive layers 130L may include a metallic material such as TiN, TaN, WN, Ti, Ta, W, Ru, Mo, Co, Cu, another transition metal, a conductive intermetallic alloy or a conductive metallic compound, or a heavily doped semiconductor material (e.g., polysilicon) having electrical conductivity greater than $1 \times 10^6$ S/m. The thickness of each first continuous electrically conductive layer 130L may be in a range from 10 nm to 100 nm, such as from 15 nm to 50 nm, although lesser and greater thicknesses may also be employed. The continuous insulating layers 40L includes a dielectric material such as silicon oxide, and may have a thickness in a range from 10 nm to 100 nm, such as from 15 nm to 50 nm, although lesser and greater thicknesses may also be employed.

Referring to FIGS. 42A-42C, a photoresist layer (not shown) can be applied over the vertically alternating sequence of the first continuous electrically conductive layers 130L and the continuous insulating layers 40L, and can be lithographically pattered to form line trenches that laterally extend along a first horizontal direction hd1. An anisotropic etch process can be performed to transfer the pattern in the photoresist layer through the vertically alternating sequence. First line trenches 319 are formed in volumes from which the materials of the vertically alternating sequence are removed from underneath the line-shaped openings in the photoresist layer. Remaining portions of the vertically alternating sequence (130L, 40L) include alternating stacks (130, 40) of first electrically conductive lines 130 and insulating layers 40. Each first electrically conductive line 130 is a patterned portion of a first continuous electrically conductive layer 130L. Each insulating layer 40 is a patterned portion of a continuous insulating layer 40L.

Figure 43C:
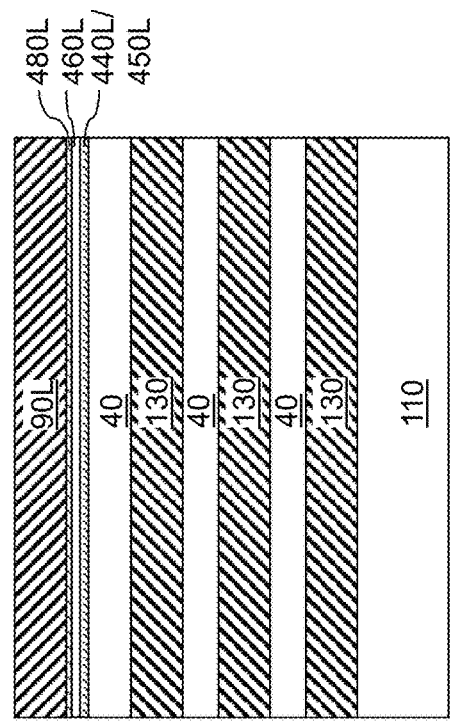
FIG. 43C is vertical cross-sectional view of the tenth exemplary structure along the vertical plane C-C' of FIG. 43A.
Figure 43A:
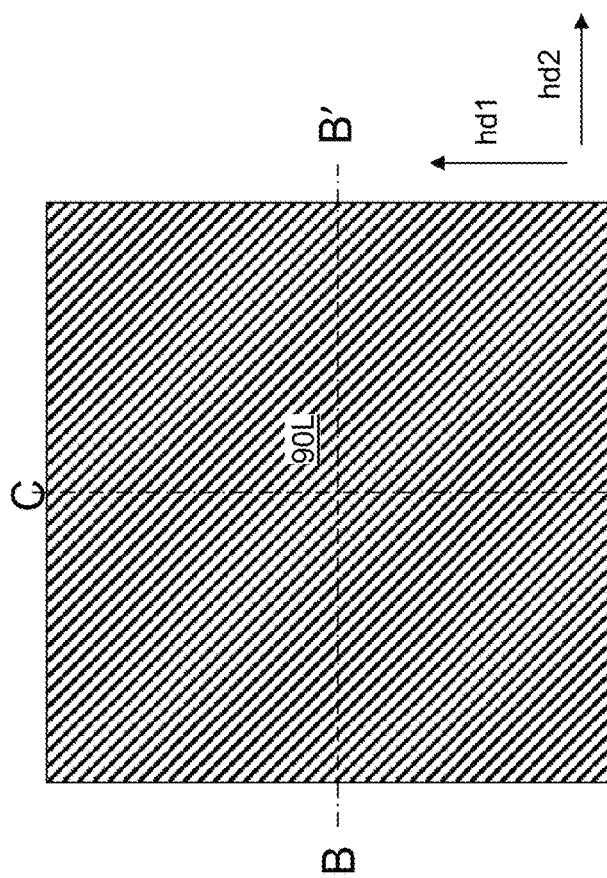
FIG. 43A is a vertical cross-sectional view of the tenth exemplary structure after deposition of a continuous symmetry-breaking material layer, a continuous antiferroelectric layer, and a second continuous electrically conductive layer according to the sixteenth embodiment of the present disclosure.
Figure 43B:
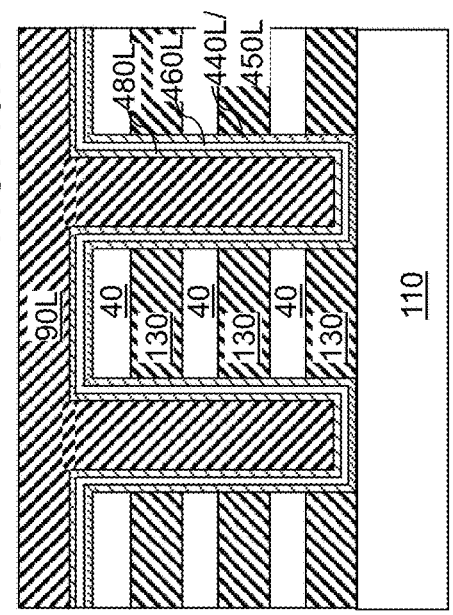
FIG. 43B is vertical cross-sectional view of the tenth exemplary structure along the vertical plane B-B' of FIG. 43A.

Referring to FIGS. 43A-43C, a continuous layer stack can be deposited in the first line trenches 319 and over the alternating stacks of the first electrically conductive lines 130 and the insulating layers 40. The continuous layer stack includes, from bottom to top, continuous symmetry-breaking material layer (440L/450L), a continuous antiferroelectric layer 460L, and an optional second continuous electrically conductive liner 480L, and a second continuous electrically conductive layer 90L. In one embodiment, the continuous symmetry-breaking material layer (440L/450L) comprises a continuous doped semiconductor layer 440L. In another embodiment, the continuous symmetry-breaking material layer (440L/450L) comprises a continuous ferroelectric layer 450L. The continuous antiferroelectric layer 460L can have the same material composition and the same thickness as can have the same material composition and the same thickness as in the seventh, eighth or ninth exemplary structure. The optional second continuous electrically conductive liner 480L, is present, can have the same material composition and the same thickness as can have the same material composition and the same thickness as in the seventh, eighth or ninth exemplary structure. The second continuous electrically conductive layer 90L as can have the same material composition as in the seventh, eighth or ninth exemplary structure, and can have a thickness that is sufficient to fill the first line trenches 319. Optionally, a continuous OTS layer may be included in the continuous layer stack if a steering element 490 is desired to be formed in series with the memory cell 180.

Figure 44C:
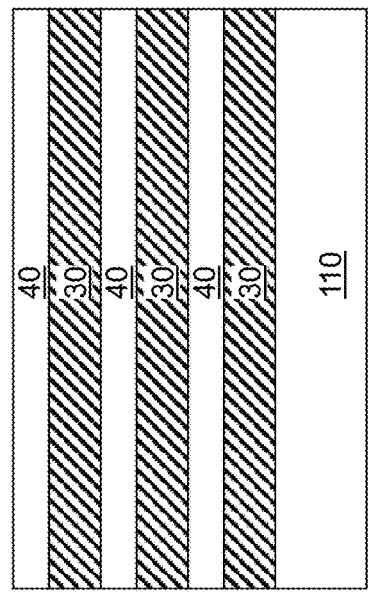
FIG. 44C is vertical cross-sectional view of the tenth exemplary structure along the vertical plane C-C' of FIG. 44A.
Figure 44A:
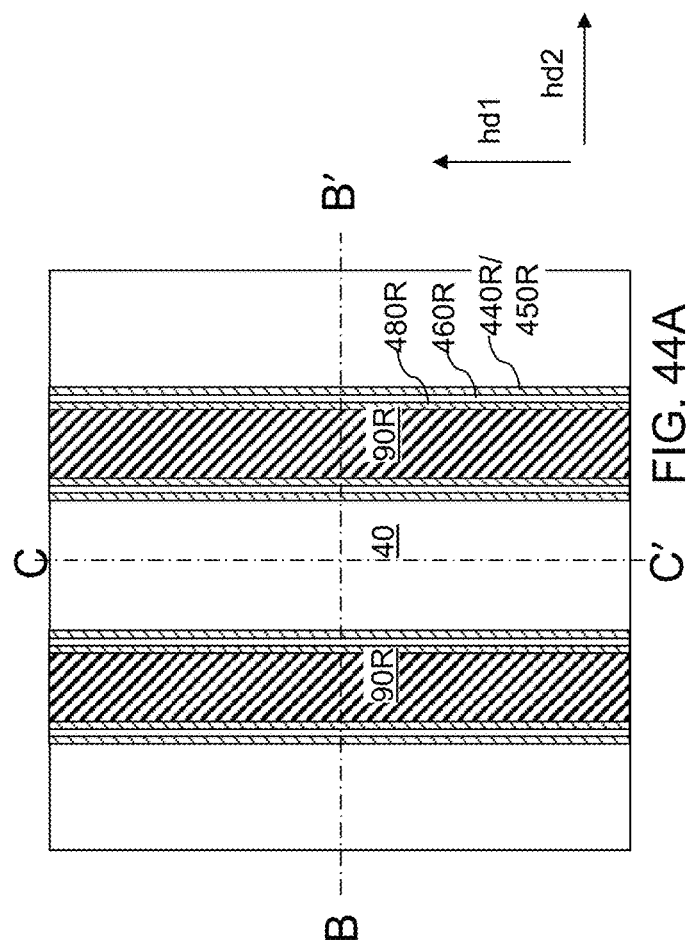
FIG. 44A is a vertical cross-sectional view of the tenth exemplary structure after formation of line trench fill structures according to the sixteenth embodiment of the present disclosure.
Figure 44B:
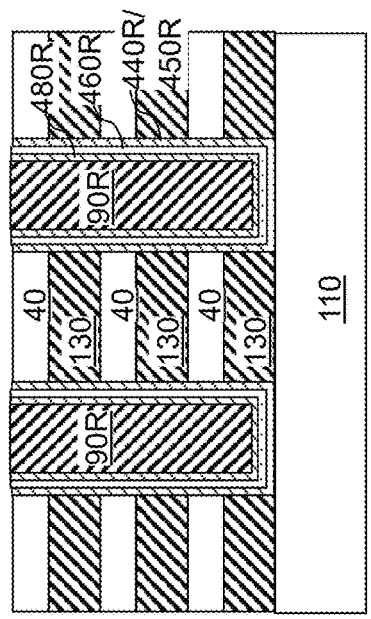
FIG. 44B is vertical cross-sectional view of the tenth exemplary structure along the vertical plane B-B' of FIG. 44A.

Referring to FIGS. 44A-44C, a chemical mechanical planarization (CMP) process can be performed to remove portions of the continuous layer stack (440L/450L, 460L, 480L, 90L) that are located above the horizontal plane including the topmost surfaces of the alternating stacks (130, 40) of first electrically conductive lines 130 and insulating layers 40. Each continuous remaining portion of the continuous layer stack (440L/450L, 460L, 480L, 90L) filling the first line trenches 319 constitutes a line trench fill structure (440R/450R, 460R, 480R, 90R), which is a rail structure. Each line trench fill structure (440R/450R, 460R, 480R, 90R) includes a symmetry-breaking material rail 440R/450R that is a patterned portion of a continuous symmetry-breaking material layer 440L/450L, an antiferroelectric rail 460R that is a patterned portion of the continuous antiferroelectric layer 460L, a second electrically conductive strip 480R that is a patterned portion of the second electrically conductive liner 480, and a second electrically conductive rail 90R that is a patterned portion of the second continuous electrically conductive layer 90L.

Referring to FIGS. 45A-45D, a two-dimensional array of pillar cavities can be formed to divide each line trench fill structure (440R/450R, 460R, 480R, 90R) into a row of composite pillar structures (440/450, 460, 480, 90). Each composite pillar structure (440/450, 460, 480, 90) includes a symmetry-breaking material layer 450 that is a patterned portion of the symmetry-breaking material rail 450R, an antiferroelectric layer 460 that is a patterned portion of the antiferroelectric rail 460R, a second electrically conductive liner 480 that is a patterned portion of a second electrically conductive strip 480R, and a second electrically conductive line 90 that is a patterned portion of a second electrically conductive rail 90R. Each of the composite pillar structures (440/450, 460, 480, 90) comprises a U-shaped symmetry-breaking material layer 440/450, a U-shaped antiferroelectric layer 460, and a second electrically conductive line 90 that extends vertically.

At least one dielectric material such as silicon oxide can be deposited in the two-dimensional array of pillar cavities. Excess portions of the at least one dielectric material can be removed from above the horizontal plane including the topmost surfaces of the alternating stacks of the first electrically conductive lines 130 and the insulating layers 40 by a planarization process, such as a recess etch process or a chemical mechanical planarization process. Each remaining portion of the at least one dielectric material filling the pillar cavities constitute dielectric pillar structures 340.

Referring to FIGS. 46A-46D, an alternative configuration of the tenth exemplary structure can be derived from the tenth exemplary structure by forming a continuous layer stack including, from bottom to top, a continuous symmetry-breaking material layer, a continuous antiferroelectric layer 460L, and an optional second continuous electrically conductive liner 480L, and a second continuous electrically conductive layer 90L at the processing steps of FIGS. 43A-43C. In this case, the continuous symmetry-breaking material layer may be a continuous ferroelectric layer 450L or may be a continuous doped semiconductor layer 440L described above.

Each of the composite pillar structures (440/450, 460, 480, 90) comprises a U-shaped symmetry-breaking material layer 440/450 comprising a doped semiconductor layer 440 or a ferroelectric layer 450, a U-shaped antiferroelectric layer 460, and a second electrically conductive line 90 that extends vertically. In one embodiment, each composite pillar structure (460, 440/450, 480, 90) includes an antiferroelectric layer 460 that is a patterned portion of the antiferroelectric rail 460R, a symmetry-breaking material layer 440/450, a second electrically conductive liner 480 that is a patterned portion of a second electrically conductive strip 480R, and a second electrically conductive line 90 that is a patterned portion of a second electrically conductive rail 90R. Each symmetry-breaking material layer 440/450 may be a doped semiconductor layer 440, or may be a ferroelectric layer 450.

According to various embodiments of the present disclosure, an antiferroelectric memory device 501 may comprise at least one antiferroelectric memory cell 180. Each of the at least one antiferroelectric memory cell 180 comprises: a first electrode (e.g., comprising a proximal portion of a first electrically conductive line (130, 30) and/or an optional first electrically conductive liner 420 in the seventh, eighth, or ninth exemplary structure), a second electrode (e.g., comprising a proximal portion of a second electrically conductive line 90 and/or an optional second electrically conductive liner 480); and a stack of a symmetry-breaking material layer (440/450) (which may be the doped semiconductor layer 440 or the ferroelectric layer 450) and an antiferroelectric layer 460 located between the first and the second electrodes.

In one embodiment, a steering element 490 may be located in series with the stack (440/450, 460). In one embodiment the doped semiconductor layer 440 comprises a degenerately doped semiconductor layer having a first conductivity type. In one embodiment, the at least one antiferroelectric memory cell 180 further comprises a second degenerately doped semiconductor layer having a second conductivity type, and the antiferroelectric layer 160 is located between the doped semiconductor layer 140 and the second degenerately doped semiconductor layer.

In one embodiment illustrated in FIG. 33, the doped semiconductor layer 140 creates an electric field due to a concentration of charge carriers at an interface between the doped semiconductor layer 140 and the antiferroelectric layer 160, the electric field creates an asymmetry and shift in a polarization-electric field loop of the antiferroelectric layer, and the shift in the polarization-electric field loop creates at least one non-zero polarization of the antiferroelectric layer 160 in absence of an externally applied voltage and creates two non-volatile memory states in the antiferroelectric layer.

In one embodiment, the at least one antiferroelectric memory cell 180 comprises an antiferroelectric tunnel junction memory cell. In one embodiment, the doped semiconductor layer 140 has a thickness of 1 nm to 2 nm; and the antiferroelectric layer 160 has a thickness of 1 nm to 2 nm. In one embodiment, the antiferroelectric layer comprises undoped zirconium oxide or doped zirconium oxide.

In one embodiment, the antiferroelectric memory device comprises a two-dimensional array of antiferroelectric memory cells 180 located at cross-points of a plurality of first electrically conductive lines 30 laterally extending along a first horizontal direction hd1 and a plurality of second electrically conductive lines 90 laterally extending along a second horizontal direction hd2 as in the seventh, eighth, or ninth exemplary structures.

In one embodiment, the antiferroelectric memory device comprises: vertical stacks of first electrically conductive lines 130 and insulating layers 40 that laterally extend along a first horizontal direction hd1 and laterally spaced apart along a second horizontal direction hd2; and a two-dimensional array of second electrically conductive lines 90 extending vertically between the vertical stacks of first electrically conductive lines 130 and insulating layers 40. The first electrode comprises a portion of one the first electrically conductive lines 130 and the second electrode comprises a portion of one the second electrically conductive lines 90.

In one embodiment, the antiferroelectric memory device comprises a three-dimensional array of antiferroelectric memory cells 180; and the symmetry-breaking material layer (440/450) and the antiferroelectric layer 460 of each antiferroelectric memory cell 180 extend vertically between a sidewall of a respective first electrically conductive line 130 and a sidewall of a respective second electrically conductive line 90.

In one embodiment, the antiferroelectric memory device comprises a two-dimensional array of dielectric pillar structures 340 interlaced with the two-dimensional array of second electrically conductive lines 90 and located between the vertical stacks of first electrically conductive lines 130 and insulating layers 40.

In one embodiment, the symmetry-breaking material layer (440/450) comprises the doped semiconductor layer 440 having electrical conductivity greater than $1.0 \times 10^5$ S/m. In one embodiment, the doped semiconductor layer 440 comprises a semiconductor material selected from an elemental semiconductor material, an alloy of at least two elemental semiconductor materials, a III-V compound semiconductor material, a II-V compound semiconductor material, a metal oxide semiconductor material, or an organic semiconductor material.

In one embodiment, the symmetry-breaking material layer (440/450) comprises the ferroelectric layer 450 having a greater ferroelectric coercive field than a maximum ferroelectric coercive field of the antiferroelectric layer 460.

In one embodiment shown in FIG. 35, a polarization of the ferroelectric layer 450 creates a built-in field at the interface between the ferroelectric layer and the antiferroelectric layer 460, the built-in field leads to an asymmetry and shift in the polarization-electric field loop of the antiferroelectric layer 460, and the shift in the polarization-electric field loop creates at least one non-zero polarization of the antiferroelectric layer 460 in absence of an externally applied voltage and creates two non-volatile memory states in the antiferroelectric layer. In one embodiment, the ferroelectric layer 450 has a thickness of 1 nm to 2 nm; and the antiferroelectric layer 460 has a thickness of 1 nm to 2 nm.

Antiferroelectric tunnel junction memory cells 180 consume less power than ferroelectric tunnel junction memory cells due to lower polarization and switching voltage. Unipolar field cycling in antiferroelectric tunnel junction memory cells 180 yields longer endurance and stability compared to bipolar field cycling in ferroelectric tunnel junction memory cells. Introducing an asymmetry in the P-V loop of a the antiferroelectric material by adding a doped semiconductor material or a ferroelectric material at the interface with the antiferroelectric layer provide an internal bias field for achieving the nonzero remnant polarization that can be used to generate plural non-volatile memory states in antiferroelectric barrier-based tunnel junction memory cells.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming an antiferroelectric memory device, comprising:
    forming a continuous layer stack including a first continuous electrically conductive layer, a continuous symmetry-breaking material layer, and a continuous antiferroelectric layer, wherein the continuous symmetry-breaking material layer comprises a continuous doped semiconductor layer or a continuous ferroelectric layer located above or below the continuous antiferroelectric layer, and in contact with the continuous antiferroelectric layer;
    patterning the continuous layer stack into first electrically conductive lines, symmetry-breaking material rails, and antiferroelectric rails by forming first dielectric rails through the continuous layer stack;
    depositing a second continuous electrically conductive layer over the symmetry-breaking material rails and the antiferroelectric rails; and patterning the second continuous electrically conductive layer, the symmetry-breaking material rails, and antiferroelectric rails into second electrically conductive lines, symmetry-breaking material layers, and antiferroelectric layers, respectively.

2. The method of claim 1, wherein the continuous symmetry-breaking material layer comprises the continuous doped semiconductor layer.

3. The method of claim 1, wherein the continuous symmetry-breaking material layer comprises the continuous ferroelectric layer.

4. The method of claim 1, wherein a non-zero electrical field is present across each of the antiferroelectric layers under a zero electrical bias condition between a most proximal one of the first electrically conductive lines and a most proximal one of the second electrically conductive lines.

5. The method of claim 1, wherein:
 each antiferroelectric layer has two electrical polarization states at zero external voltage bias across an underlying one of the first electrically conductive lines and an overlying one of the second electrically conductive lines;
 a first electrical polarization state of the antiferroelectric layer has a first net non-zero electrical polarization pointing toward the first electrode or the second electrode; and
 a second electrical polarization state of the antiferroelectric layer has a second net non-zero electrical polarization having a greater magnitude than the first net non-zero electrical polarization and having a same direction as the first net non-zero electrical polarization.

6. The method of claim 1, further comprising:
 forming first dielectric rails between each neighboring stacks of a respective one of the first electrically conductive lines, a respective one of the symmetry-breaking material rails, and a respective one of the antiferroelectric rails; and
 forming second dielectric rails between each neighboring stack of a respective one of the second electrically conductive lines, a respective column of the symmetry-breaking material layers, and a respective column of the antiferroelectric layers.

\* \* \* \* \*